US006509132B1

(12) United States Patent
Oohashi et al.

(10) Patent No.: US 6,509,132 B1
(45) Date of Patent: Jan. 21, 2003

(54) LITHOGRAPHIC PRINTING PLATE PRECURSOR

(75) Inventors: Hidekazu Oohashi, Shizuoka (JP); Tadahiro Sorori, Shizuoka (JP); Koichi Kawamura, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/503,210

(22) Filed: Feb. 14, 2000

(30) Foreign Application Priority Data

Feb. 22, 1999 (JP) .......................................... 11-042591

(51) Int. Cl.$^7$ ................................................. G03F 7/09

(52) U.S. Cl. ..................... 430/270.1; 430/302; 101/453

(58) Field of Search .............................. 430/270.1, 302; 101/453, 465, 467

(56) References Cited

U.S. PATENT DOCUMENTS

| | | | | | |
|---|---|---|---|---|---|
| 3,912,844 | A | | 10/1975 | Endo et al. | 428/500 |
| 5,985,514 | A | * | 11/1999 | Zheng et al. | 430/270.1 |
| 6,004,728 | A | * | 12/1999 | Deroover et al. | 430/302 |
| 6,022,667 | A | * | 2/2000 | Vermeersch et al. | 430/271.1 |
| 6,040,113 | A | * | 3/2000 | Van Damme et al. | 430/271.1 |
| 6,096,471 | A | * | 8/2000 | Van Damme et al. | 430/188 |
| 6,106,996 | A | * | 8/2000 | Van Damme et al. | 430/271.1 |
| 6,136,503 | A | * | 10/2000 | Zheng et al. | 430/270.1 |
| 6,146,812 | A | * | 11/2000 | Leon et al. | 430/270.1 |
| 6,153,353 | A | * | 11/2000 | Van Damme et al. | 430/270.1 |
| 6,162,578 | A | * | 12/2000 | Zheng et al. | 430/270.1 |
| 6,165,679 | A | * | 12/2000 | Van Damme et al. | 430/270.1 |
| 6,165,685 | A | * | 12/2000 | Maerz et al. | 430/273.1 |
| 6,165,691 | A | * | 12/2000 | Damme et al. | 430/303 |
| 6,190,831 | B1 | * | 2/2001 | Leon et al. | 430/270.1 |
| 6,214,515 | B1 | * | 4/2001 | Van Damme et al. | 430/188 |

FOREIGN PATENT DOCUMENTS

| | | |
|---|---|---|
| EP | 0 855 267 A | 7/1998 |
| EP | 0 864 420 A | 9/1998 |
| EP | 0 922 570 A | 6/1999 |
| GB | 2077452 | 12/1981 |
| JP | 10 069089 | 3/1998 |
| JP | 10 329443 A | 12/1998 |

OTHER PUBLICATIONS

Masterton, William L. et al. Chemical Principles, $6^{th}$ Ed. Phildelphia: Saunders College Publishing, 1985, 258–9.*

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A lithographic printing plate precursor is disclosed, comprising a support having sequentially formed thereon a layer containing an ionic polymer complex (Layer A) which is insoluble in water and an aqueous alkali solution and a recording layer thermally variable in the solubility in at least one of water and an aqueous solution (Layer B), the support having a hydrophilic surface and at least one of Layer A and Layer B containing a light-heat converting agent.

7 Claims, No Drawings

LITHOGRAPHIC PRINTING PLATE PRECURSOR

FIELD OF THE INVENTION

The present invention relates to a lithographic printing plate precursor comprising a support having a hydrophilic surface, and an ink-receptive image-forming layer (recording layer). More specifically, this invention relates to a lithographic printing plate precursor capable of plate-making a plate by scan exposure based on digital signals, ensuring high sensitivity and long press life, and providing a printed matter free of residual color or staining. The lithographic printing plate precursor is suitable for the development with water or an aqueous solution or can be mounted and subjected to printing in a printing machine without passing through development.

BACKGROUND OF THE INVENTION

In general, the printing plate comprises an ink-receptive image area for receiving ink during the printing process and a hydrophilic non-image area for receiving fountain solution. For the plate precursor of such a lithographic printing plate, a PS plate comprising a hydrophilic support having provided thereon an ink-receptive photosensitive resin layer (recording layer) has heretofore been widely used. According to the typical plate-making process, a plate is subjected to mask exposure through a lith film and then the non-image area is dissolved and removed with a developer to obtain a desired printing plate.

In recent years, digitization technology of electrically processing, storing and outputting image information using a computer has been popularized. To cope with the digitization technology, various new methods for outputting an image have been proposed and are actually used. In pace with this tendency, demands are increasing for a computer-to-plate technique where a printing plate can be directly produced by scanning a ray having high directivity, such as laser ray, according to digitized image information and a lithographic film can be dispensed with. Thus, it is an important technical problem to obtain a printing plate precursor suitable therefor.

In the plate-making process of conventional PS plates, the step of dissolving and removing the non-image area after the exposure is indispensable. This additional wet processing as an indispensable step is another problem requested for conventional techniques to overcome. Particularly in recent years, discretion to the global environment is a great concern in industry as a whole. From both of the environmental aspect and the process rationalization aspect to keep up with the digitization, demands for the simple processing, dry processing or no processing are more keenly increasing.

From this standpoint, an on-press developing system has been proposed, where a photosensitive layer capable of allowing the non-image area of the printing plate precursor to be removed in the usual printing process is used, the plate is developed after the exposure on a printing press without passing through a development step to obtain a final printing plate. However, if a conventional PS plate is applied to a printing plate in the on-press developing system, the printing plate precursor must be stored under completely light-shielding and/or constant temperature conditions until it is mounted on a printing press because the photosensitive layer of the printing plate precursor is not fixed after the exposure.

On the other hand, in a high power density exposure system using a high output solid laser such as semiconductor laser and YAG laser, development different from the photoreaction being used in photosensitive materials for the low to medium power density exposure is available. More specifically, various developments using the structural change such as chemical change, phase change or morphology change can be performed. This recording system by high power density exposure is called "heat-mode recording".

Conventional printing plate precursors of heat-mode positive system have a problem in that the change in solubility in the image-forming layer upon exposure is small near the support as compared with the change near the surface of the image-forming layer. In the printing plate precursor of heat-mode system, heat generation at the heat-mode exposure is attributable to light absorption of a light absorbent in the recording layer. Therefore, the quantity of heat generated is large on the surface of recording layer and small near the support. As a result, the degree of chance in solubility of the recording layer is relatively low near the support. In addition, when a metal support having high thermal conductivity preferred in view of suitability for printing, such as Al, is used, the increase of temperature is more prevented near the support due to thermal diffusion (i.e., heat diffusion).

For solving the problems due to thermal diffusion to the support upon exposure in the heat-mode printing plate, for example, JP-A-52-37104 (the term "JP-A" as used herein means an "unexamined published Japanese patent application") and JP-A-52-118427 propose a method of providing an aluminum oxide layer having a predetermined thickness or more on the support surface so as to reduce the heat diffusion. This method certainly has an effect but the effect is still insufficient and cannot eliminate the residual film of heat-mode positive printing plate.

SUMMARY OF THE INVENTION

Accordingly, the object of the present invention is to provide a lithographic printing plate precursor capable of plate-making by scan exposure, having high sensitivity and good press life, and free of generation of stains.

Another object of the present invention is to provide a lithographic printing plate precursor developable with water or an aqueous solution or capable of being mounted in a printing press as it is without passing through development and subjected to printing.

As a result of extensive investigations, the present inventors have found the above-described objects can be attained by using the following lithographic printing plate precursor (sometimes, called the lithographic printing original plate). The present invention has been accomplished based on this finding.

That is, the present invention provides:

(1) a lithographic printing plate precursor comprising a support having sequentially formed thereon a layer containing a polymer complex (Layer A) and a recording layer thermally variable in the solubility in at least one of water and an aqueous solution (Layer B), the support having a hydrophilic surface and at least one of Layer a and Layer B containing a light-heat converting agent;

(2) the lithographic printing plate precursor as described in (1) above, wherein the amount of polymer complex-containing layer (Layer A) coated is from 0.1 to 1.0 $g/m^2$ and the absorbency at the wavelength of laser for drawing an image is 0.3 or more; and (3) the lithographic printing plate precursor as described in (1) above, wherein the recording layer (Layer B)

contains a polymer compound having a hydrophobic functional group thermally variable in the hydrophilicity.

The term "water and an aqueous solution" as used for the lithographic printing plate precursor (hereinafter, called the lithographic printing original plate) of the present invention is described below. When the recording layer of the lithographic printing original plate contains a polar conversion polymer compound (irrespective of positive or negative), the "water" may be pure water, may contain other components, or may be a fountain solution supplied together with ink at the printing, as long as it can dissolve the non-image area.

The "aqueous solution" includes the above-described fountain solution and when the recording layer contains an aqueous alkali solution-soluble resin (irrespective of positive or negative), additionally includes conventionally well-known alkali developers. As such, the fountain solution may be "water" or "aqueous solution".

In the lithographic printing original plate of the present invention, Layer B of the exposed area is imagewise solubilized (rendered positive) or insolubilized (rendered negative) by the heat generated due to light-heat conversion after the exposure. At this time, when a light-heat converting agent is present in Layer A, the change in solubility of Layer B in a developer proceeds from the interface between Layer A and Layer B. When the change in solubility renders Layer B positive, the dissolution proceeds from the interface and the adhesive property between Layer A and Layer B deteriorates, as a result, Layer B can be completely removed even if the layer is not solubilized. On the other hand, when Layer B is rendered negative, the insolubilization proceeds from the interface and the adhesive property between Layer A and Layer B increases, as a result, Layer B can be completely free from removal even if the layer is wholly insolubilized. In other words, when Layer A contains a light-heat converting agent, Layer B needs not be entirely changed in the solubility and a high-sensitivity printing plate can be obtained.

When a light-heat converting agent is present in Layer B, the chance in solubility of Layer B in a developer proceeds from the surface of Layer B. In this case, when Layer A is present, Layer B in the portion near the substrate is prevented from heat diffusion to the substrate and satisfactorily heated to a temperature necessary for the change in solubility. Accordingly, when Layer B is rendered positive, a residual film is not generated, whereas when Layer B is rendered negative, adhesion to the substrate increases. In other words, by virtue of the presence of Layer A, the change in solubility of Layer B can completely proceed.

When both Layer A and Layer B contain a light-heat converting agent, the above-described two effects can be simultaneously brought out by appropriately adjusting the content of light-heat converting agent. On taking account of sensitivity, adhesion, printing suitability, cost and the like, it is preferred that Layer A or both Layer A and Layer B contain a light-heat converting agent.

By developing the thus-obtained printing plate, Layer B is imagewise removed. Layer A is not removed by the developer because the polymer complex is insoluble in a solvent such as pure water, aqueous alkali solution, methanol, acetone, MEK, MFG, isopropanol and acetonitrile. Therefore, the surface of Layer A works out to the non-image area of a printing plate obtained. Layer A is removed like stripping of a film due to external force such as rubbing by a plate cylinder during the printing process. As a result, the hydrophilic surface of support is exposed and thus, a good non-image area free of scumming (i.e., staining) is formed.

Some of polymer complexes swell by absorbing water and thereby exhibit ink repellency, thus, Layer A itself may form a good non-image area free of scumming.

In the image area, Layer B is present on Layer A, accordingly, Layer A is not removed like stripping of a film due to external force during the printing. The effect obtained by providing Layer A such that the sensitivity can be elevated and the solubility of Layer B can be completely changed, may also be obtained by using a polymer capable of dissolving in a developer, such as water-soluble polymer, in place of the polymer complex. However, if such a polymer is used, Layer A is removed by the development. In the image area, Layer B is present on Layer A, therefore, the development proceeds at a higher rate than in the non-image area but the image area is still laterally dissolved. As a result, the portion in contact with the substrate, which contributes to the press life, is reduced (thinned) and the image area becomes weak. In particular, when a water-soluble polymer is used, Layer A gradually dissolves due to fountain solution during the printing and the press life is more shortened. On the other hand, the polymer complex is insoluble in various solvents, therefore, Layer A using the polymer complex is not dissolved by a developer or a fountain solution during the printing. Thus, when a polymer complex layer is used, the image area can have high strength, in other words, good press life can be obtained.

The lithographic printing original plate comprising Layer A and Layer B can attain the plate-making directly from digital data of a computer or the like by applying image recording thereto using a solid laser or semiconductor laser which emits an infrared ray, and the lithographic printing plate obtained can have high sensitivity and long press life and also can be free of generation of scumming.

DETAILED DESCRIPTION OF THE INVENTION

The present invention is described in detail below.

The lithographic printing original plate (i.e., the lithographic printing plate precursor) of the present invention comprises a support having sequentially formed thereon a polymer complex layer (Layer A) and a recording layer capable of being thermally solubilized or insolubilized in at least one of water and a developer (Layer B), the support having a hydrophilic surface and at least one of Layer A and Layer B containing a light-heat converting gent.

Polymer Complex Layer

The term "polymer complex layer" as used in the present invention means a layer containing at least a polymer complex which is described below.

Polymer Complex

The polymer complex for use in the present invention is a composite of a polymer and a molecule or ion bonded to the polymer by the interaction exclusive of covalent bonding and includes those insoluble in water or solvent. Examples of the polymer complex which can be suitably used include polymer electrolyte complexes, hydrogen-bonding polymer-to-polymer complexes, stereo complexes, electric charge transfer-type polymer-to-polymer complexes, side chain coordinate bond-type polymer metal complexes, multidentate coordination bond-type polymer metal complexes, stacked polymer metal complexes, imbedded polymer metal complexes, organic metal polymer complexes, ion bond-type polymer metal complexes, metal colloid dispersion complexes and interlayer compound polymer metal complexes described in Koji Abe, *Kobunshi Science One Point—5 Kobunshi Complex* (*Polymer Science One Point—5 Polymer Complex*), compiled by Kobunshi Gakkai (1994) and *Advances in Polymer Science*, Springer-Verlac Berlin Heidelberg New York (1982). Among these, polymer electrolyte complexes and ion bond-type polymer metal complexes are preferred in the present invention, and polymer electrolyte complexes are more preferred.

The polymer electrolyte complex is a polymer aggregate resulting from polymer electrolytes having opposite charges (a polycation having cation and a polyanion having anion) being combined by the electrostatic interaction while releasing the micro counter ions, or a polymer aggregate resulting from polymer electrolytes each having cation and anion within the same molecule being combined by the electrostatic interaction while releasing the micro counter ions. The polymer electrolyte complex has a structure such that polymers are c-ross-linked by the electrostatic interaction, therefore, the polymer complex is generally insoluble in a solvent such as water, methanol, ethanol, tetrahydrofuran, ethylene dichloride, cyclohexanone, methyl ethyl ketone, acetone, ethylene glycol monoethyl ether, 2-methoxyethyl acetate, diethylene glycol dimethyl ether, 1-methoxy-2-propyl acetate, N,N-dimethylformamide, N,N-dimethylacetamide, toluene, ethyl acetate, ethyl lactate, methyl lactate and dimethyl sulfoxide.

Examples of the polymer electrolyte which can form the above-described polymer electrolyte complexes include polymers having within the molecule at least one functional group selected from a carboxylic acid (salt) group, a sulfonic acid (salt) group and a phosphoric acid (salt) group, polymers having within the molecule at least one functional group selected from an ammonium group, a sulfonium group, a phosphonium group, an iodonium group and an amino group, and polymers having within the molecule at least one functional group selected from a carboxylic acid (salt) group, a sulfonic acid (salt) group and a phosphoric acid (salt) group, and at least one functional group selected from an ammonium group, a sulfonium group, a phosphonium group, an iodonium group and an amino group.

Examples of the monomer which can be suitably used for synthesizing those polymer electrolytes include monomers having a functional group described above, and monomers having a functional group capable of deriving the above-described functional group. Among such monomers, specific examples of the monomer having an ethylenically unsaturated double bond, which is suitably used for radical polymerization, are set forth below, however, the present invention is by no means limited thereto.

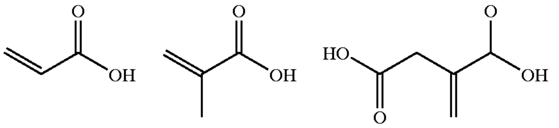

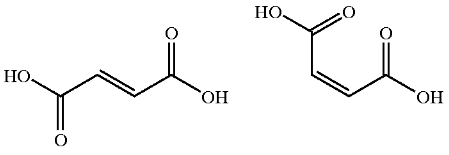

-continued

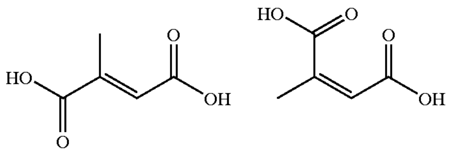

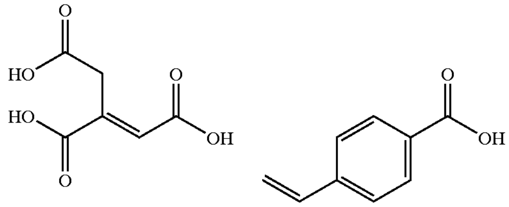

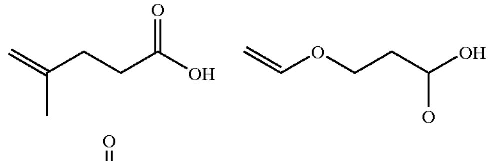

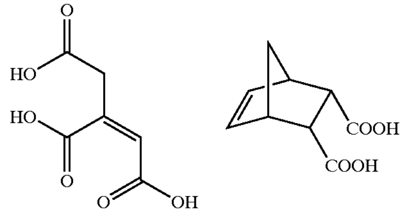

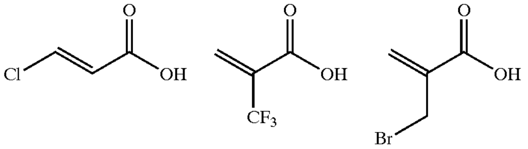

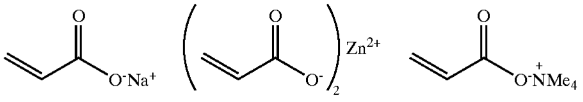

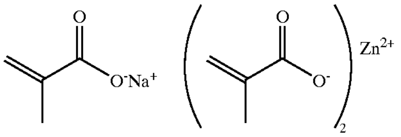

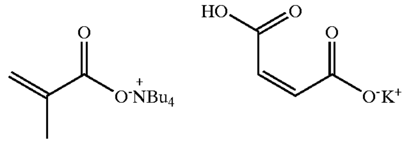

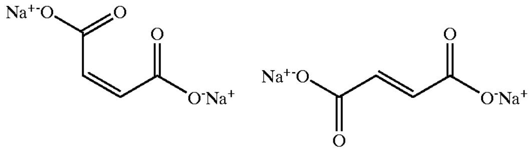

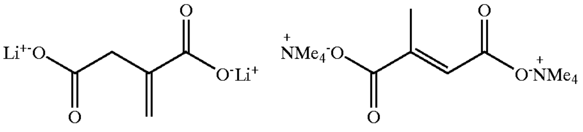

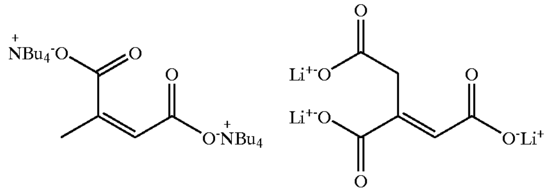

-continued
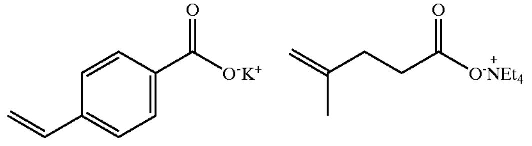
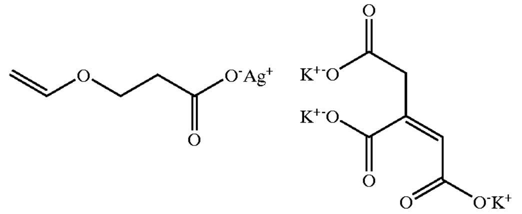
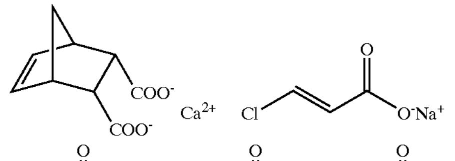
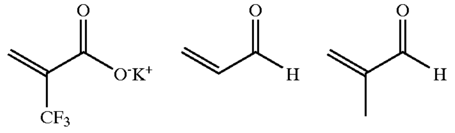
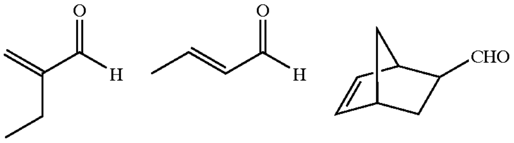
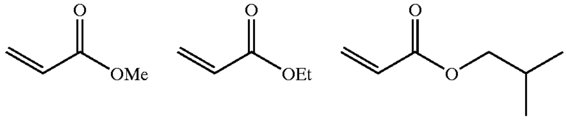
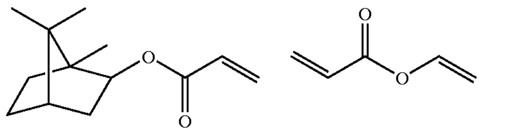
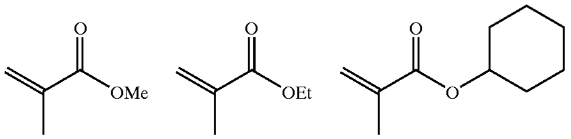
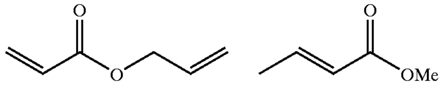
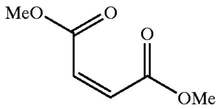
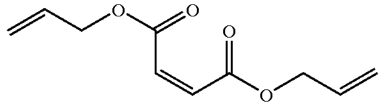
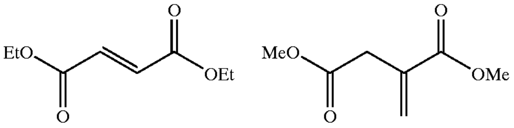
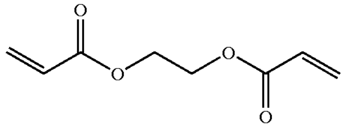
-continued
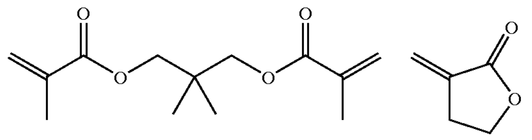
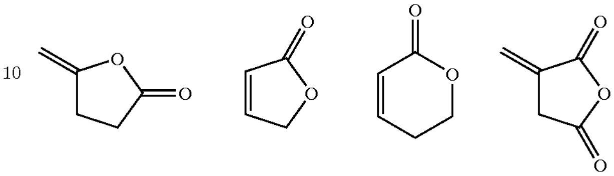
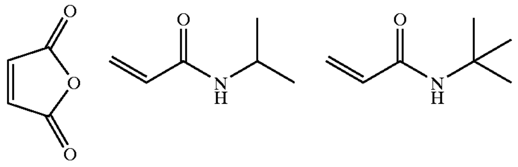
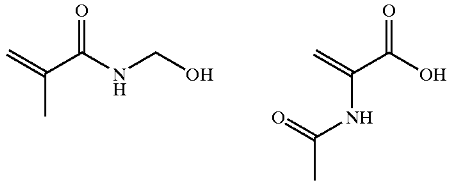
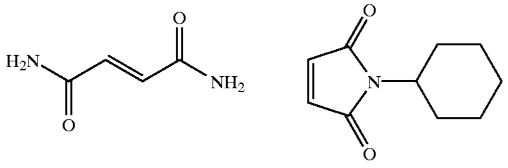
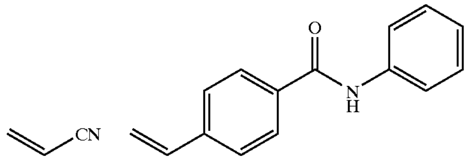
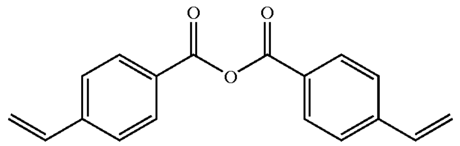
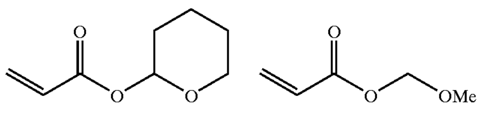
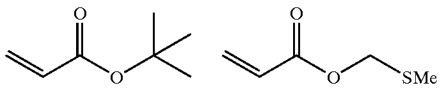
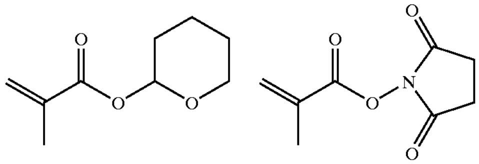
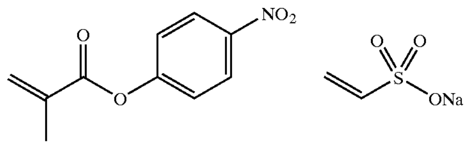

-continued
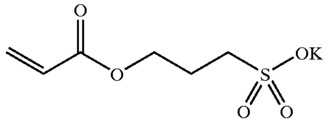
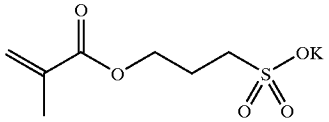
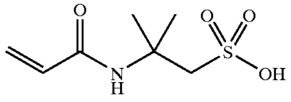
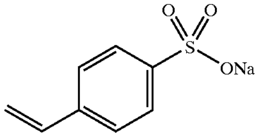
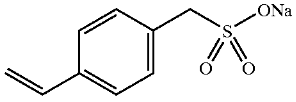
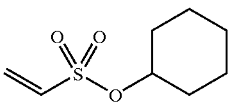
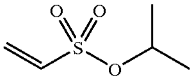
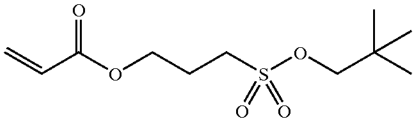
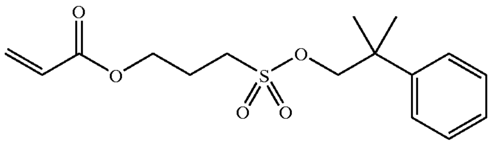
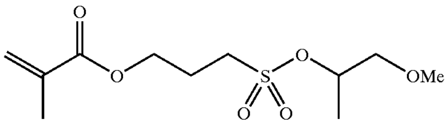
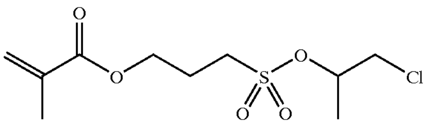
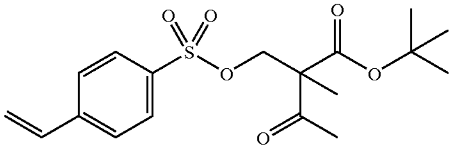
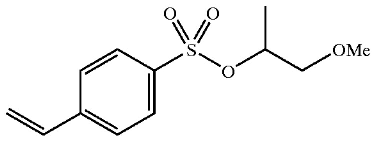
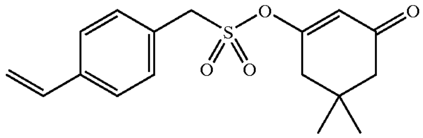
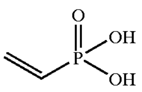
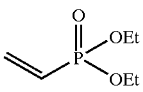
$H_3PO_4$
-continued
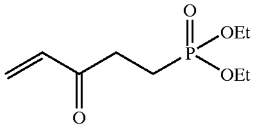
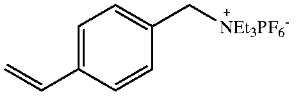
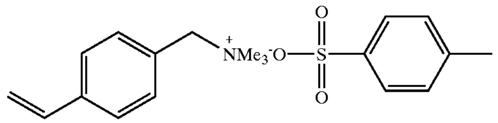
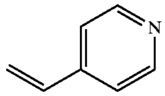
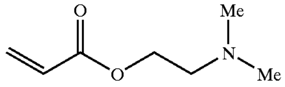
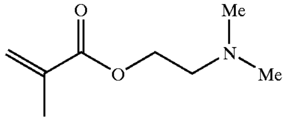
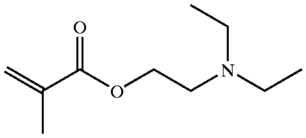
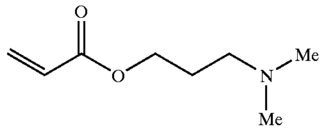
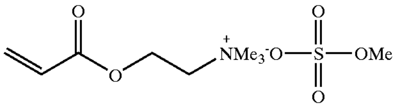
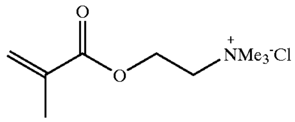
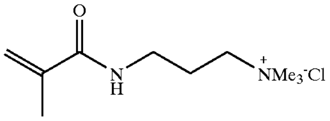
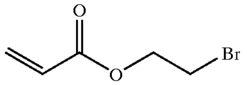
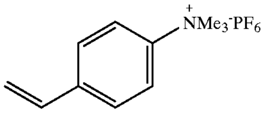
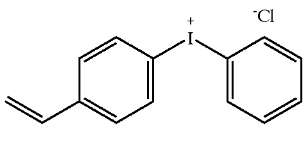
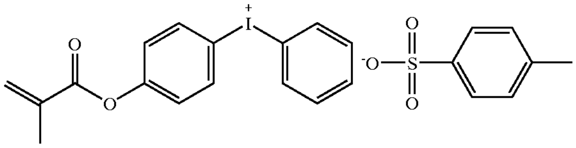
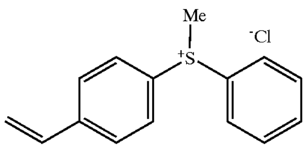

-continued

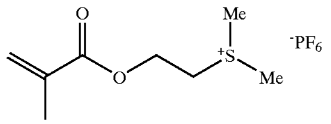

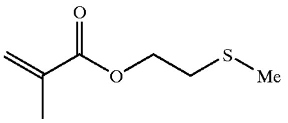

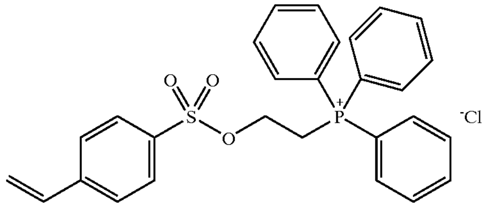

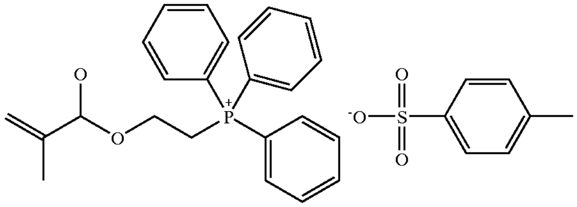

The polymer electrolyte For use in the present invention may be obtained by polymerizing the above-described monomer alone or by copolymerizing two or more thereof. In the case of polymerizing a monomer having a functional group capable of deriving the above-described functional group, various chemical reaction treatments may be performed, if desired, after the polymerization or the formation of polymer complex layer to derive the above-described functional group and thereby obtain the polymer electrolyte, such as hydrolysis reaction, thermal decomposition reaction, photolysis reaction, oxidation reaction, reduction reaction and displacement reaction.

The polymer electrolyte for use in the present invention is not particularly limited as long as it has the above-described functional group. Also, a copolymer with a monomer having no above-described functional group may also be suitably used within the range of not impairing the effect of the present invention. As the monomer for use in the synthesis of the copolymer, any monomer having neither the above-described functional group may be suitably used. Specific examples of the monomer are described below.

Examples of the other monomer for use in the synthesis of the copolymer include known monomers such as styrenes, unsaturated hydrocarbons, vinyl ethers, vinyl esters and α,β-unsaturated ketones.

Specific examples of styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene and fluorostyrene.

Specific examples of unsaturated hydrocarbons include the following compounds:

$H_2C{=}CH_2$ $H_2C{=}CHCH_3$ $HC{\equiv}CH$ $HC{\equiv}CCH_3$

-continued

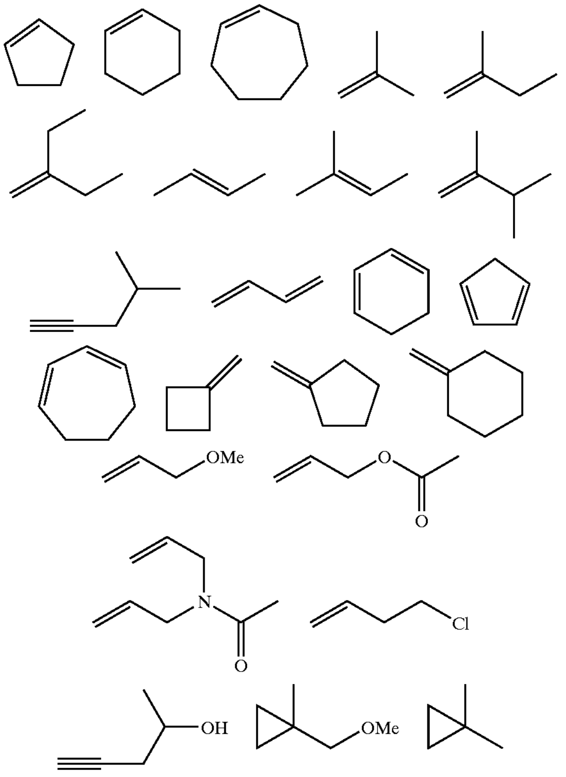

Specific examples of vinyl ethers include the following compounds:

$H_2C{=}CHOCH_3$ $H_2C{=}CHOCH_2CH_3$ 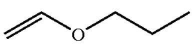

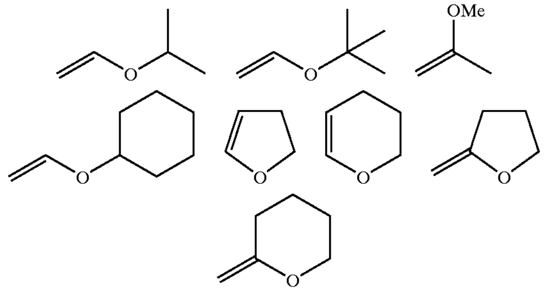

Specific examples of vinyl esters include the following compounds:

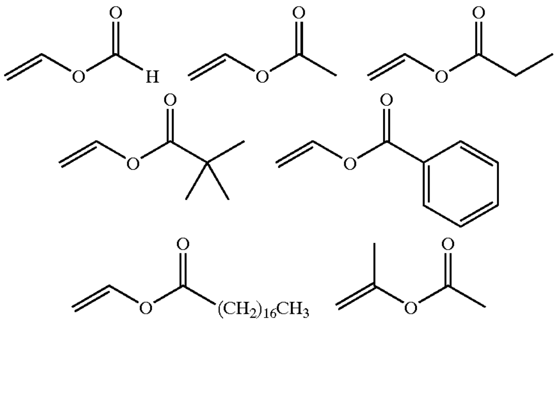

-continued

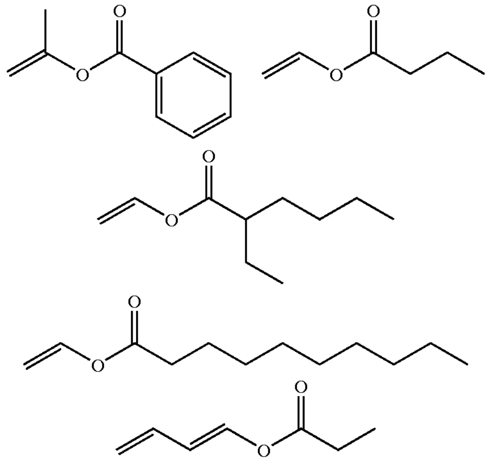

Specific examples of α,β-unsaturated ketones include the following compounds:

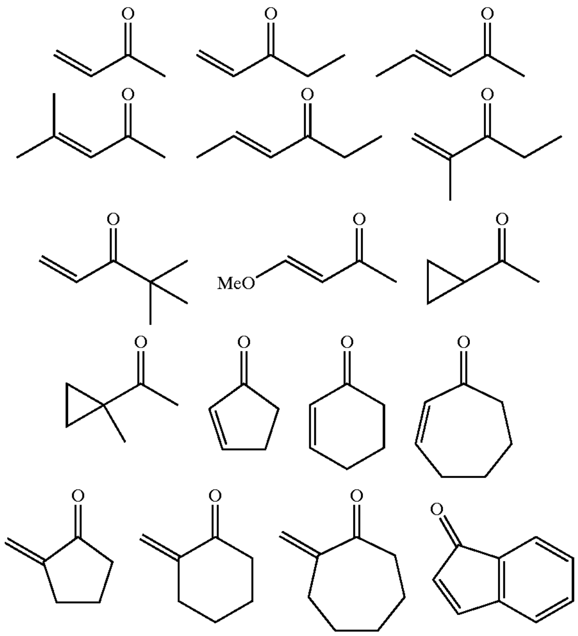

In the synthesis of polymer electrolyte for use in the present invention, the monomer having the above-described specific functional group or a monomer having a functional group capable of deriving the specific functional group is preferably used in a ratio of 10 wt % or more, more preferably 40 wt % or more. If the monomer ratio is less than 10 wt %, the number of functional groups capable of causing electrostatic interaction is reduced and the cross-linking by the electrostatic interaction between polymer electrolytes is weakened, as a result, the polymer electrolyte complex increases in the solubility and dissolves in a solvent described above. In the case of the above-described other monomer is used in the synthesis of polymer electrolyte for use in the present invention, the copolymerizable other monomer can be used in any ratio as long as the monomer having the specific functional group is used in a preferred ratio. The copolymerizable other polymers may be used either individually or in combination of two or more thereof.

Specific examples of the polymer electrolyte and the polymer compound capable of deriving the polymer electrolyte by a chemical reaction treatment (hereinafter sometimes called "polymer electrolyte precursor") are set forth below, however, the present invention is by no means limited thereto.

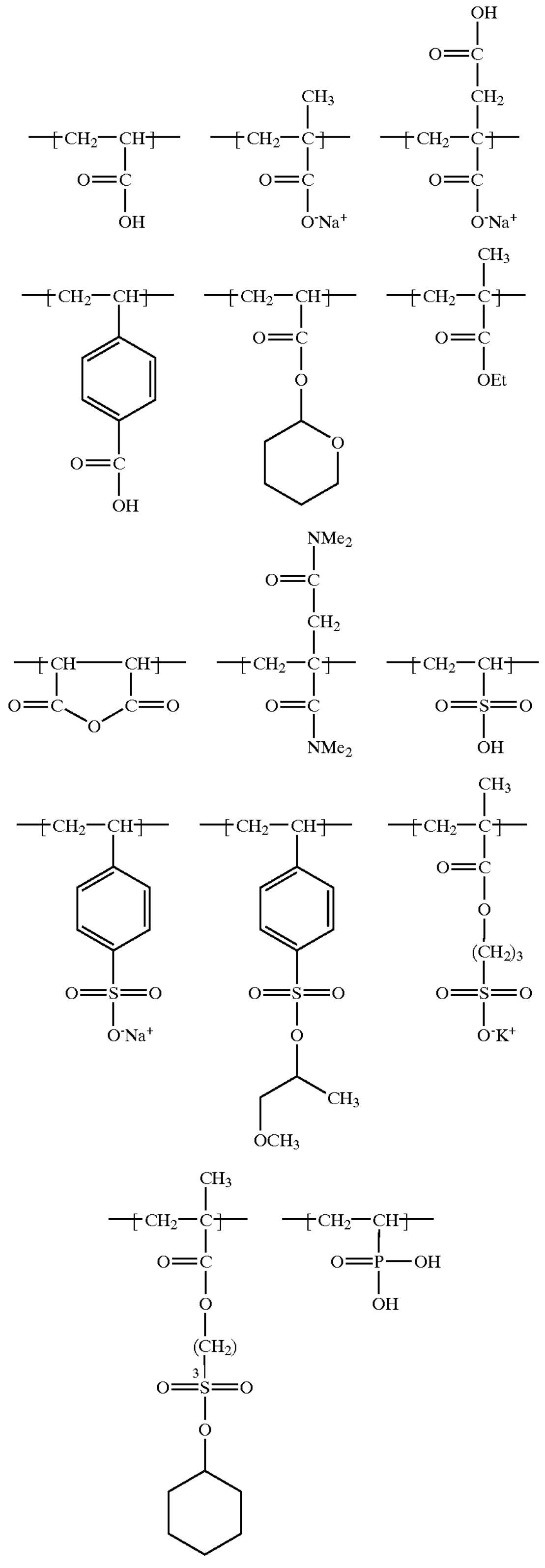

-continued
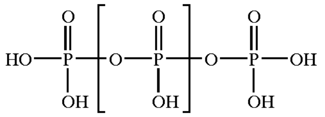
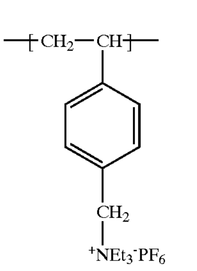
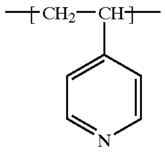
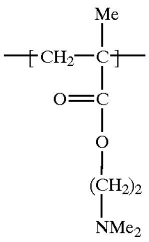
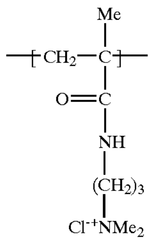
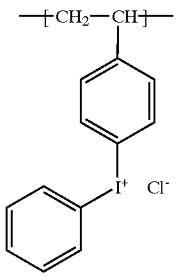
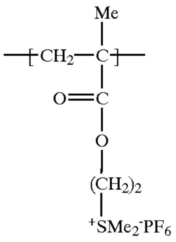
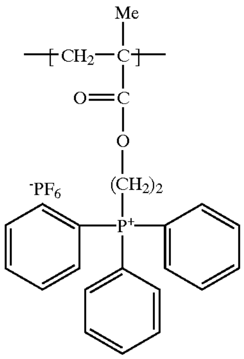
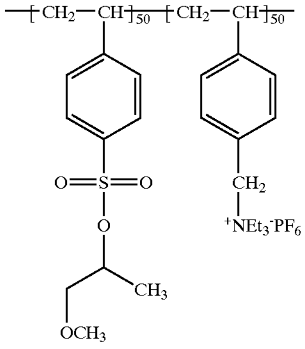
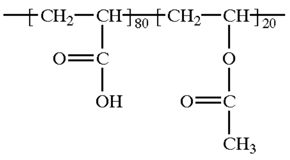
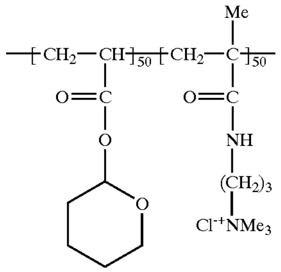
-continued
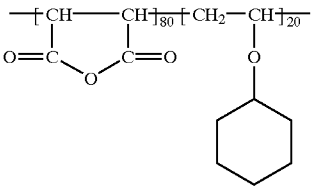
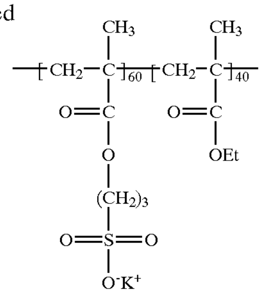
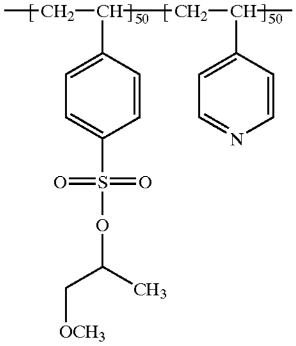
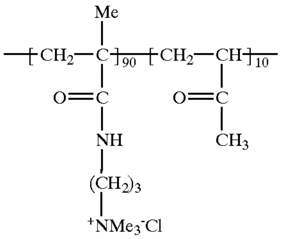
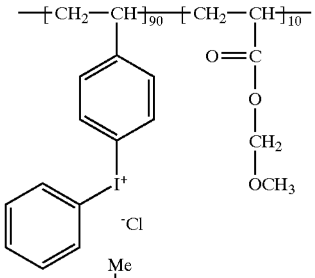
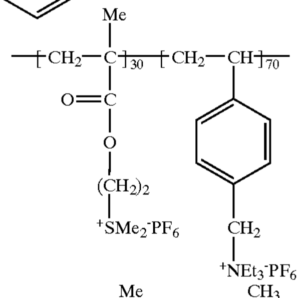
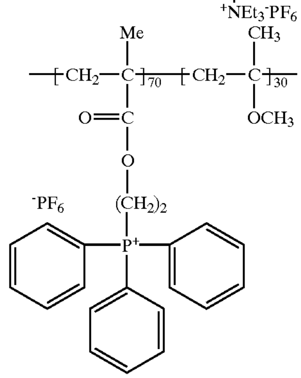

The polymer electrolyte or polymer electrolyte precursor for use in the lithographic printing original plate of the present invention preferably has a weight average molecular weight measured by GPC of 2,000 or more, more preferably from 5,000 to 300,000, and a number average molecular weight of 800 or more, more preferably from 1,000 to 250,000. The polydispersion degree (weight average molecular weight/number average molecular weight) is preferably 1 or more, more preferably from 1.1 to 10.

The polymer electrolyte or polymer electrolyte precursor may be any of a random polymer, a block polymer and a graft polymer, but a random polymer is preferred.

Examples of the solvent used in the synthesis of polymer electrolyte or polymer electrolyte precursor for use in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide and water. These solvents may be used either individually or in combination of two or more thereof.

The radical polymerization initiator used in the synthesis of polymer electrolyte or polymer electrolyte precursor for use in the present invention may be a known compound such as azo-based initiator and peroxide initiator.

In the case where the polymer electrolyte is contained in the polymer complex layer, either a sole polymer electrolyte or a mixture of two or more polymer electrolytes may be used as long as a polymer electrolyte complex can be formed.

The ratio of polymer complex contained in the polymer complex layer is preferably 40 wt % or more, more preferably 50 wt % or more. If the ratio is less than 40 wt %, the image strength is diminished and the press life is shortened.

In addition to the polymer complex, the polymer complex layer may contain a solid particle, a light-heat converting agent, an acid-generating agent, a sensitizing dye, a surface active agent and other constituent components.

The light-heat converting agent, acid-generating agent, sensitizing dye and surface active agent can be contained in a recording layer which is described later, therefore, these are described in detail later in connection with the recording layer.

Solid Particle

The polymer complex layer of the present invention may contain a solid particle in addition to the light-heat converting agent. The solid particle is preferably a particle capable of increasing the removability of polymer complex layer and varying the thermal conductivity distribution to efficiently use the heat generated in Layer A and/or Layer B. Examples of the solid particle include an inorganic particle, an organic particle and a metal particle.

Examples of the inorganic particle which can be used include metal oxides such as zinc oxide, titanium dioxide, iron oxide and zirconia; silicon-containing oxides called white carbon which itself has not absorption in the visible region, such as silicic acid anhydride, hydrous calcium silicate and hydrous aluminum silicate; and clay mineral particles such as clay, talc, kaolin and zeolite.

Examples of the metal particle include aluminum, copper, nickel, silver and iron. The inorganic particle or metal particle preferably has an average particle size of 10 mm or less, preferably from 0.01 to 10 mm, more preferably from 0.1 to 5 mm.

If the average particle size of inorganic or metal particle is less than 0.01 mm, the removability of polymer complex layer and the change in heat conductivity distribution are not so improved to exhibit the effect, whereas if it exceeds 10 mm, the resolving degree of printed matter is deteriorated or the adhesion to support is extremely reduced, as a result, the strength of image area decreases.

The inorganic particle or metal particle may be used in any content as long as the polymer complex is used in a preferred content, however, if contained, the content is preferably from 2 to 90 wt %, more preferably from 5 to 80 wt %. If the particle content is less than 2 wt %, the removability of polymer complex layer and the change in heat conductivity distribution are not so improved to exhibit the effect, whereas if it exceeds 90 wt %, the resolving decree of printed matter is deteriorated or the adhesion to support is extremely reduced, as a result, the strength of image area decreases.

Other than the inorganic particle and the metal particle, an organic particle may also be used. The organic particle is not particularly limited as long as it can increase the removability of polymer complex layer and vary the thermal conductivity distribution to enable efficient use of the heat generated in Layer A and/or Layer B. As a granular organic particle, a resin particle may be used, however, must be used by taking cares of the following matters. In the case of using a solvent at the dispersion of resin particles, a resin particle incapable of dissolving in the solvent or a solvent incapable of dissolving the resin particle must be selected. In the case of dispersing resin particles using a thermoplastic polymer and heat, a resin particle which does not melt, deform or decompose by heat at the dispersion must be selected.

For lightening the load of these matters to be taken care of, a cross-linked resin particle may be preferably used. The organic particle has an average particle size of from 0.01 to 10 mm, preferably from 0.05 to 10 mm, more preferably from 0.1 to 5 mm. If the average particle size of organic particle is less than 0.01 mm, the removability of polymer complex layer and the change in heat conductivity distribution are not so improved to exhibit the effect, whereas if it exceeds 10 mm, the resolving degree of printed matter is deteriorated or the adhesion to support is extremely reduced, as a result, the strength of image area decreases.

The organic particle may be used in any content as long as the polymer complex is used in a preferred content, however, if the organic particle is contained, the content is preferably from 2 to 90 wt %, more preferably from 5 to 80 wt %. If the particle content is less than 2 wt %, the removability of polymer complex layer and the change in heat conductivity distribution are not so improved to exhibit the effect, whereas if it exceeds 90 wt %, the resolving degree of printed matter is deteriorated or the adhesion to support is extremely reduced, as a result, the strength of image area decreases.

Examples of the organic particle include polystyrene particle (particle size: 4 to 10 mm) and silicone resin particle (particle size: 2 to 4 mm). Examples of the cross-linked resin particle include micro gel (particle size: 0.01 to 1 mm) comprising two or more ethylenically unsaturated monomers, cross-linked resin particle (particle size: 4 to 10 mm) comprising styrene and divinylbenzene, and cross-linked resin particle (particle size: 4 to 10 mm) comprising methyl methacrylate and diethylene glycol dimethacrylate, more specifically, micro gel of acrylic resin, cross-linked polystyrene, and cross-linked methyl methacrylate. These may be prepared by a general method such as emulsification polymerization method, soap-free emulsification polymerization method, seed emulsification polymerization method, dispersion polymerization method and suspension polymerization method.

Also, the inorganic particle may be prepared from a solution. For example, by adding a metal lower alkoxide to a solvent such as ethanol and in the presence of water and acid or alkali, an inorganic particle containing the metal is obtained. By adding the inorganic particle solution obtained to a solvent-soluble thermoplastic polymer solution, an inorganic particle dispersion solution may be prepared. Or, the inorganic particle containing the metal may also be obtained by previously adding the metal lower alkoxide to a thermoplastic polymer solution and thereafter adding water and acid or alkali.

In the case of preparing an inorganic particle by adding a metal lower alkoxide to a precursor solution of thermoplastic polymer, a composite of polymer and inorganic material is obtained at the time of converting the polymer precursor into a thermoplastic polymer by heat. Examples of the metal lower alkoxide which can be used include tetraethoxysilane and tetraethoxytitanium.

Others

In the lithographic printing original plate of the present invention, the polymer complex layer may additionally contain, if desired, a plasticizer for imparting flexibility to the coating. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligmers and polymers of acrylic acid or methacrylic acid.

The polymer complex layer of the lithographic printing original plate of the present invention may be usually produced by dissolving the above-described respective components in a solvent, coating the solution on an appropriate support and if desired, applying various treatments such as acid hydrolysis, base hydrolysis, thermal decomposition, photolysis, oxidation and reduction. Examples of the solvent used here include tetrahydrofuran, ethylene dichloride, cyclohexanone, methyl ethyl ketone, acetone, methanol, ethanol, propanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, dimethoxyethane, N,N-dimethylformamide, N,N-dimethylacetamide, toluene, ethyl acetate, ethyl lactate, methyl lactate, dimethyl sulfoxide, water, sulfolane and γ-butyrolactone, however, the present invention is by no means limited thereto.

These solvents may be used either individually or in combination. In the case of preparing a coating solution, the concentration of the polymer complex layer constituent components (all solids content including additives) in the solvent is preferably from 1 to 50 wt %.

The coating solution may be coated by various known methods such as bar coater coating, rotation coating, spray coating, curtain coating, dip coating, air knife coating, blade coating and roll coating.

In the lithographic printing original plate of the present invention, the polymer complex layer may contain a surface active agent so as to improve the coatability, such as a fluorine-based surface active agent described, for example, in JP-A-62-170950. The amount of the surface active agent added is preferably from 0.01 to 1 wt %, more preferably from 0.05 to 0.5 wt %, based on all solids content in the polymer complex layer.

The coated amount (solid content) of polymer complex layer obtained after the coating and drying varies depending on the use, however, in the case of a general lithographic printing original plate, it is from 0.1 to 1.0 $g/m^2$, preferably from 0.1 to 5.0 $g/m^2$, more preferably from 0.2 to 1.5 $g/m^2$.

Recording Layer

For the recording layer (Layer B) used in the lithographic printing original plate of the present invention, any layer may be used as long as the layer is imagewise solubilized (rendered positive) or insolubilized (rendered negative) in a developer by heat generated due to light-heat conversion after the exposure. In the case of Layer B undergoing positive conversion, a layer containing a hydrophobic polymer compound capable of becoming hydrophilic by heat (hereinafter sometimes called a “positive polar conversion polymer compound”) or a layer containing an aqueous alkali solution-soluble resin is preferred. In the case of Layer B undergoing negative conversion, a layer containing a hydrophilic polymer compound capable of becoming hydrophobic by heat (hereinafter sometimes called a “negative polar conversion polymer compound”) or a layer containing a compound cross-likable with an aqueous alkali solution-soluble resin is preferred.

Layer Containing Positive Polar Conversion Polymer Compound

The “layer containing a positive polar conversion polymer compound” for use in the lithographic printing original plate of the present invention means a layer containing at least a positive polar conversion polymer compound described below.

Positive Polar Conversion Polymer Compound

The positive polar conversion polymer compound for use in the present invention is, as described above, a hydrophobic polymer compound capable of becoming hydrophilic by heat. Examples of such a polymer compound include a hydrophobic polymer compound having on the side chain thereof a hydrophobic functional group capable of becoming hydrophilic by heat. This change must be on such a degree that when a polymer compound which does not exhibit hydrophilicity at an ordinary temperature, for example, does not dissolve in or swell with water, is applied with heat due to light-heat conversion after the laser exposure, a part or all of polar conversion functional groups on the side chain of the compound are changed by heat, as a result, the compound exhibits hydrophilicity, for example, dissolves in or swells with water.

With respect to the process of the hydrophobic functional group on the side chain of a hydrophobic polymer compound becoming hydrophilic by heat, two processes may be considered. One is a process where the originally hydrophobic functional group on the side chain causes reaction by heat and thereby becomes hydrophilic, and another is a process where the originally hydrophobic functional group on the side chain decomposes by heat to lose the hydrophobic functional group and thereby becomes hydrophilic.

As the former process of the hydrophobic group becoming hydrophilic as a result of reaction caused by heat, a process where the hydrophobic functional group reacts with another functional group within the polymer due to heat and becomes hydrophilic and a process where the hydrophobic functional group reacts with another compound outside the polymer due to heat and becomes hydrophilic may be considered. The functional group may be rendered hydrophilic through a combination of these two kinds of processes.

Among the above-described processes, in view of reactivity, a process where the originally hydrophobic functional group on the side chain decomposes due to heat to lose the hydrophobic functional group and thereby becomes hydrophilic is preferred.

In the present invention, it is preferred that all polar conversion functional groups on the side chain of the polar conversion polymer compound become hydrophilic, however, this is not particularly limited and not all of the hydrophobic functional groups are necessary to become hydrophilic as long as the polar conversion polymer compound can exhibit hydrophilicity, for example, can dissolve in or swell with water.

Specific examples of the hydrophobic functional group for use in the present invention include the following functional groups:

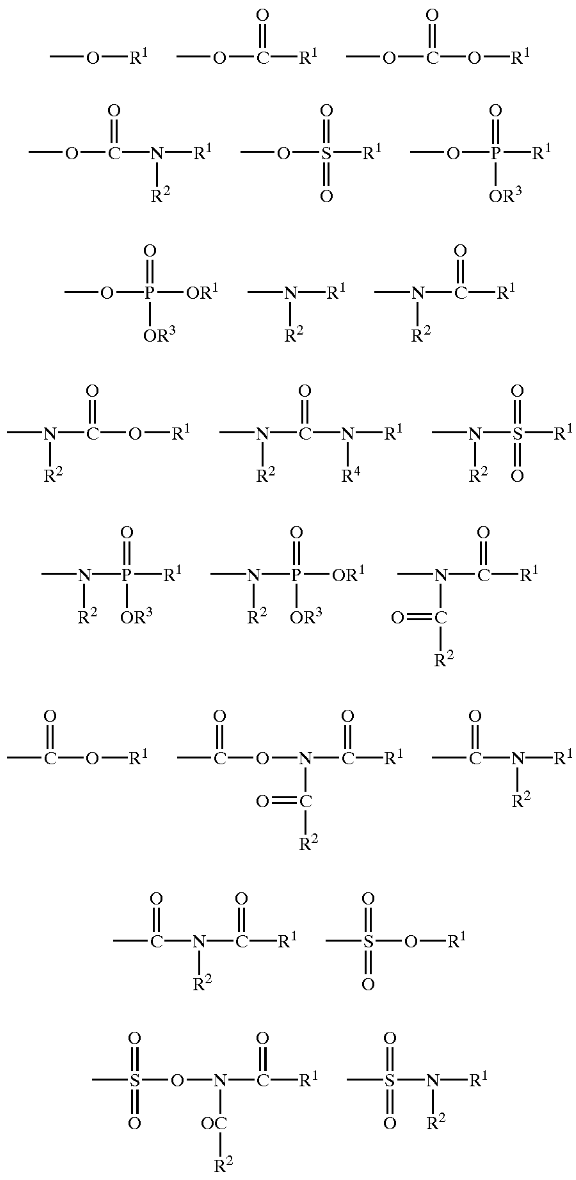

-continued

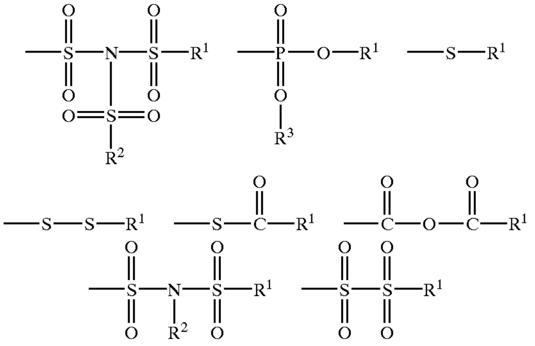

(wherein $R^1$ and $R^3$ each represents an alkyl group, an aryl group, an alkenyl group or an alkynyl group, $R^2$ and $R^4$ each represents hydrogen, an alkyl group, an aryl group, an alkenyl group or an alkynyl group, and $R^1$ and $R^2$, $R^1$ and $R^3$ or $R^1$ and $R^4$ may form a ring).

Specific examples of the hydrophilic functional group for use in the present invention include the following functional groups:

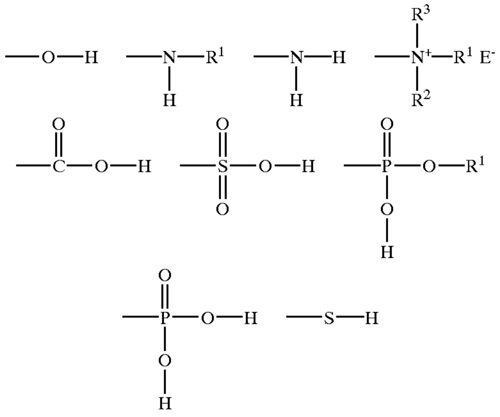

(wherein $R^1$, $R^2$ and $R^3$ each represents hydrogen, an alkyl group, an aryl group, an alkenyl group or an alkynyl group, any two of $R^1$, $R^2$ and $R^3$ may form a ring, and $E^-$ represents a counter anion).

When $R^1$, $R^2$, $R^3$ and $R^4$ each represents an alkyl group, the alkyl group includes a linear, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, a linear alkyl group having from 1 to 12 carbon atoms, a branched alkyl group having from 3 to 12 carbon atoms and a cyclic alkyl group having from 5 to 10 carbon atoms are preferred.

When $R^1$, $R^2$, $R^3$ and $R^4$ each represents a substituted alkyl group, the substituent is a monovalent nonmetallic atom group exclusive of hydrogen. Preferred examples of the substituent include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter referred to as a phosphonato group), a dialkylphosphono group ($—PO_3(alkyl)_2$), a diarylphosphono group ($—PO_3(aryl)_2$) an alkylarylphosphono group ($—PO_3(alkyl)(aryl)$), a monoalkylphosphono group ($—PO_3H(alkyl)$) and a conjugate base group thereof (hereinafter referred to as an alkylphosphonato group), a monoarylphosphono group ($—PO_3H(aryl)$) and a conjugate base group thereof (hereinafter referred to as an arylphosphonato group), a phosphonooxy group ($—OPO_3H_2$) and a conjugate base group thereof (hereinafter referred to as a phosphonatooxy group), a dialkylphosphonooxy group ($—OPO_3(alkyl)_2$), a diarylphosphonooxy group ($—OPO_3(aryl)_2$), an alkylarylphosphonooxy group ($—OPO_3(alkyl)(aryl)$), a monoalkylphosphonooxy group ($—OPO_3H(alkyl)$) and a conjugate base group thereof (hereinafter referred to as an alkylphosphonatooxy group), a monoarylphosphonooxy group ($—OPO_3H(aryl)$) and a conjugate base group thereof (hereinafter referred to as an arylphosphonatooxy group), a cyano group, a nitro group, an aryl group, an alkenyl group and an alkynyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group.

Examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group and a trimethylsilylethynyl group. $R^5$ in the acyl group ($R^5CO—$) includes hydrogen and the above-described alkyl and aryl groups.

Among these substituents, more preferred are a halogen atom (—F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group.

The alkylene group in the substituted alkyl group is a divalent organic residue resulting from releasing any one of hydrogen atoms on the above-described alkyl group having from 1 to 20 carbon atoms, preferably a linear alkylene group having from 1 to 12 carbon atoms, a branched alkylene group having from 3 to 12 carbon atoms or a cyclic alkylene group having from 5 to 10 carbon atoms. Specific preferred examples of the substituted alkyl group obtained by combining the substituent and the alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

When $R^1$, $R^2$, $R^3$ and $R^4$ each represents an aryl group, the aryl group includes a condensed ring formed from 1 to 3 benzene rings and a condensed ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among these, a phenyl group and a naphthyl group are preferred. The aryl group also includes a heterocyclic (hetero)aryl group in addition to the above-described carbocyclic aryl group. Examples of the heterocyclic aryl group include a pyridyl group, a furyl group, and a condensed ring thereof having from 3 to 20 carbon atoms and from 1 to 5 hetero atoms with a benzene ring, such as quinolyl group, benzofuryl group, thioxanthone group and carbazole group.

When $R^1$, $R^2$, $R^3$ and $R^4$ each represents a substituted aryl group, the substituted aryl group includes the above-described aryl groups having a monovalent nonmetallic atom group exclusive of hydrogen as a substituent on the ring-forming carbon atoms. Preferred examples of the substituent include the above-described alkyl groups, substituted alkyl groups and substituents of the substituted alkyl group.

Specific preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl) carbamoylphenyl group, an N-methyl-N-(sulfophenyl) carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, 2-butenyl group, a 2-methylallylphenyl group, a 2-methylpropenylphenyl group, a 2-propynylphenyl group, a 2-butynylphenyl group and a 3-butynylphenyl group.

When $R^1$, $R^2$, $R^3$ and $R^4$ each represents an alkenyl group, a substituted alkenyl group [$—C(R^6)═C(R^7)(R^8)$], an alkynyl group or a substituted alkynyl group [$—C≡C(R^9)$], $R^6$ to $R^9$ each may be a monovalent nonmetallic atom group.

Preferred examples of $R^6$ to $R^9$ include a hydrogen atom, a halogen atom, an alkyl group, a substituted alkyl group, an aryl group and a substituted aryl group. Specific examples thereof include those described above. The substituents $R^6$ to $R^9$ each is more preferably a hydrogen atom, a halogen atom or a linear, branched or cyclic alkyl group having from 1 to 10 carbon atoms.

Specific examples of the alkenyl group, the substituted alkenyl group, the alkynyl group and the substituted alkynyl group include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group and a phenylethyl group.

$R^1$ and $R^3$ each is preferably an alkyl group, a substituted alkyl group, an aryl group or a substituted aryl group, and $R^2$ and $R^4$ each is preferably hydrogen, an alkyl group, a substituted alkyl group, an aryl group or a substituted aryl group.

The counter anion represented by $E^-$ is an anion having a negative charge and forms an ion pair with the positive charge in the ammonium group ($—N^+R^1R^2R^3$) which is a hydrophilic functional group. Accordingly, the counter anion represented by $E^-$ is present in a molar number necessary for giving an electric charge equal to the positive charge present in the ammonium group.

Specific examples of the counter anion include $F^-$, $Cl^-$, $Br^-$, $I^-$, $HO^-$, $CN^-$, $SO_4^{2-}$, $HSO_4^-$, $SO_3^-$, $HSO_3^-$, $NO_3^-$, $CO_3^{2-}$, $HCO_3^{2-}$, $PF_6^-$, $BF_4^-$, $ClO_4^-$, $ClO_3^-$, $ClO_2^-$, $ClO^-$, $BrO_4^-$, $BrO_3^-$, $BrO_2^-$, $BrO^-$, $IO_4^-$, $IO_3^-$, $IO_2^-$, $IO^-$, sulfonate anion, carboxylate anion, phosphonate anion and phosphate anion.

Specific examples of the sulfonate anion are set forth below, however, the present invention is by no means limited thereto.

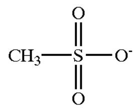
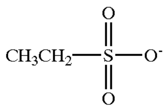
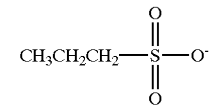
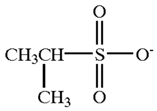
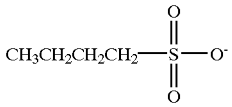
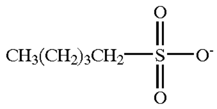
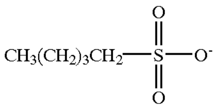
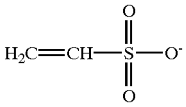
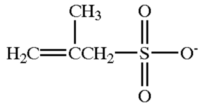
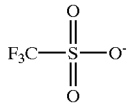
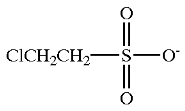
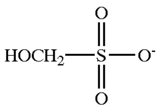
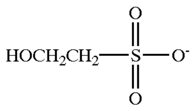
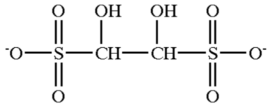
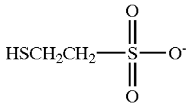

-continued
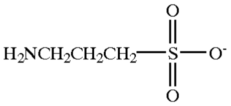
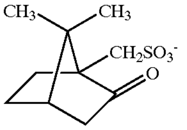
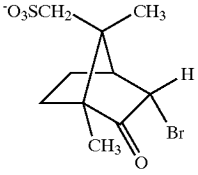
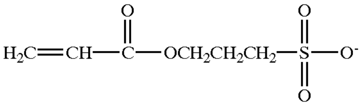
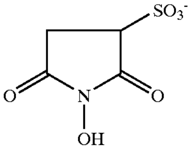
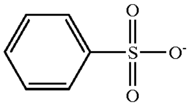
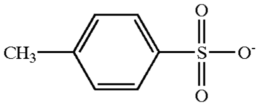
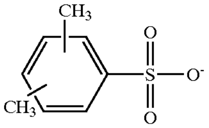
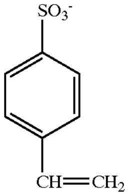
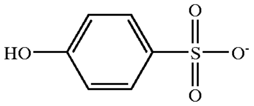
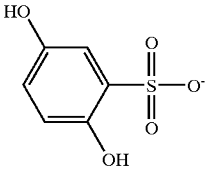
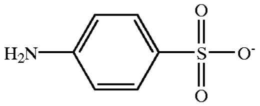
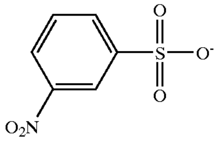
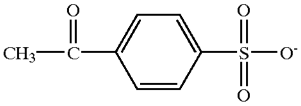
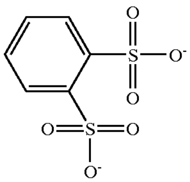
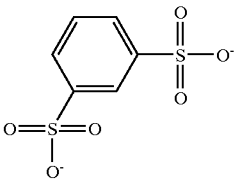
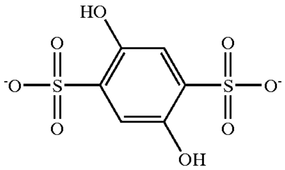
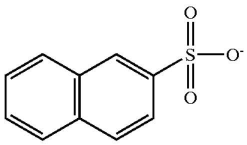
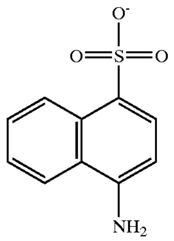
-continued
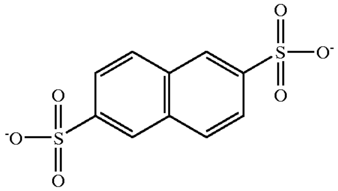
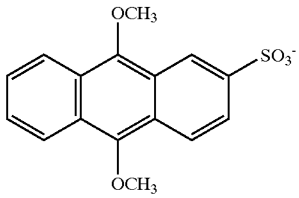
Specific examples of the carboxylate anion are set forth below, however, the present invention is by no means limited thereto.
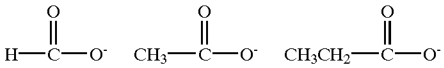
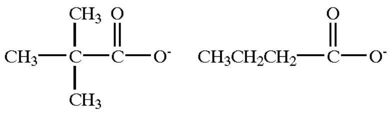
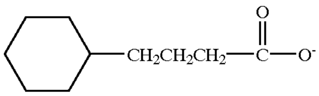
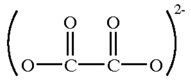
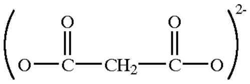
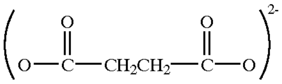
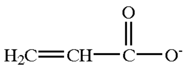
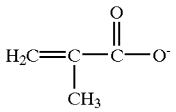
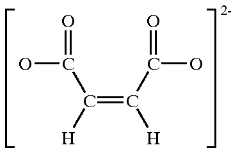
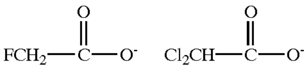
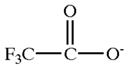
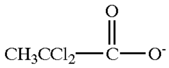
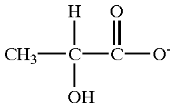
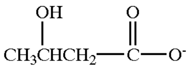
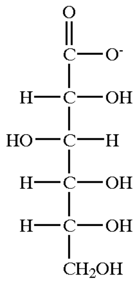
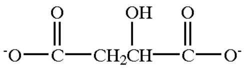
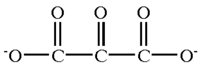

-continued
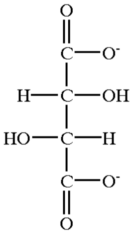
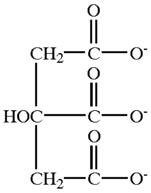
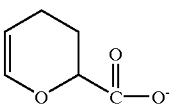
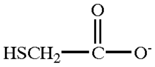
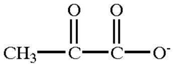
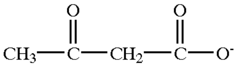
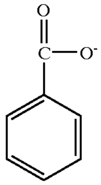
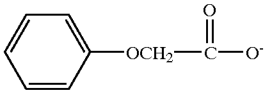
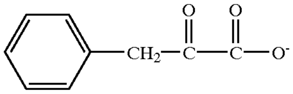
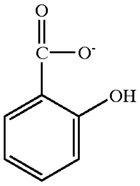
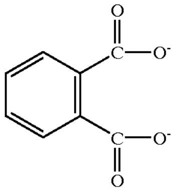
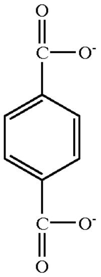
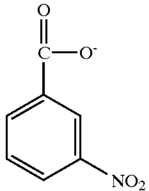
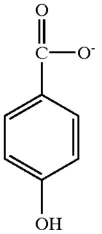
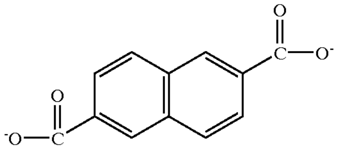
Specific examples of the phosphonate anion are set forth below, however, the present invention is by no means limited thereto.
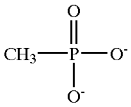
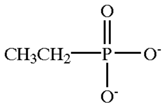
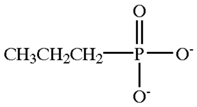
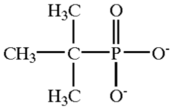
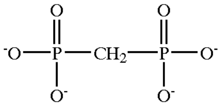
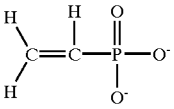
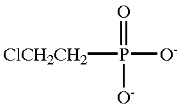
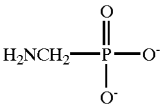
-continued
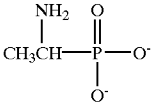
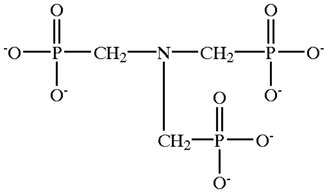
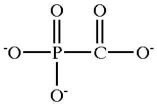
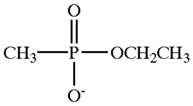
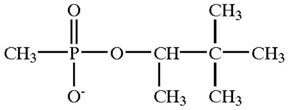
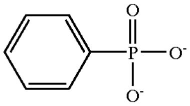
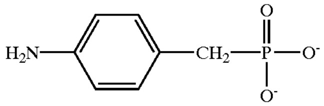
Specific examples of the phosphate anion are set forth below, however, the present invention is by no means limited thereto.
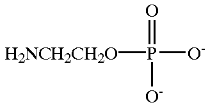
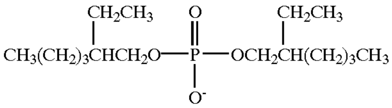
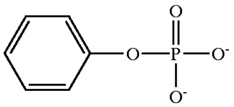
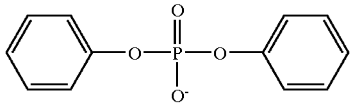
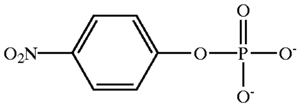
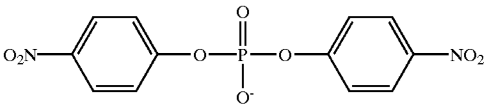
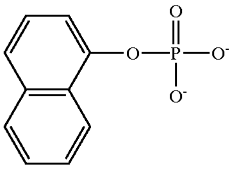
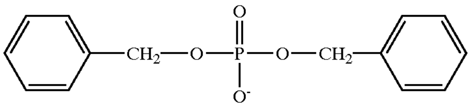

-continued

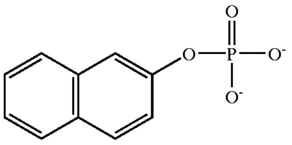

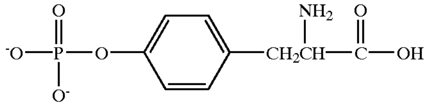

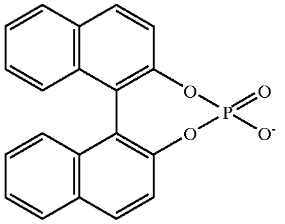

$PO_4^{3-}$, $HPO_4^{2-}$, $H_2PO_4^-$,

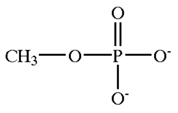

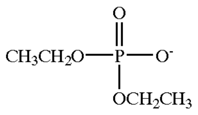

Among these anions, $Cl^-$, $Br^-$, $I^-$, $CN^-$, $SO_4^{2-}$, $PF_6^-$, $BF_4^-$, $ClO_4^-$, sulfonate anion, carboxylate anion, phosphonate anion and phosphate anion are preferred as the anion for use in the present invention.

Among these hydrophobic functional groups capable of becoming hydrophilic by the heat, particularly preferred in view of reactivity, storage stability and discrimination between hydrophilicity and hydrophobicity are the functional groups represented by the following formulae (1) to (5):

(1)

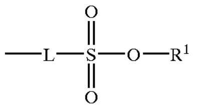

(2)

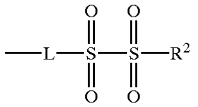

(3)

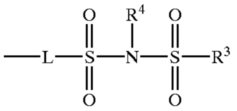

(4)

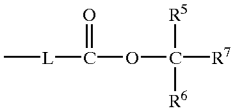

(5)

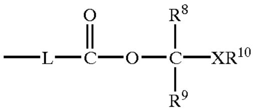

wherein L represents a polyvalent linking group comprising a nonmetallic atom, $R^1$ represents an alkyl group, an aryl group, an alkenyl group, an alkynyl group or a cyclic imide group, $R^2$ and $R^3$ each represents an alkyl group, an aryl group, an alkenyl group or an alkynyl group, $R^4$ represents an alkyl group, an aryl group, an alkenyl group, an alkynyl group or —$SO_2$—$R^{11}$, $R^5$, $R^6$ and $R^7$ each independently represents an alkyl group, an aryl group, an alkenyl group or an alkynyl group, one of $R^8$ and $R^9$ represents hydrogen and the other represents hydrogen, an alkyl group, an aryl group, an alkenyl group or an alkynyl group, $R^{10}$ represents an alkyl group, an alkenyl group or an alkynyl group, $R^{11}$ represents an alkyl group, an aryl group, an alkenyl group or an alkynyl group, any two or three of $R^5$, $R^6$ and $R^7$ may form a ring, $R^8$ and $R^{10}$ or $R^9$ and $R^{10}$ may form a ring, and X represents O or S.

When $R^1$ to $R^{11}$ each represents an alkyl group, the alkyl group include the above-described functional groups.

When $R^1$ to $R^{11}$ each represents a substituted alkyl group, the substituent thereof include the above-described functional groups.

When $R^1$ to $R^9$ and $R^{11}$ each represents an aryl group, the aryl group include the above-described functional groups.

When $R^1$ to $R^9$ and $R^{11}$ each represents a substituted aryl group, the substituted aryl group include the above-described functional groups.

When $R^1$ to $R^{11}$ each represents an alkenyl group, a substituted alkenyl group [—C($R^{13}$)═C($R^{14}$)($R^{15}$)], an alkynyl group or a substituted alkynyl group [—C≡C($R^{16}$)], $R^{13}$ to $R^{16}$ each may be a monovalent nonmetallic atom group.

Preferred examples of $R^{13}$ to $R^{16}$ include a hydrogen atom, a halogen atom, an alkyl group, a substituted alkyl group, an aryl group and a substituted aryl group. Specific examples thereof include those described above.

When $R^1$ represents a cyclic imide group, the cyclic imide group includes those having from 4 to 20 carbon atoms, such as succinic acid imide, phthalic acid imide, cyclohexanedicarboxylic acid imide and norbornenedicarboxylic acid imide.

$R^1$ is more preferably an alkyl group, a substituted alkyl group or a cyclic imide group.

$R^2$, $R^3$, $R^4$ and $R^{11}$ each is more preferably an alkyl group substituted by an electron withdrawing group such as halogen, cyano or nitro, an aryl group substituted by an electron withdrawing group such as halogen, cyano or nitro, or a secondary or tertiary branched alkyl group.

$R^5$ to $R^9$ each is preferably an alkyl group, a substituted alkyl group, an aryl group or a substituted aryl group, and $R^{10}$ is preferably an alkyl group or a substituted alkyl group, provided that any two or three of $R^5$, $R^6$ and $R^7$ form a ring or that $R^8$ and $R^{10}$ or $R^9$ and $R^{10}$ form a ring.

The polyvalent linking group comprising a nonmetallic atom group, represented by L, comprises from 1 to 60 carbon atoms, from 0 to 10 nitrogen atoms, from 0 to 50 oxygen atoms, from 1 to 100 hydrogen atoms and from 0 to 20 sulfur atoms. More specifically, the linking group includes those comprising a combination of the following structural units.

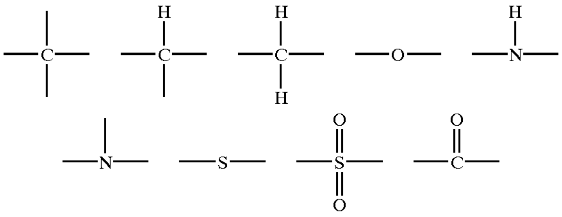

-continued

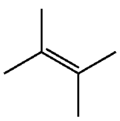 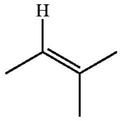 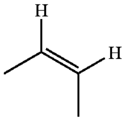 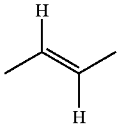

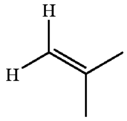  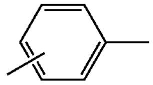

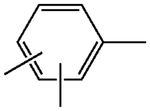 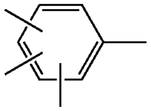 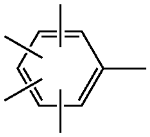

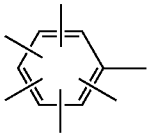

When the polyvalent linking group has a substituent, examples of the substituent which can be used include an alkyl group having from 1 to 20 carbon atoms, such as methyl group and ethyl group, an aryl group having from 6 to 16 carbon atoms, such as phenyl group and naphthyl group, an acyloxy group having from 1 to 6 carbon atoms, such as hydroxyl group, carboxyl group, sulfonamido group, N-sulfonylamido group and acetoxy group, an alkoxy group having from 1 to 6 carbon atoms, such as methoxy group and ethoxy group, a halogen atom such as chlorine and bromine, an alkoxycarbonyl group having from 2 to 7 carbon atoms, such as methoxycarbonyl group, ethoxycarbonyl group and cyclohexyloxycarbonyl group, a cyano group and a carboxylic acid ester group such as tert-butyl carbonate.

Specific examples of the radically polymerizable monomer having a hydrophobic functional group capable of becoming hydrophilic by heat, which is suitably used for the synthesis of positive polar conversion polymer compound for use in the present invention, are set forth below, however, the present invention is by no means limited thereto.

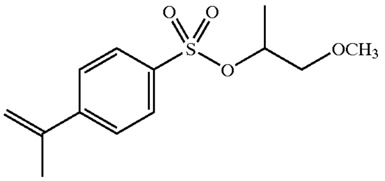

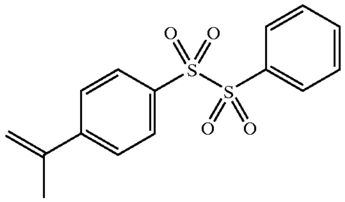

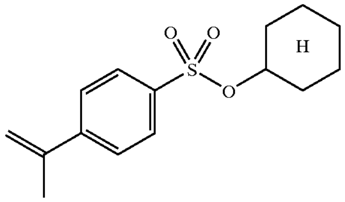

-continued

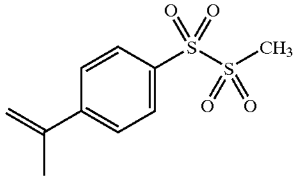

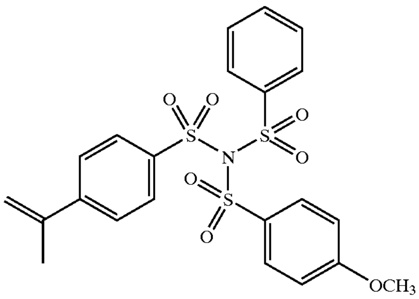

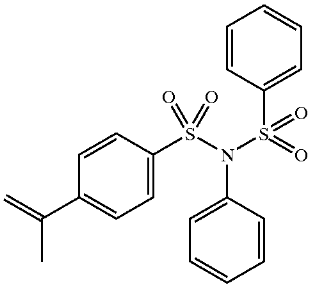

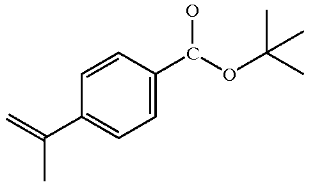

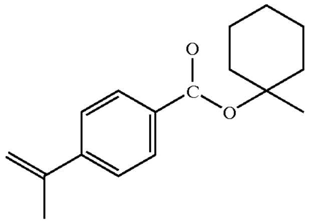

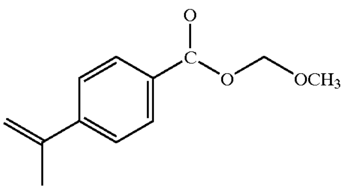

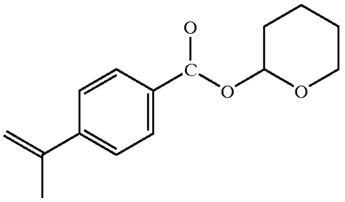

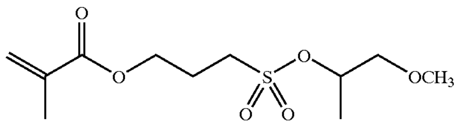

-continued
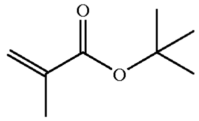
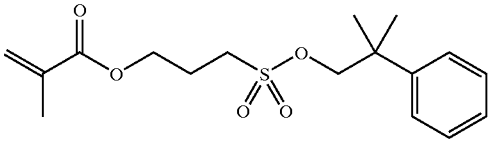
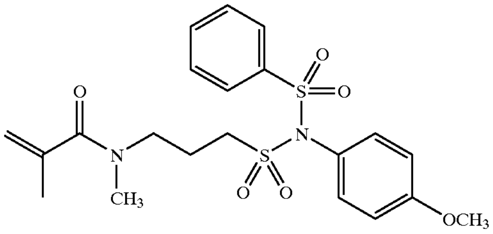
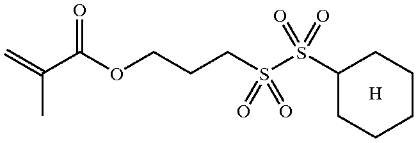
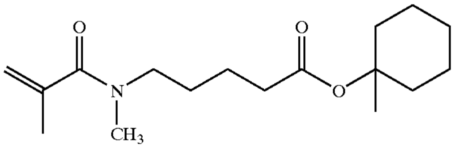
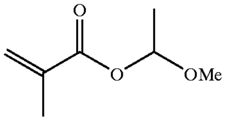
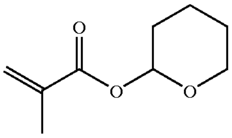
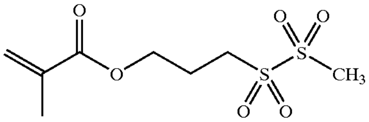
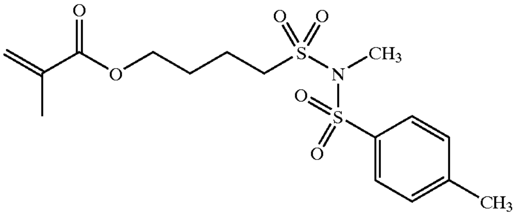
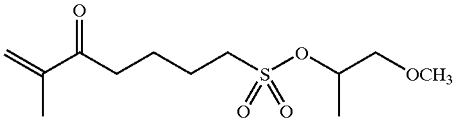
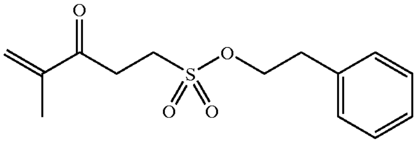
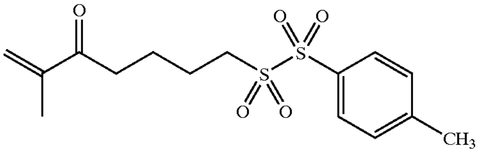
-continued
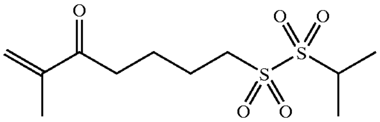
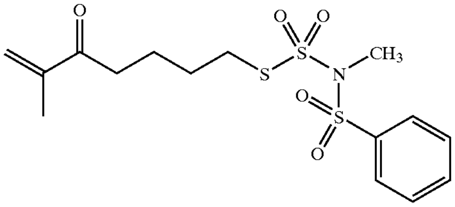
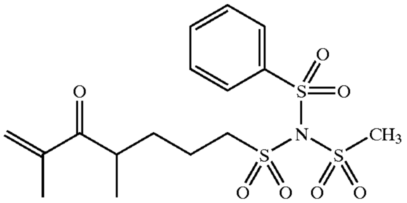
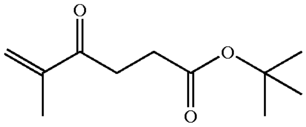
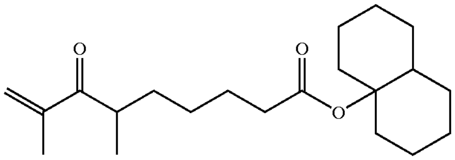
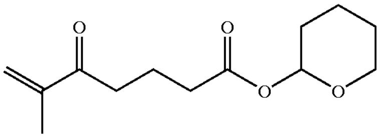
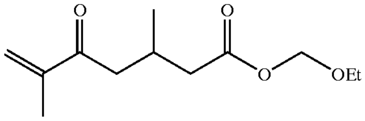
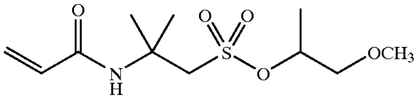
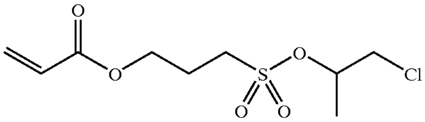
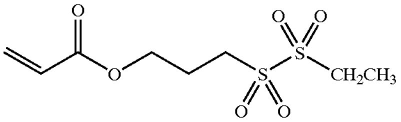
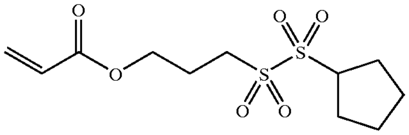

-continued
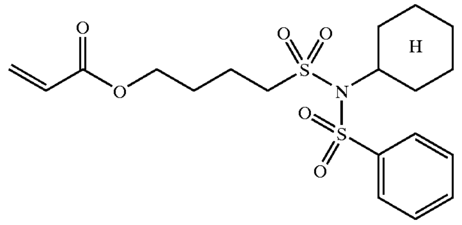
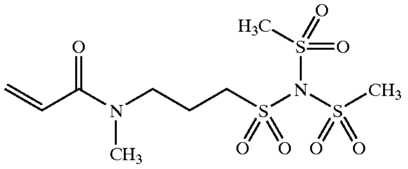
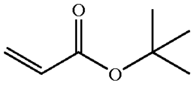
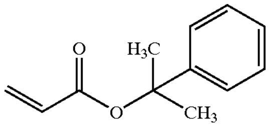
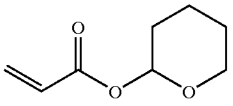
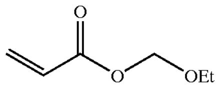
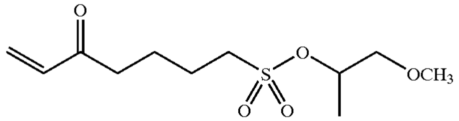
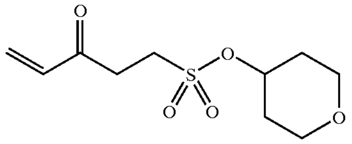
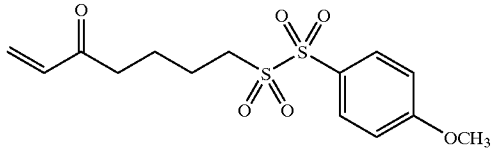
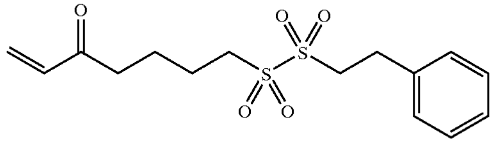
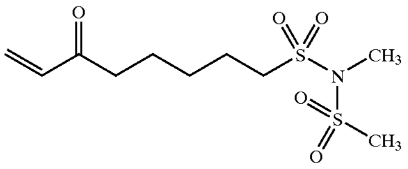
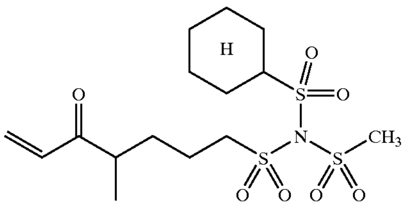
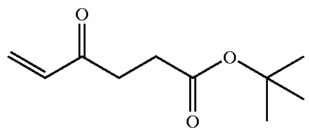
-continued
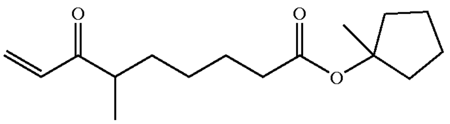
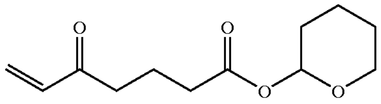
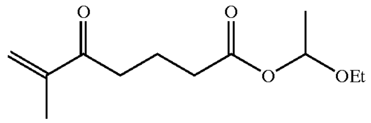
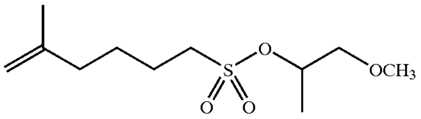
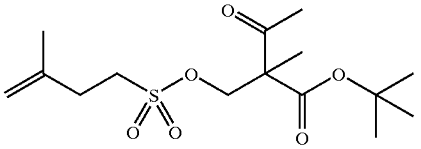
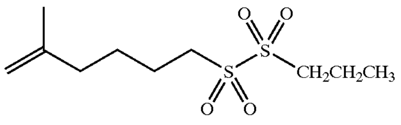
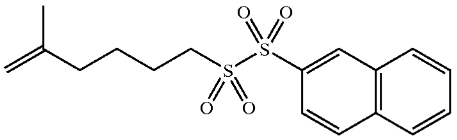
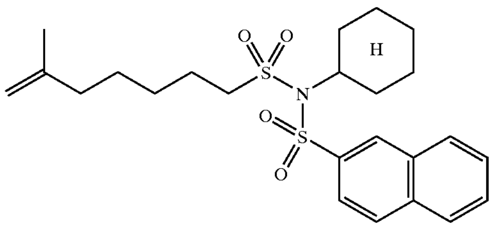
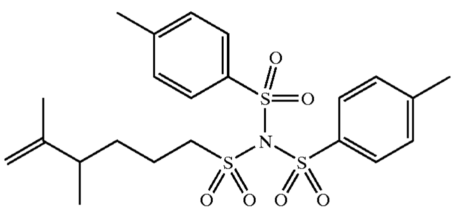
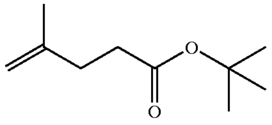
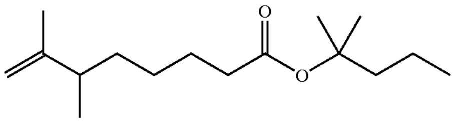
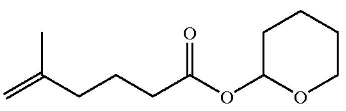

-continued
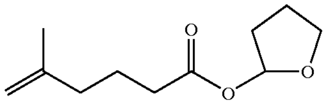
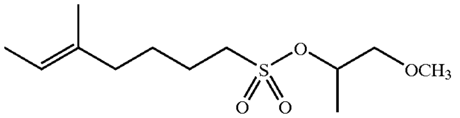
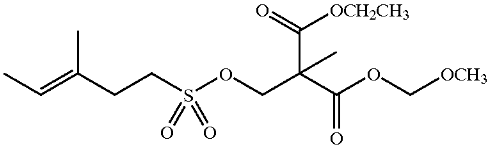
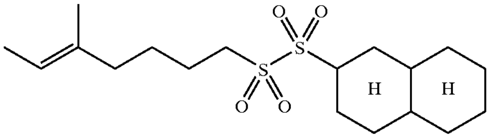
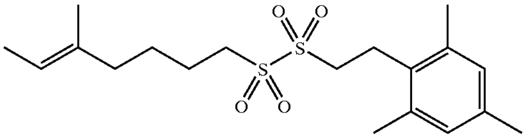
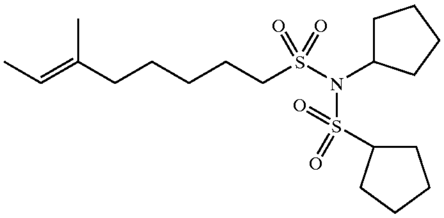
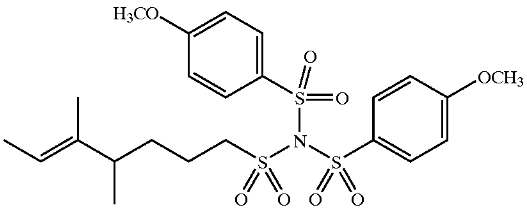
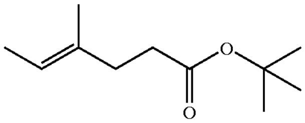
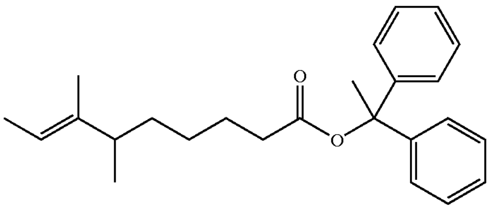
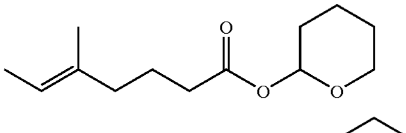
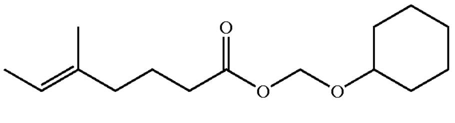
-continued
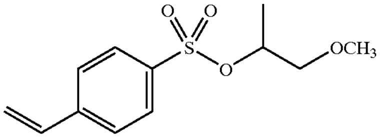
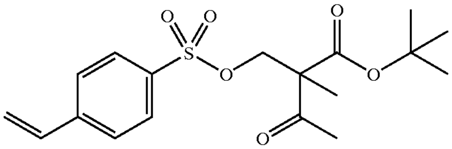
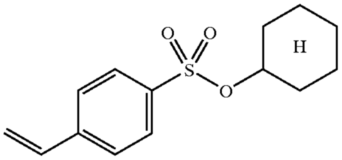
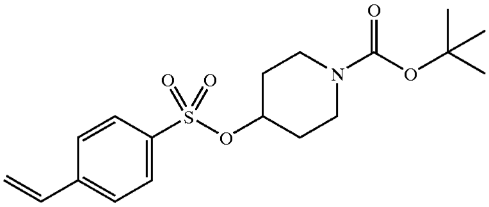
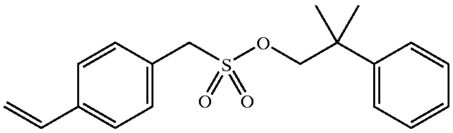
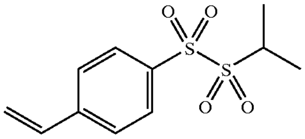
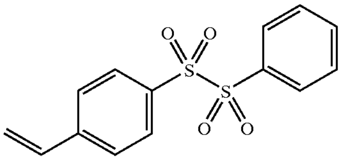
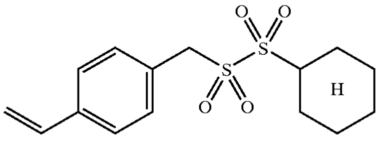
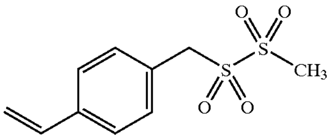
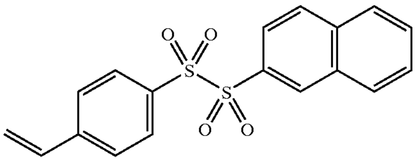
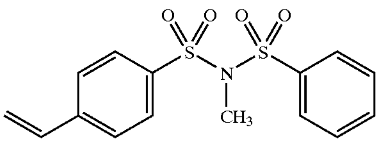

-continued
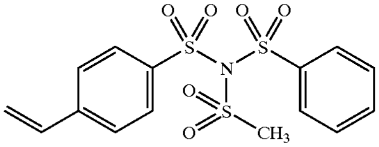
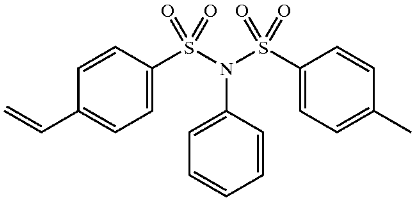
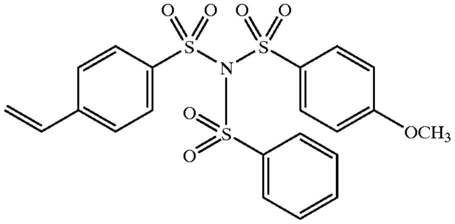
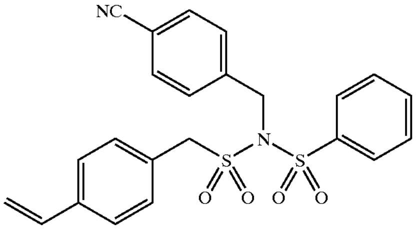
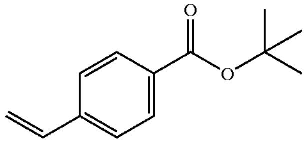
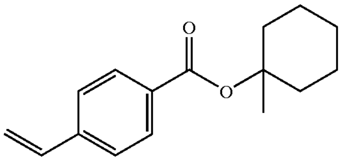
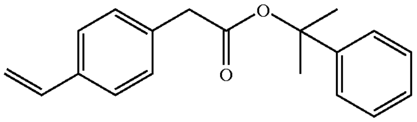
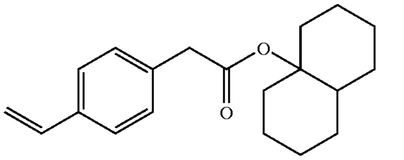
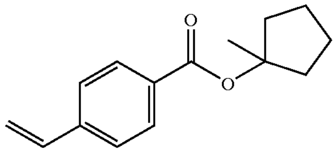
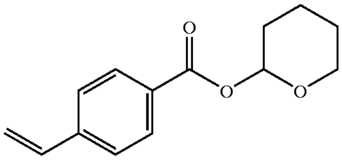
-continued
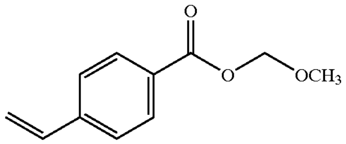
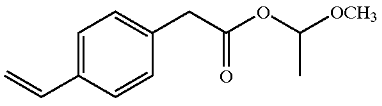
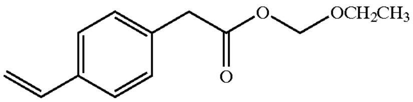
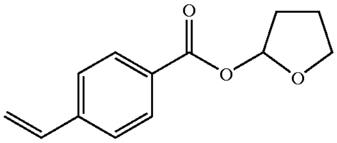
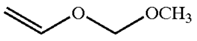
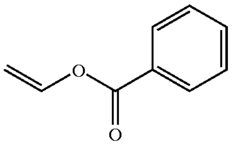
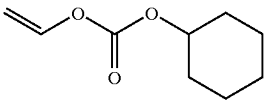
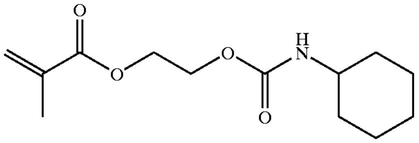
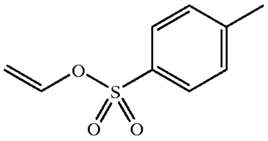
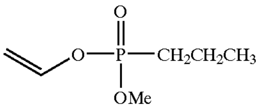
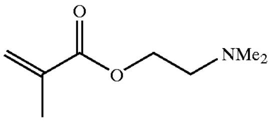
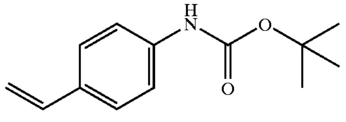
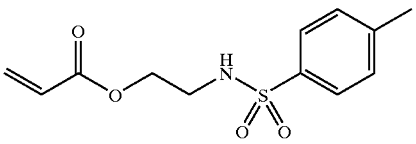
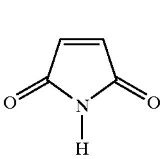
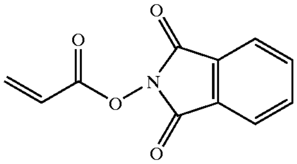
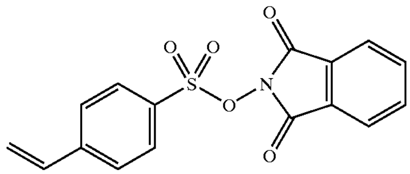

-continued

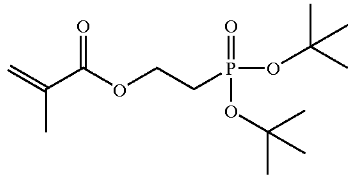

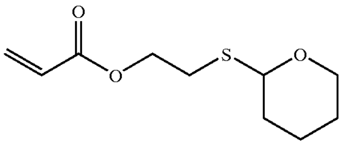

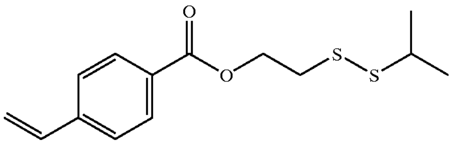

The positive polar conversion polymer compound for use in the present invention is not particularly limited as long as it has at least on a part of the side chain thereof a hydrophobic functional group capable of becoming hydrophilic by heat. A functional group other than the hydrophobic functional group capable of becoming hydrophilic by heat may also be present on the side chain. Therefore, even a copolymer with a monomer having a functional group other than a hydrophobic functional group capable of becoming hydrophilic by heat may also be suitably used as long as it does not inhibit the effect of the present invention. Examples of the radically polymerizable monomer having such a side chain include the following monomers.

Examples of the other radically polymerizable monomer for use in the copolymer include known monomers such as acrylic acid, acrylic acid esters, acrylamides, methacrylic acid, methacrylic acid esters, methacrylamides, maleic acid, maleic acid anhydride, maleic acid esters, maleic acid amides, maleic acid imides, itaconic acid, itaconic acid anhydride, itaconic acid esters, itaconic acid amides, itaconic acid imides, crotonic acid, crotonic acid esters, crotonic acid amides, fumaric acid, fumaric acid esters, fumaric acid amides, mesaconic acid, mesaconic acid esters, mesaconic acid amides, α,β-unsaturated lactones, α,β-unsaturated lactams, unsaturated hydrocarbons, vinyl ethers, vinyl esters, α,β-unsaturated ketones and styrenes.

Specific examples of the acrylic acid esters include methyl acrylate, ethyl acrylate, (n- or i-)propyl acrylate, (n-, i-, sec- or tert-)butyl acrylate, pentyl acrylate, hexyl acrylate, heptyl acrylate, octyl acrylate, nonyl acrylate, decyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate and 2-(hydroxyphenylcarbonyloxy)ethyl acrylate.

Specific examples of the acrylamides include acrylamide, N-methylacrylamide, N-ethylacrylamide, N-(n- or i-)propylacrylamide, N-(n-, i-, sec- or tert-)butyl acrylamide, N-benzylacrylamide, N-hydroxyethylacrylamide, N-phenylacrylamide, N-tolylacrylamide, N-(hydroxyphenyl)acrylamide, N-(sulfamoyiphenyl)acrylamide, N-(phenylsulfonyl)acrylamide, N-(tolylsulfonyl)acrylamide, N,N-dimethylacrylamide, N-methyl-N-phenylacrylamide and N-hydroxyethyl-N-methylacrylamide.

Specific examples of the methacrylic acid esters include methyl methacrylate, ethyl methacrylate, (n- or i-)propyl methacrylate, (n-, i-, sec- or tert-)butyl methacrylate, pentyl methacrylate, hexyl methacrylate, heptyl methacrylate, octyl methacrylate, nonyl methacrylate, decyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate and 2-(hydroxyphenylcarbonyloxy)ethyl methacrylate.

Specific examples of the methacrylamides include methacrylamide, N-methylmethacrylamide, N-ethylmethacrylamide, N-(n- or i-)propylmethacrylamide, N-(n-, i-, sec- or tert-)butylmethacrylamide, N-benzylmethacrylamide, N-hydroxyethylmethacrylamide, N-phenylmethacrylamide, N-tolylmethacrylamide, N-(hydroxyphenyl)methacrylamide, N-(sulfamoylphenyl)methacrylamide, N-(phenylsulfonyl)methacrylamide, N-(tolylsulfonyl)methacrylamide, N,N-dimethylmethacrylamide, N-methyl-N-phenylmethacrylamide and N-hydroxyethyl-N-methylmethacrylamide.

Specific examples of the crotonic acid esters include methyl crotonate, ethyl crotonate, (n- or i-)propyl crotonate, (n-, i-, sec- or tert-)butyl crotonate, pentyl crotonate, hexyl crotonate, heptyl crotonate, octyl crotonate, nonyl crotonate, decyl crotonate, amyl crotonate, 2-ethylhexyl crotonate, dodecyl crotonate, chloroethyl crotonate, 2-hydroxyethyl crotonate, 2-hydroxypropyl crotonate, 5-hydroxypentyl crotonate, cyclohexyl crotonate, allyl crotonate, trimethylolpropane monocrotonate, pentaerythritol monocrotonate, benzyl crotonate, methoxybenzyl crotonate, chlorobenzyl crotonate, hydroxybenzyl crotonate, hydroxyphenethyl crotonate, dihydroxyphenethyl crotonate, furfuryl crotonate, tetrahydrofurfuryl crotonate, phenyl crotonate, hydroxyphenyl crotonate, chlorophenyl crotonate, sulfamoylphenyl crotonate and 2-(hydroxyphenylcarbonyloxy)ethyl crotonate.

Specific examples of the crotonic acid amides include crotonic acid amide, N-methylcrotonic acid amide, N-ethylcrotonic acid amide, N-(n- or i-)propylcrotonic acid amide, N-(n-, i-, sec- or tert-)butylcrotonic acid amide, N-benzylcrotonic acid amide, N-hydroxyethylcrotonic acid amide, N-phenylcrotonic acid amide, N-tolylcrotonic acid amide, N-(hydroxyphenyl)crotonic acid amide, N-(sulfamoylphenyl)crotonic acid amide, N-(phenylsulfonyl)crotonic acid amide, N-(tolylsulfonyl)crotonic acid amide, N,N-dimethylcrotonic acid amide, N-methyl-N-phenylcrotonic acid amide and N-hydroxyethyl-N-methylcrotonic acid amide.

Examples of the maleic acid esters include dimethyl maleate, diethyl maleate, di(n- or i-)propyl maleate, di(n-, i-, sec- or tert-)butyl maleate, diphenyl maleate, diallyl maleate, monomethyl maleate, monoethyl maleate, mono(n- or i-)propyl maleate, mono(n-, i-, sec- or tert-)butyl maleate, dibenzyl maleate, monobenzyl maleate, methyl ethyl maleate, methyl propyl maleate and ethyl propyl maleate.

Specific examples of the maleic acid amides include maleic acid amide, N-methylmaleic acid amide, N-ethylmaleic acid amide, N-(n- or i-)propylmaleic acid amide, N-(n-, i-, sec- or tert-)butylmaleic acid amide, N-benzylmaleic acid amide, N-hydroxyethylmaleic acid amide, N-phenylmaleic acid amide, N-tolylmaleic acid amide, N-(hydroxyphenyl)maleic acid amide, N-(sulfamoylphenyl)maleic acid amide, N-(phenylsulfonyl) maleic acid amide, N-(tolylsulfonyl)maleic acid amide, N,N-dimethylmaleic acid amide, N-methyl-N-phenylmaleic acid amide, N-hydroxyethyl-N-methylmaleic acid amide, N-methylmaleic acid monoamide, N-ethylmaleic acid monoamide, N,N-dimethylmaleic acid monoamide, N-methyl-N'-ethylmaleic acid amide and N-methyl-N'-phenylmaleic acid amide.

Specific examples of the maleic acid imides include maleic acid imide, N-methylmaleic acid imide, N-ethylmaleic acid imide, N-(n- or i-)propylmaleic acid imide, N-(n-, i-, sec- or tert-)butylmaleic acid imide, N-benzylmaleic acid imide, N-hydroxyethylmaleic acid imide, N-phenylmaleic acid imide, N-tolylmaleic acid imide, N-(hydroxyphenyl)maleic acid imide, N-(sulfamoylphenyl)maleic acid imide, N-(phenylsulfonyl) maleic acid imide and N-(tolylsulfonyl)maleic acid imide.

Specific examples of the itaconic acid esters include dimethyl itaconate, diethyl itaconate, di(n- or i-)propyl itaconate, di(n-, i-, sec- or tert-)butyl itaconate, diphenyl itaconate, diallyl itaconate, monomethyl itaconate, monoethyl itaconate, mono(n- or i-)propyl itaconate, mono(n-, i-, sec- or tert-)butyl itaconate, dibenzyl itaconate, monobenzyl itaconate, methyl ethyl itaconate, methyl propyl itaconate and ethyl propyl itaconate.

Specific examples of the itaconic acid amides include itaconic acid amide, N-methylitaconic acid amide, N-ethylitaconic acid amide, N-(n- or i-)propylitaconic acid amide, N-(n-, i-, sec- or tert-)butylitaconic acid amide, N-benzylitaconic acid amide, N-hydroxyethylitaconic acid amide, N-phenylitaconic acid amide, N-tolylitaconic acid amide, N-(hydroxyphenyl)itaconic acid amide, N-(sulfamoylphenyl)itaconic acid amide, N-(phenylsulfonyl)itaconic acid amide, N-(tolylsulfonyl)itaconic acid amide, N,N-dimethylitaconic acid amide, N-methyl-N-phenylitaconic acid amide, N-hydroxyethyl-N-methylitaconic acid amide, N-methylitaconic acid monoamide, N-ethylitaconic acid monoamide, N,N-dimethylitaconic acid monoamide, N-methyl-N'-ethylitaconic acid amide and N-methyl-N'-phenylitaconic acid amide.

Specific examples of the itaconic acid imides include itaconic acid imide, N-methylitaconic acid imide, N-ethylitaconic acid imide, N-(n- or i-)propylitaconic acid imide, N-(n-, i-, sec- or tert-)butylitaconic acid imide, N-benzylitaconic acid imide, N-hydroxyethylitaconic acid imide, N-phenylitaconic acid imide, N-tolylitaconic acid imide, N-(hydroxyphenyl)itaconic acid imide, N-(sulfamoylphenyl)itaconic acid imide, N-(phenylsulfonyl)itaconic acid imide and N-(tolylsulfonyl)itaconic acid imide.

Specific examples of the fumaric acid esters include dimethyl fumarate, diethyl fumarate, di(n- or i-)propyl fumarate, di(n-, i-, sec- or tert-)butyl fumarate, diphenyl fumarate, diallyl fumarate, monomethyl fumarate, monoethyl fumarate, mono(n- or i-)propyl fumarate, mono(n-, i-, sec- or tert-)butyl fumarate, dibenzyl fumarate, monobenzyl fumarate, methyl ethyl fumarate, methyl propyl fumarate and ethyl propyl fumarate.

Specific examples of the fumaric acid amides include fumaric acid amide, N-methylfumaric acid amide, N-ethylfumaric acid amide, N-(n- or i-)propylfumaric acid amide, N-(n-, i-, sec- or tert-)butylfumaric acid amide, N-benzylfumaric acid amide, N-hydroxyethylfumaric acid amide, N-phenylfumaric acid amide, N-tolylfumaric acid amide, N-(hydroxyphenyl)fumaric acid amide, N-(sulfamoylphenyl)fumaric acid amide, N-(phenylsulfonyl)fumaric acid amide, N-(tolylsulfonyl)fumaric acid amide, N,N-dimethylfumaric acid amide, N-methyl-N-phenylfumaric acid amide, N-hydroxyethyl-N-methylfumaric acid amide, N-methylfumaric acid monoamide, N-ethylfumaric acid monoamide, N,N-dimethylfumaric acid monoamide, N-methyl-N'-ethylfumaric acid amide and N-methyl-N'-phenylfumaric acid amide.

Specific examples of the mesaconic acid esters include dimethyl mesaconate, diethyl mesaconate, di(n- or i-)propyl mesaconate, di(n-, i-, sec- or tert-)butyl mesaconate, diphenyl mesaconate, diallyl mesaconate, monomethyl mesaconate, monoethyl mesaconate, mono(n- or i-)propyl mesaconate, mono(n-, i-, sec- or tert-)butyl mesaconate, dibenzyl mesaconate, monobenzyl mesaconate, methyl ethyl mesaconate, methyl propyl mesaconate and ethyl propyl mesaconate.

Specific examples of the mesaconic acid amides include mesaconic acid amide, N-methylmesaconic acid amide, N-ethylmesaconic acid amide, N-(n- or i-)propylmesaconic acid amide, N-(n-, i-, sec- or tert-)butylmesaconic acid amide, N-benzylmesaconic acid amide, N-hydroxyethylmesaconic acid amide, N-phenylmesaconic acid amide, N-tolylmesaconic acid amide, N-(hydroxyphenyl) mesaconic acid amide, N-(sulfamoylphenyl)mesaconic acid amide, N-(phenylsulfonyl)mesaconic acid amide, N-(tolylsulfonyl)mesaconic acid amide, N,N-dimethylmesaconic acid amide, N-methyl-N-phenylmesaconic acid amide, N-hydroxyethyl-N-methyl-mesaconic acid amide, N-methylmesaconic acid monoamide, N-ethylmesaconic acid monoamide, N,N-dimethylmesaconic acid monoamide, N-methyl-N'-ethylmesaconic acid amide and N-methyl-N'-phenylmesaconic acid amide.

Specific examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene and sodium 4-vinylbenzene sulfonate.

Specific examples of the α,β-unsaturated lactones include the following compounds.

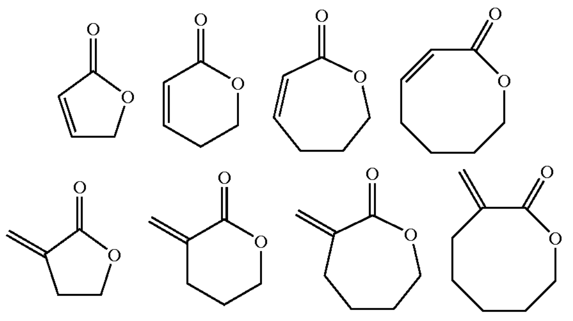

-continued

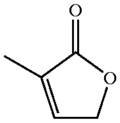
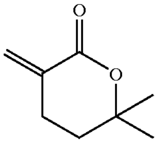
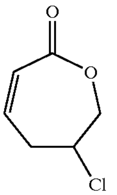
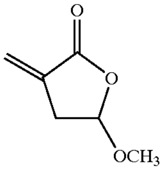
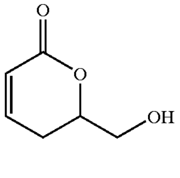
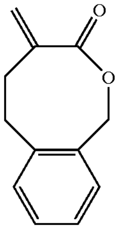
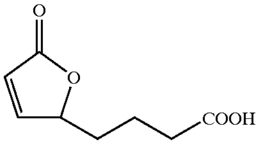
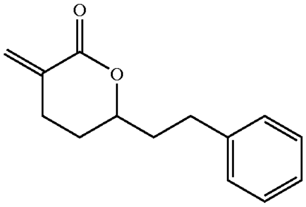
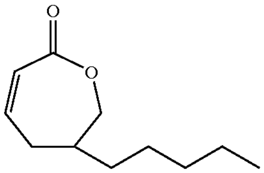
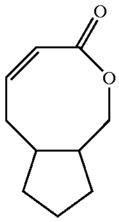

Specific examples of the α,β-unsaturated lactams include the following compounds.

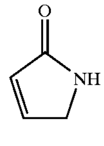
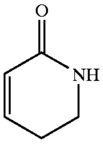
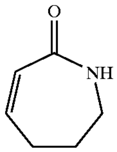
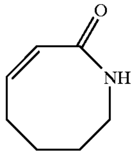
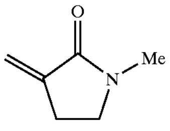
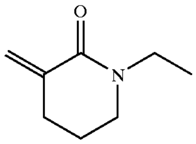
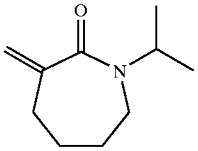
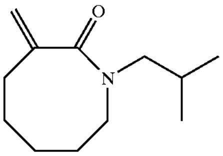
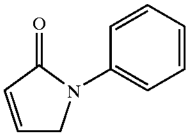
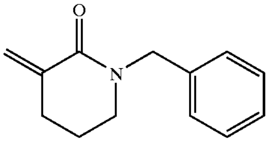

-continued

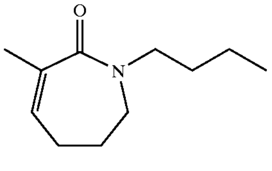
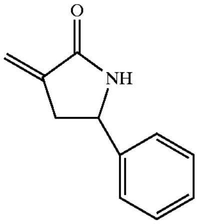
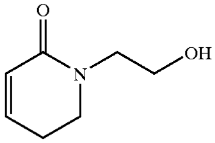
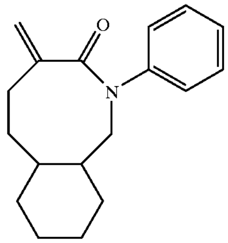
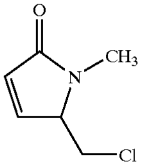
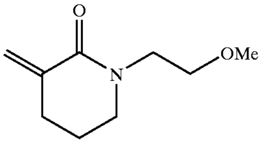
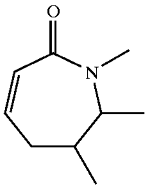
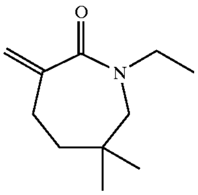
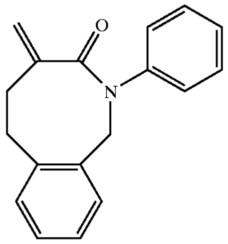

Specific examples of the unsaturated hydrocarbons include the compounds described above.

Specific examples of the vinyl ethers include the compounds described above.

Specific examples of the vinyl esters include the compounds described above.

Specific examples of the α,β-unsaturated ketones include the compounds described above.

The ratio of the monomer having a hydrophobic functional group capable of becoming hydrophilic by heat used in the synthesis of the positive polar conversion polymer compound for use in the present invention, is preferably 5 wt % or more, more preferably from 10 to 95 wt %. If the ratio of this monomer is less than 5 wt %, even if the hydrophobic functional group on the side chain becomes hydrophilic, the positive polar conversion polymer compound does not become hydrophilic, as a result, the non-image area is scummed. In the case of using the above-described other monomer in the synthesis of the positive polar conversion polymer compound for use in the present invention, the copolymerizable other monomer may be used in any ratio as long as the monomer having the specific functional group is used in a preferred ratio. The copolymerizable other monomers may be used either individually or in combination of two or more thereof.

Specific examples of the positive polar conversion polymer compound for use in the present invention are set forth below, however, the present invention is by no means limited thereto.
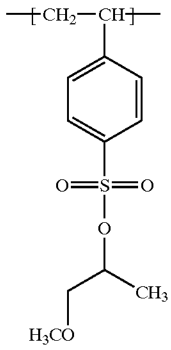
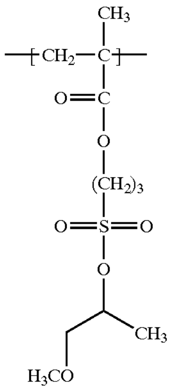
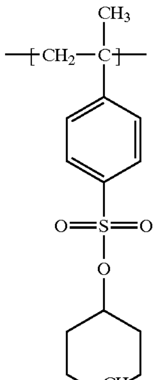
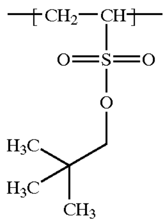
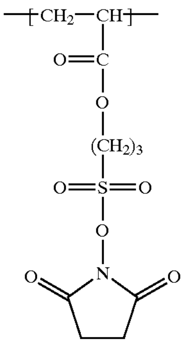
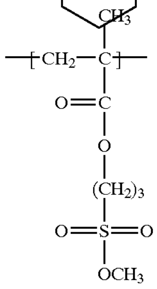
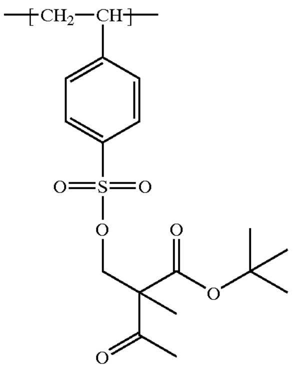
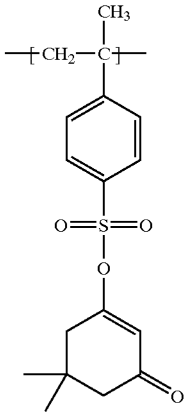
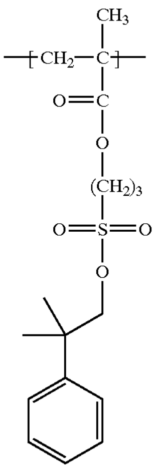
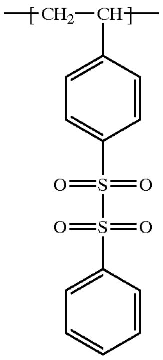
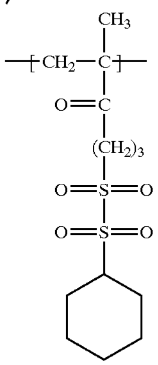
-continued
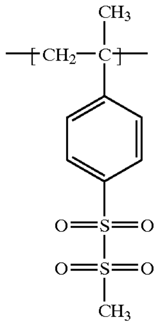
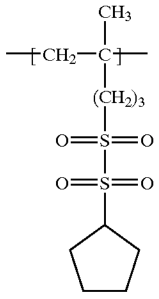
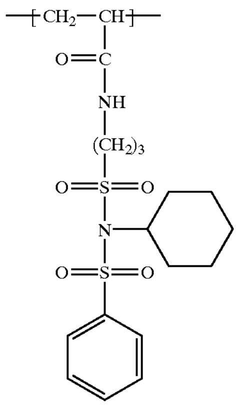
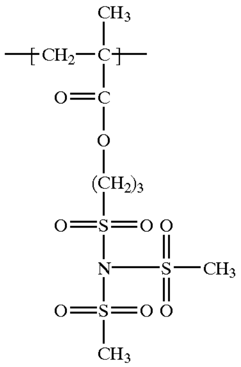
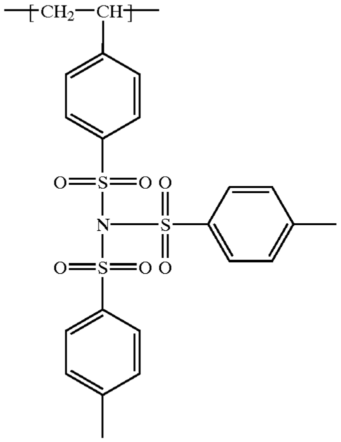
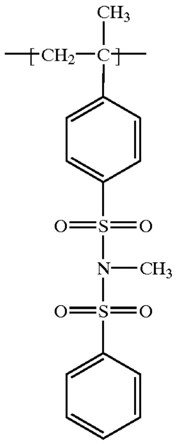
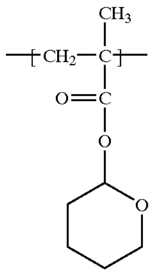
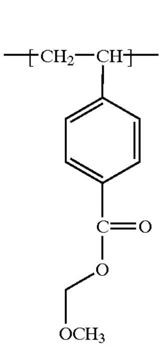
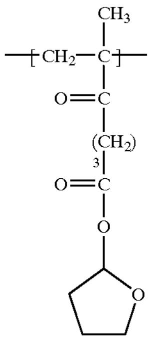

-continued

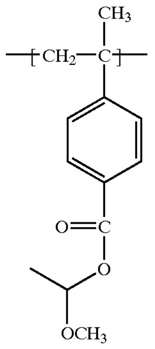

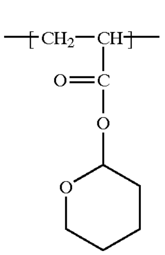

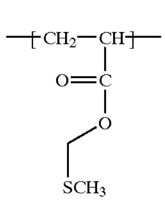

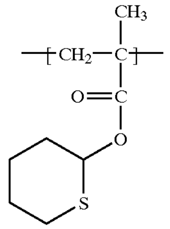

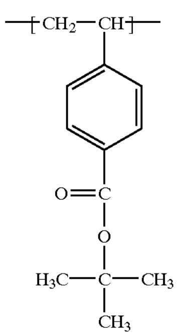

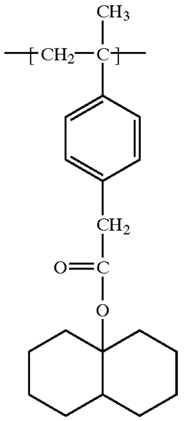

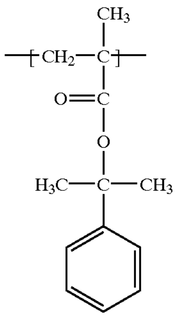

The positive polar conversion polymer compound for use in the lithographic printing original plate of the present invention preferably has a weight average molecular weight measured by GPC of 2,000 or more, more preferably from 5,000 to 300,000, and preferably has a number average molecular weight of 800 or more, more preferably from 1,000 to 250,000. The polydispersion degree (weight average molecular weight/number average molecular weight) is preferably 1 or more, preferably from 1.1 to 10.

The positive polar conversion polymer compound may be any of a random polymer, a block polymer and a graft polymer but is preferably a random polymer.

Examples of the solvent used in the synthesis of the positive polar conversion polymer compound for use in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide and water. These solvents may be used either individually or in combination of two or more thereof.

As the radical polymerization initiator used in the synthesis of the positive polar conversion polymer compound for use in the present invention, known compounds such as azo-based initiator and peroxide initiator may be used.

In the case where the above-described positive polar conversion polymer compound is contained in the layer containing a positive polar conversion polymer compound, a sole positive polar conversion polymer compound may be used or a mixture of two or more positive polar conversion polymer compounds may be used.

The ratio of positive polar conversion polymer compound contained in the layer containing a positive polar conversion polymer compound is preferably 40 wt % or more, more preferably 50 wt % or more. if the added amount is less than 40 wt %, the image strength decreases and the press life becomes low.

The constituent components other than the positive polar conversion polymer compound, which can be contained in the layer containing a positive polar conversion polymer compound, are described below.

Light-Heat Converting Agent

Light-heat converting agents described later may be suitably used as the light-heat converting agent added to the ink-receptive layer (Layer B) containing a positive polar conversion polymer compound for use in the present invention.

Acid-Generating Agent

Acid-generating agents described later may be suitably used as the acid-generating agent added to the ink-receptive layer containing a positive polar conversion polymer compound for use in the present invention.

Sensitizing Dye

Sensitizing dyes described later may be suitably used as the sensitizing dye added to the ink-receptive layer containing a positive polar conversion polymer compound for use in the present invention.

Surface Active Agent

Surface active agents described later may be suitably used as the surface active agent added to the ink-receptive layer containing a positive polar conversion polymer compound for use in the present invention.

Other Constituent Components

The ink-receptive layer containing a positive polar conversion polymer compound for use in the present invention may further contain various additives, if desired. For example, an onium salt, an aromatic sulfone compound, an aromatic sulfonic acid ester compound or the like act is preferably added because the salt or compound acts as a thermally decomposing substance and improves the effect of inhibiting dissolution of the image area in a developer.

Examples of the onium salt include diazonium salts, ammonium salts, phosphonium salts, iodonium salts, sulfonium salts, selenonium salts and arsonium salts. Suitable examples of the onium salt for use in the present invention include diazonium salts described in S. I. Schlesinger, *Photogr. Sci. Eng.*, 18, 387 (1974), T. S. Bal et al., *Polymer*, 21, 423 (1980) and JP-A-5-158230, ammonium salts described in U.S. Pat. Nos. 4,069,055 and 4,069,056 and JP-A-3-140140, phosphonium salts described in D. C. Necker et al., *Macromolecules*, 17, 2468 (1984), C. S. Wen et al., *The. Proc. Conf. Rad. Curing, ASIA, Tokyo, Oct*., p. 478 (1988), and U.S. Pat. Nos. 4,069,055 and 4,069,056, iodonium salts described in J. V. Crivello et al., *Macromolecules*, 10(6), 1307 (1977), *Chem. & Eng. News*, Nov. 28, p. 31 (1988), European Patent No. 104,143, U.S. Pat. Nos. 339,049 and 410,201, JP-A-2-150848 and JP-A-2-296514, sulfonium salts described in J. V. Crivello et al., *Polymer J*., 17, 73 (1985), J. V. Crivello et al., *J. Org. Chem*., 43, 3055 (1978), W. R. Watt et al., *J. Polymer Sci*., Polymer Chem. Ed., 22, 1789 (1984), J. V. Crivello et al., *Polymer Bull*., 14, 279 (1985), J. V. Crivello et al., *Macromolecules*, 14(5), 1141 (1981), J. V. Crivello et al., *J. Polymer Sci*., Polymer Chem. Ed., 17, 2877 (1979), European Patent Nos. 370,693, 233,567, 297,443 and 297,442, U.S. Pat. Nos. 4,933,377, 3,902,114, 410,201, 339,049, 4,760,013, 4,734,444 and 2,833,827, and German Patent Nos. 2,904,626, 3,604,580 and 3,604,581, selenonium salts described in J. V. Crivello et al., *Macromolecules*, 10(6), 1307 (1977), J. V. Crivello et al., *J. Polymer Sci*., and Polymer Chemich., 17, 1047 (1979), and arsonium salts described in C. S. Wen et al., *The, Proc., Conf. Rad. Curing ASIA, Tokyo, Oct*., p. 478 (1988).

Suitable examples of the counter anion to the onium salt include boron tetrafluoride, phosphorus hexafluoride, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid and p-toluenesulfonic acid. Among these, phosphorus hexafluoride, triisopropylnaphthalenesulfonic acid and alkyl aromatic sulfonic acid such as 2,5-dimethylbenzenesulfonic acid are more preferred.

The amount of the onium salt added as an additive is preferably from 1 to 50 wt %, more preferably from 5 to 30 wt %, still more preferably from 10 to 30 wt %. In the present invention, the additive and the binder are preferably incorporated into the same layer.

For the purpose of further improving the sensitivity, a cyclic acid anhydride, a phenol or an organic acid may also be used in combination. Examples of the cyclic acid anhydrides which can be used include phthalic acid anhydride, tetrahydrophthalic acid anhydride, hexahydrophthalic anhydride, 3,6-endoxy-$\Delta^4$-tetrahydrophthalic acid anhydride, tetrachlorophthalic anhydride, maleic acid anhydride, chloromaleic acid anhydride, α-phenylmaleic acid anhydride, succinic acid anhydride and pyrcmellitic acid anhydride, described in U.S. Pat. No. 4,115,128. Examples of the phenols include bisphenol A, p-nitrophenol, p-ethoxyphenol, 2,4',4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Examples of the organic acids include sulfronic acids, sulfinic acids, alkylsulfuric acids, phosphonic acids, phosphoric acid esters and carboxylic acids, described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 4-cylohexene-1,2-dicarboxylic acid, erucic acid, lauric acid, n-undecanoic acid and ascorbic acid.

The ratio of the cyclic acid anhydride, phenol or organic acid occupying the ink-receptive layer is preferably from 0.05 to 20 wt %, more preferably from 0.1 to 15 wt %, still more preferably from 0.1 to 10 wt %.

The ink-receptive layer containing a positive polar conversion polymer compound for use in the present invention may contain a printing out agent for obtaining a visible image immediately after the heating by exposure or a dye or pigment as an image coloring agent.

A representative example of the printing out agent is a combination of a compound capable of releasing an acid by the heat on exposure (photoacid releasing agent) and an organic dye capable of forming a salt. Specific examples thereof include a combination of o-naphthoquinonediazide-4-sulfonic acid halogenide and a salt-forming organic dye described in JP-A-50-36209 and JP-A-53-8128, and a combination of a trihalomethyl compound and a salt-forming organic dye described in JP-A-53-36223, JP-A-54-74728, JP-A-60-3626, JP-A-61-143748, JP-A-61-151644 and JP-A-63-58440. The trihalomethyl compound includes an oxazole-based compound and a triazine-based compound. Either compound has excellent aging stability and gives a sharp printed image.

As the image coloring agent, dyes other than the above-described salt-forming organic dyes may be used. Suitable dyes including the salt-forming organic dye are an oil-soluble dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Kagaku Kogyo K.K.), Victoria Pure Blue, Crystal Violet (CI42555), Methyl Violet (CI42535), Ethyl Violet, Rhodamine B (CI45170B), Malachite Green (CI42000) and Methylene Blue (CI52015). Dyes described in JP-A-62-293247 are more preferred. The dye may be added to the ink-receiving layer in a ratio of from 0.01 to 10 wt %, preferably from 0.1 to 3 wt %.

The ink-receiving layer for use in the present invention may further contain, if desired, a plasticizer for imparting flexibility to the coating film. Examples thereof include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of an acrylic acid or methacrylic acid.

In addition, an epoxy compound, a vinyl ether, a phenol compound having a hydroxymethyl group and a phenol compound having an alkoxymethyl group described in JP-A-8-276558, and a dissolution inhibition increasing cross-linking agent described in JP-A-11-160860 previously filed by the present inventors, may be appropriately added according to the purpose.

Layer Containing Alkali Aqueous Solution-Soluble Resin

The "layer containing an aqueous alkali solution-soluble resin" for use in the lithographic printing original plate of the present invention means a layer containing at least an aqueous alkali solution-soluble resin described below.

Alkali Aqueous Solution-Soluble Resin

The "alkali water-soluble polymer compound (b) for use in the present invention indicates those having the following acid radical structure on the main chain or side chain of a polymer compound:

phenolic hydroxyl group (—Ar—OH), carboxylic acid group (—$CO_2H$), sulfonic acid group (—$SO_3H$), phosphoric acid group (—$OPO_3H$), sulfonamido group (—$SO_2NH$—R) and substituted sulfonamide-based acid group (active imide group) (—$SO_2NHCOR$, —$SO_2NHSO_2R$, —$CONHSO_2R$).

In these formulae, Ar represents a dihydric aryl group which may have a substituent, and R represents a hydrocarbon group which may have a substituent.

Among these, preferred acid radicals are (b-1) phenolic hydroxyl group, (b-2) sulfonamide group and (b-3) active imide group. In particular, an aqueous alkali solution-soluble resin having (b-1) a phenolic hydroxyl group (hereinafter referred to as "a resin having a phenolic hydroxyl group") is most preferred.

Examples of the polymer compound having (b-1) a phenolic hydroxyl group include novolak resins such as a condensed polymer of phenol with formaldehyde (hereinafter referred to as "phenol formaldehyde resin"), a condensed polymer of m-cresol with formaldehyde (hereinafter referred to as "m-cresol formaldehyde resin"), a condensed polymer of p-cresol with formaldehyde, a condensed polymer of m,p-mixed cresol with formaldehyde, and a condensed polymer of phenol, cresol (any of m-cresol, p-cresol and m,p-cresol) and formaldehyde, and condensed polymers of pyrogallol and acetone. Also, a copolymer obtained by copolymerizing a monomer having a phenol group on the side chain may be used. Examples of the monomer having a phenol group include acrylamide, methacrylamide, acrylic acid ester, methacrylic acid ester and hydroxystyrene each having a phenol group.

Specific examples of the monomer which can be suitably used include N-(2-hydroxyphenyl)acrylamide, N-(3-hydroxyphenyl)acrylamide, N-(4-hydroxyphenyl) acrylamide, N-(2-hydroxyphenyl)methacrylamide, N-(3-hydroxyphenyl), methacrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate and 2-(4-hydroxyphenyl)ethyl methacrylate.

In view of the image forming property, the polymer preferably has a weight average molecular weight of from $5.0\times10^2$ to $2.0\times10^4$ and a number average molecular weight of from $2.0\times10^2$ to $1.0\times10^4$. These resins may be used either individually or in combination of two or more thereof. In the case of using a combination of resins, a condensed polymer of phenol having an alkyl croup having from 3 to 8 carbon atoms as a substituent with formaldehyde may be used in combination, such as a condensed polymer of tert-butylphenol with formaldehyde and a condensed polymer of octylphenol with formaldehyde described in U.S. Pat. No. 4,123,279.

The resin having a phenolic hydroxyl group preferably has a weight average molecular weight of from 500 to 20,000 and a number average molecular weight of from 200 to 10,000.

Examples of the alkali water-soluble polymer compound having (b-2) a sulfonamide group include polymer compounds obtained by the homopolymerizatlon of a polymerizable monomer having (b-2) a sulfonamide group, which is a main monomer constituting the polymer compound, or by the copolymerization of this monomer with another polymerizable monomer. Examples of the polymerizable monomer having a sulfonamide group include monomers comprising a low molecular compound having one or more sulfonamide group containing at least one hydrogen atom on the nitrogen atom (—NH—$SO_2$—) and one or more polymerizable unsaturated bond. Among these, monomers comprising a low molecular compound having an acryloyl group, an allyl group or a vinyloxy group, and a substituted or mono-substituted aminosulfonyl group or a substituted sulfonylimino group are preferred.

Examples of the compound include the compounds represented by the following formulae (6) to (10).

(6)

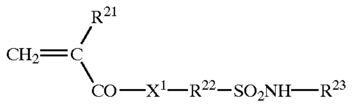

(7)

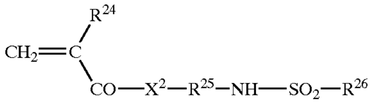

(8)

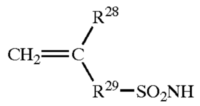

(9)

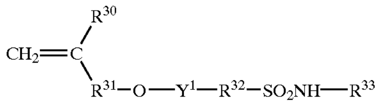

(10)

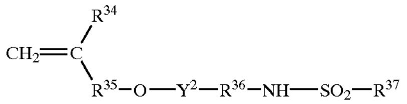

wherein $X^1$ and $X^2$ each represents —O— or —$NR^{27}$—, $R^{21}$ and $R^{24}$ each represents hydrogen atom or —$CH_3$, $R^{22}$, $R^{25}$, $R^{29}$, $R^{32}$ and $R^{36}$ each represents an alkylene group having from 1 to 12 carbon atoms, which may have a substituent, a cycloalkylene group which may have a substituent, an arylene group which may have a substituent or an aralkylene group which may have a substituent, $R^{23}$, $R^{27}$ and $R^{33}$ each represents a hydrogen atom, an alkyl group having from 1 to 12 carbon atoms, which may have a substituent, a cycloalkyl group which may have a substituent, an aryl group which may have a substituent or an aralkyl group which may have a substituent, $R^{26}$ and $R^{37}$ each represents an alkyl group having from 1 to 12 carbon atoms, which may have a substituent, a cycloalkyl group which may have a substituent, an aryl group which may have a substituent or an aralkyl group which may have a substituent, $R^{28}$, $R^{30}$ and $R^{34}$ each represents a hydrogen atom or —$CH_3$, $R^{31}$ and $R^{35}$ each represents a single bond, an alkylene group having from 1 to 12 carbon atoms, which may have a substituent, a cycioalkylene group which may have a substituent, an arylene group which may have a substituent or an aralkylene group which may have a substituent, and $Y^1$ and $Y^2$ each represents a single bond or —CO—.

Specific examples of this compound, which can be suitably used, include m-aminosulfonylphenyl methacrylate, N-(p-aminosulfonylphenyl)methacrylamide and N-(p-aminosulfonylphenyl)acrylamide.

The alkali water-soluble polymer compound having (b-3) an active imide group is a compound having an active imide group represented by the following formula within the molecule. Examples of the compound include polymer compounds obtained by copolymerizing the monomer having (b-3) an active imide group, which is the main monomer constituting the polymer compound and which is a monomer comprising one or more active imide group represented by the following formula and one or more polymerizable unsaturated bond within one molecule.

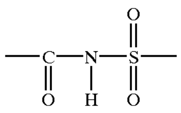

Specific examples of this compound, which can be suitably used, include N-(p-toluenesulfonyl)methacrylamide and N-(p-toluenesulfonyl)acrylamide.

The alkali water-soluble copolymer for use in the present invention is not limited to those obtained by copolymerizing one monomer having an acidic group (b-1) (b-2) or (b-3) but those obtained by copolymerizing two or more monomers having the same acidic group or two or more monomers having different acidic groups may also be used.

The copolymerization may be performed by using a conventionally known method such as graft copolymerization, block copolymerization and random copolymerization.

The copolymer preferably contains 10 mol % or more, more preferably 20 mol % or more, of the monomer having an acidic group (b-1), (b-2) or (b-3) as the copolymerizing component. If the copolymerizing component is less than 10 mol %, the interaction with the resin having a phenolic hydroxyl group insufficiently proceeds and the effect of improving the development latitude, which is advantageously brought out by the use of the copolymerizing component, cannot be obtained satisfactorily.

The copolymer may contain other copolymerizing component in addition to the monomer having an acidic group (b-1), (b-2) or (b-3).

Examples of the monomer which can be used as the other copolymerizing component include the following monomers (1) to (12):

(1) acrylic acid esters and methacrylic acid esters, having an aliphatic hydroxyl group, such as 2-hydroxyethyl acrylate and 2-hydroxyethyl methacrylate;

(2) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate;

(3) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate;

(4) acrylamides and methacrylamides, such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;

(5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) vinyl esters such as vinyl acetate, vinyl chloroacetate, vinyl butyrate and vinyl benzoate;

(7) styrenes such as styrene, α-methylstyrene, methylstyrene and chloromethylstyrene;

(8) vinyl ketones such as methyl vinyl ketone, ethyl vinyl ketone, propyl vinyl ketone and phenyl vinyl ketone;

(9) olefins such as ethylene, propylene, isobutylene, butadiene and isoprene;

(10) N-vinylpyrrolidone, N-vinylcarbazole, 4-vinylpyridine, acrylonitrile and methacrylonitrile;

(11) unsaturated imides such as maleimide, N-acryloylacrylamide, N-acetylmethacrylamide, N-propionylmethacrylamide and N-(p-chlorobenzoyl) methacrylamide; and

(12) unsaturated carboxylic acids such as acrylic acid, methacrylic acid, maleic acid anhydride and itaconic acid.

In view of the layer strength, the alkali water-soluble polymer compound for use in the present invention preferably has, irrespective of homopolymer or copolymer, a weight average molecular weight of 2,000 or more and a number average molecular weight of 500 or more. The alkali water-soluble polymer compound more preferably has a weight average molecular weight of from 5,000 to 300,000, a number average molecular weight of from 800 to 250,000, and a dispersion degree (weight average molecular weight/number average molecular weight) of from 1.1 to 10.

In the copolymer, the weight ratio of the monomer having an acidic group (b-1), (b-2) or (b-3) to the other monomer blended is preferably from 50:50 to 5:95, more preferably from 40:60 to 10:90, in view of the development latitude.

These alkali water-soluble polymer compounds may be used either individually or in combination of two or more thereof. The alkali water-soluble polymer compound is added in an amount of from 30 to 99 wt %, preferably from 40 to 95 wt %, more preferably from 50 to 90 wt %, based on the all solids content of the recording layer. If the amount of alkali-soluble polymer compound added is less than 30 wt %, the recording layer is deteriorated in the durability, whereas if it exceeds 99 wt %, disadvantageous results come out both in the sensitivity and the durability.

The constituent components other than the aqueous alkali solution-soluble resin, which can be contained in the layer containing an aqueous alkali solution-soluble resin are described below.

Light-Heat Converting Agent

Light-heat converting agents described later may be suitably used as the light-heat converting agent added to the layer containing an aqueous alkali solution-soluble resin for use in the present invention.

Surface Active Agent

Surface active agents described later may be suitably used as the surface active agent added to the layer containing an aqueous alkali solution-soluble resin for use in the present invention.

Other Constituent Components

As the constituent components other than those described above, which can be added to the layer containing an aqueous alkali solution-soluble resin for use in the present invention, the same components as the other constituent components which can be added to the layer containing a positive polar conversion polymer compound may be suitably used.

Layer Containing Negative Polar Conversion Polymer Compound

The "layer containing a negative polar conversion polymer compound" for use in the lithographic printing original plate of the present invention means a layer containing at least a negative polar conversion polymer compound described below.

Negative Polar Conversion Polymer Compound

The negative polar conversion polymer compound for use in the present invention is, as described above, a hydrophilic polymer compound capable of becoming hydrophobic by heat. Examples of such a polymer compound include a hydrophilic polymer compound having on the side chain thereof a hydrophilic functional group capable of becoming hydrophobic by heat. This change must be on such a degree that when a polymer compound which exhibits hydrophilicity at an ordinary temperature, for example, dissolve in or swell with water, is applied with heat due to light-heat conversion after the laser exposure, a part or all of polar conversion functional groups on the side chain of the compound are changed by heat, as a result, the compound does not exhibit hydrophilicity, for example, does not dissolve in or swells with water.

With respect to the process of the hydrophilic functional group on the side chain of a hydrophilic polymer compound becoming hydrophobic by heat, two processes may be considered. One is a process where the originally hydrophilic functional group on the side chain causes reaction by heat and thereby becomes hydrophobic, and another is a process where the originally hydrophilic functional group on the side chain decomposes by heat to lose the hydrophilic functional group and thereby becomes hydrophobic.

As the former process of the hydrophilic group becoming hydrophobic as a result of reaction by heat, a process where the hydrophilic functional group reacts with another functional group within the polymer due to heat and becomes hydrophobic and a process where the hydrophilic functional group reacts with another compound outside the polymer due to heat and becomes hydrophobic may be considered. The functional group may become hydrophobic through a combination of these two kinds of processes.

Among the above-described processes, in view of reactivity, a process where the originally hydrophilic functional group on the side chain decomposes due to heat to lose the hydrophobic functional group and thereby becomes hydrophobic is preferred.

In the present invention, it is preferred that all polar conversion functional groups on the side chain of the polar conversion polymer compound become hydrophobic, however, this is not particularly limited and not all of the hydrophilic functional groups are necessary to become hydrophobic as long as the polar conversion polymer compound is changed and does not exhibit hydrophilicity, for example, does not dissolve in or swell with water.

Among these hydrophilic functional groups capable of becoming hydrophobic by heat, in view of reactivity, storage stability and discrimination between hydrophilicity and hydrophobicity, the functional group is particularly preferably a carboxylic acid group or a carboxylate group represented by the following formula (11) or (12).

(11)

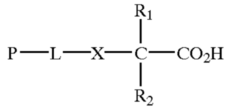

(12)

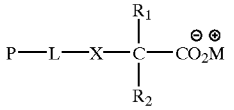

(wherein X represents an element of Groups 4 to 6 in the periodic table or an oxide, sulfide, selenide or telluride thereof, P represents a polymer main chain, —L— represents a divalent linking group, $R_1$ and $R_2$, which may be the same or different, each represents a monovalent group, and M represents an alkali metal, an alkaline earth metal or an onium).

$R_1$ and $R_2$ each is preferably a linear, branched or cyclic alkyl group having from 1 to 20 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and 2-norbornyl group. Among these, a linear alkyl group having from 1 to 12 carbon atoms, a branched alkyl group having from 3 to 12 carbon atoms, and a cyclic alkyl group having from 5 to 10 carbon atoms are more preferred. These alkyl groups may have a substituent.

The substituent of the above alkyl group is a monovalent nonmetallic atom group exclusive of hydrogen. Preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter referred to as a phosphonato group), a dialkylphosphono group ($—PO_3(alkyl)_2$, a diarylphosphono group ($—PO_3(aryl)_2$), an alkylarylphosphono group ($—PO_3(alkyl)(aryl)$), a monoalkylphosphono group ($—PO_3H(alkyl)$) and a conjugate base group thereof (hereinafter referred to as an alkylphosphonato group), a monoarylphosphono group ($—PO_3H(aryl)$) and a conjugate base group thereof (hereinafter referred to as an arylphosphonato group), a phosphonooxy group ($—OPO_3H_2$) and a conjugate base group thereof (hereinafter referred to as a phosphonatooxy group), a dialkylphosphonooxy group ($—OPO_3(alkyl)_2$), a diarylphosphonooxy group ($—OPO_3(aryl)_2$), an alkylarylphosphonooxy group ($—OPO_3(alkyl)(aryl)$), a monoalkylphosphonooxy group ($—OPO_3H(alkyl)$) and a conjugate base group thereof (hereinafter referred to as an alkylphosphonatooxy group), a monoarylphosphonooxy group ($—OPO_3H(aryl)$) and a conjugate base group thereof (hereinafter referred to as an arylphosphonatooxy group), a cyano group, a nitro group, an aryl group, an alkenyl group and an alkynyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group. Examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group.

$G^1$ in the acyl group ($G^1CO—$) includes a hydrogen atom and the above-described alkyl and aryl groups. Among these substituents, more preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group.

The alkylene group in the substituted alkyl group is a divalent organic residue resulting from releasing any one of hydrogen atoms on the above-described alkyl group having from 1 to 20 carbon atoms, preferably a linear alkylene group having from 1 to 12 carbon atoms, a branched alkylene group having from 3 to 12 carbon atoms or a cyclic alkylene group having from 5 to 10 carbon atoms.

Specific preferred examples of the substituted alkyl group obtained by combining the above-described substituent and the alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group includes a condensed ring formed from 1 to 3 benzene rings and a condensed ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among these, a phenyl group and a naphthyl group are more preferred. In addition to these carbocyclic aryl groups, the aryl group include a heterocyclic aryl group. Examples of the heterocyclic aryl group include a pyridyl group, a furyl group and a benzene ring-condensed aryl group containing from 3 to 20 carbon atoms and from 1 to 5 hetero atoms, such as quinolyl group, benzofuryl group, thioxanthone group and carbazole group.

The substituted aryl group includes the above-described aryl groups having on the ring-forming carbon atoms thereof a monovalent nonmetallic atom group exclusive of hydrogen as a substituent. Preferred examples of the substituent include the above-described alkyl groups, substituted alkyl groups and substituents of the substituted alkyl group. Specific preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethylphenyl group, 2-butenyl group, a 2-methylallylphenyl group, a 2-methylpropenylphenyl group, a 2-propenylphenyl group, a 2-butynylphenyl group and a 3-butynylphenyl group.

Specific preferred examples of —X— include —O—, —S—, —Se—, $—NR_3—$, —CO—, —SO—, $—SO_2—$ and —PO—. Among these, in view of thermal reactivity, —CO—, —SO— and $—SO_2—$ are more preferred.

Specific preferred examples of $R_3$ may be the same or different with $R_1$ or $R_2$ and may be selected from specific examples of $R_1$ and $R_2$.

The polyvalent linking group comprising a nonmetallic atom, represented by L, is constituted by from 1 to 60 carbon atoms, from 0 to 10 nitrogen atoms, from 0 to 50 oxygen atoms, from 1 to 100 hydrogen atoms and from 0 to 20 sulfur atoms. Specific examples of the linking group include those constituted by combining the following structural units.

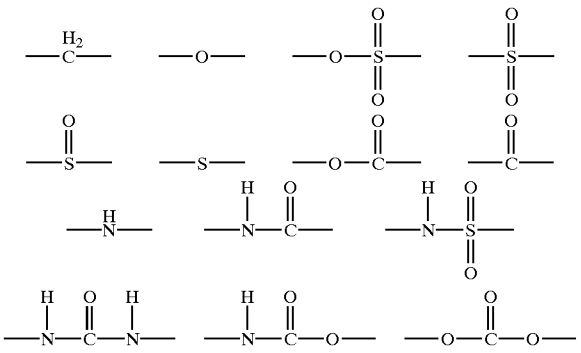

-continued

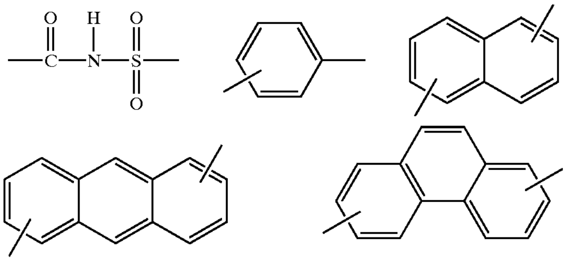

M is not particularly limited as long as it is cation, however, M is preferably a mono-, di-, tri- or tetravalent metal cation or an ammonium salt represented by the following formula (13):

(13)

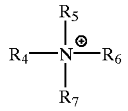

(wherein $R_4$, $R_5$, $R_6$ and $R_7$, which may be the same or different, each represents a monovalent group).

Examples of the mono-, di-, tri- or tetravalent metal cation represented by M include $Li^+$, $Na^+$, $K^+$, $Rb^+$, $Cs^+$, $Fr^+$, $Be^{2+}$, $Mg^{2+}$, $Ca^{2+}$, $Sr^{2+}$, $Ba^{2+}$, $Ra^{2+}$, $Cu^+$, $Cu^{2+}$, $Ag^+$, $Zn^{2+}$, $Al^{3+}$, $Fe^{2+}$, $Fe^{3+}$, $Co^{2+}$, $Ni^{2+}$, $Ti^{4+}$ and $Zr^{4+}$. Among these, $Li^+$, $Na^+$, $K^+$, $Rb^+$, $Cs^+$, $Fr^+$, $Cu^+$ and $Ag^+$.

In the ammonium ion represented by formula (13), specific examples of the groups represented by $R_4$ to $R_7$ include the same groups described above for $R_1$ to $R_3$. Specific examples of the ammonium ion represented by formula (13) are set forth below.

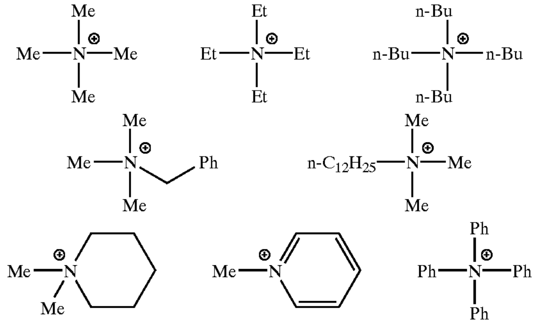

The polymer main chain represented by P is at least one selected from the group consisting of partial structural monomers represented by the following formulae:

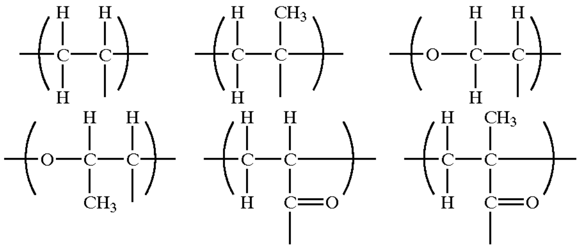

-continued

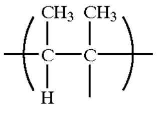 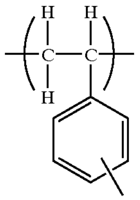 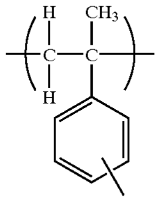

The polymer having at least one group selected from group consisting of a carboxylic acid group and a carboxylate group for use in the present invention may be a homopolymer of only one monomer or may be a copolymer of two or more monomers. A copolymer with other monomer may also be used.

Examples of the other monomer which can be used include known monomers such as acrylic acid esters, methacrylic acid esters, acrylamides, methacrylamides, vinyl esters, styrenes, acrylic acid, methacrylic acid, acrylonitrile, maleic acid anhydride and malic acid imide. By copolymerizing such a monomer, various physical properties such as film forming property, film strength, hydrophilicity, hydrophobicity, reactivity and stability can be improved.

Specific examples of the acrylic acid esters include methyl acrylate, ethyl acrylate, (n- or i-)propyl acrylate, (n-, i-, sec- or tert-)butyl acrylate, amyl acrylate, 2-ethylhexyl acrylate, dodecyl acrylate, chloroethyl acrylate, 2-hydroxyethyl acrylate, 2-hydroxypropyl acrylate, 2-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate and 2-(hydroxyphenylcarbonyloxy) ethyl acrylate.

Specific examples of the methacrylic acid esters include methyl methacrylate, ethyl methacrylate, (n- or i-)propyl methacrylate, (n-, i-, sec- or tert-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 2-hydroxypentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate and 2-(hydroxyphenylcarbonyloxy)ethyl methacrylate.

Specific examples of the acrylamides include acrylamide, N-methlylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-(sulfamoylphenyl)acrylamide, N-(phenylsulfonyl) acrylamide, N-(tolylsulfonyl)acrylamide, N,N-dimethylacrylamide, N-methyl-N-phenylacrylamide and N-hydroxyethyl-N-methylacrylamide.

Specific examples of the methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxyphenyl) methacrylamide, N-(sulfamoylphenyl)methacrylamide, N-(phenylsulfonyl)methacrylamide, N-(tolylsulfonyl) methacrylamide, N,N-dimethylmethacrylamide, N-methyl-N-phenylmethacrylamide and N-hydroxyethyl-N-methylmethacrylamide.

Specific examples of the vinyl esters include vinyl acetate, vinyl butyrate and vinyl benzoate.

Specific examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene and carboxystyrene.

The ratio of this other monomer for use in the synthesis of copolymer must be highly enough to improve various physical properties, however, if the ratio is excessively high, the monomer containing a carboxylic acid or a carboxylate insufficiently functions. Accordingly, the total ratio of other monomers is preferably 80 wt % or less, more preferably 50 wt % or less.

Specific examples of the polymer having a carboxylic acid or carboxylate capable of causing decarboxylation by heat, for use in the present invention, are set forth below.

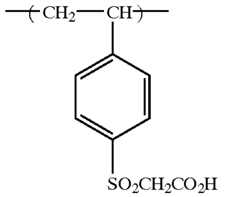

P-1

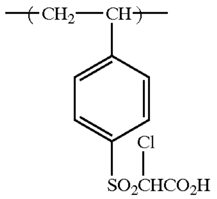

P-2

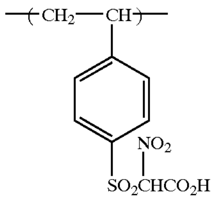

P-3

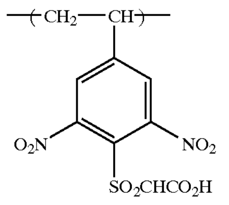

P-4

-continued
P-5
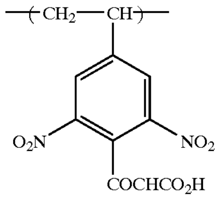
P-6
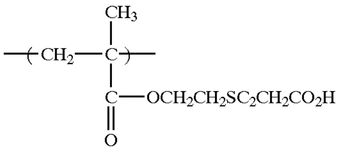
P-7
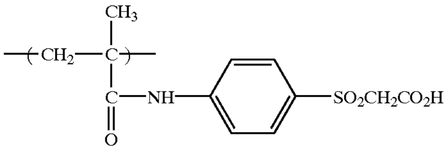
P-8
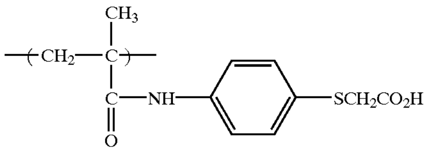
P-9
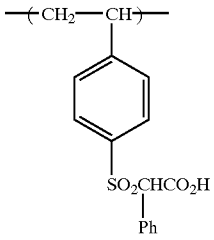
P-10
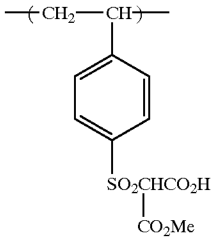
P-11
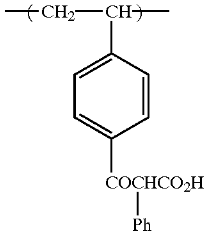
-continued
P-12
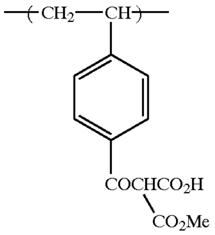
P-13
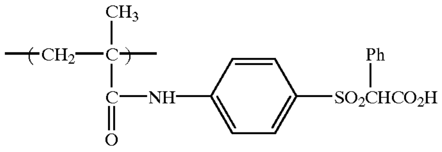
P-14
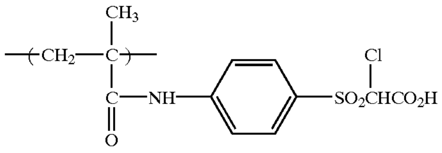
P-15
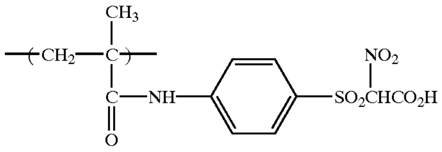
P-16
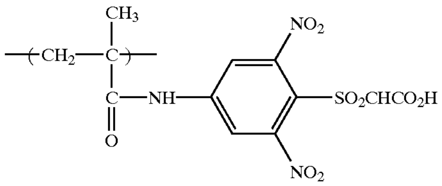
P-17
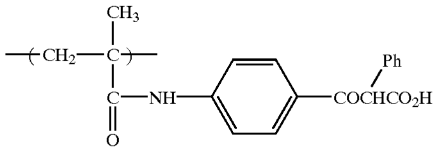
P-18
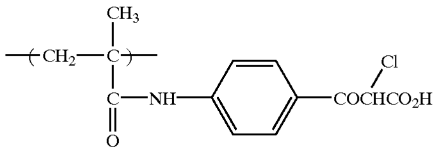
P-19
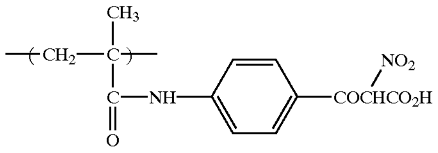
P-20
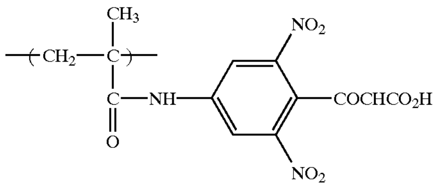

-continued
P-21
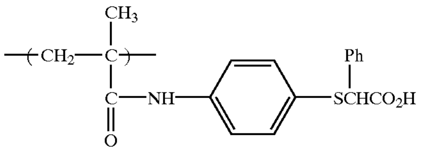
P-22
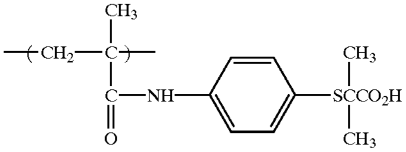
P-23
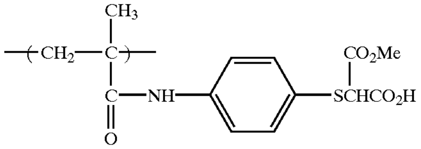
P-24
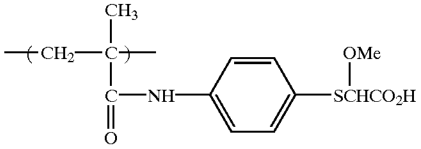
P-25
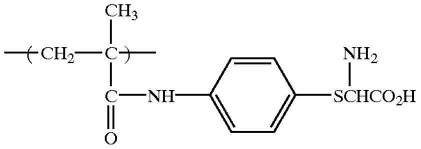
P-26
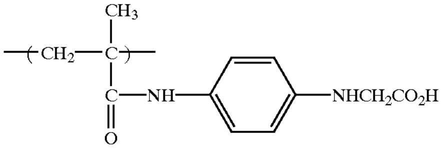
P-27
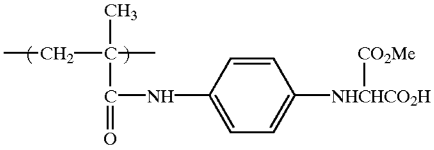
P-28
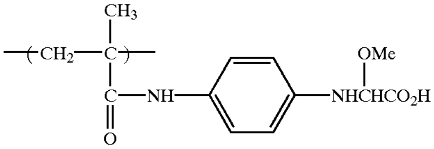
P-29
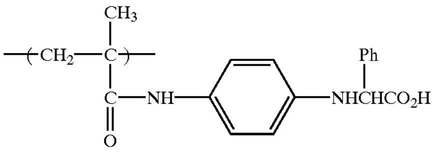
P-30
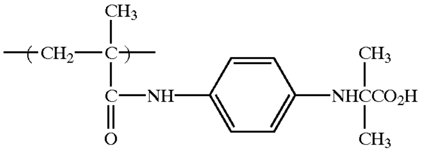
-continued
P-31
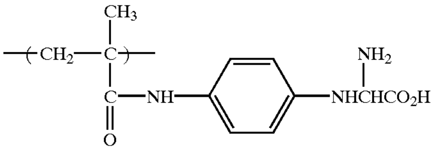
P-32
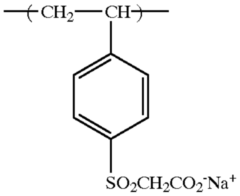
P-33
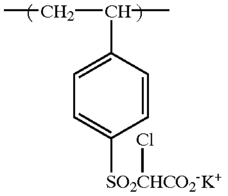
P-34
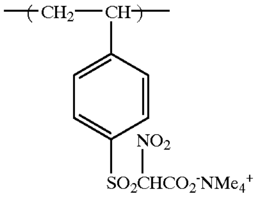
P-35
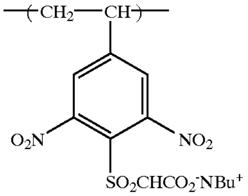
P-36
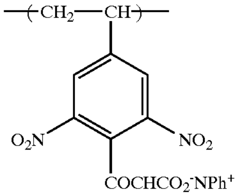
P-37
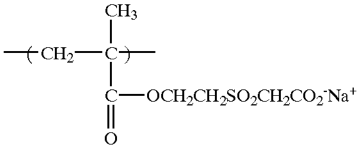
P-38
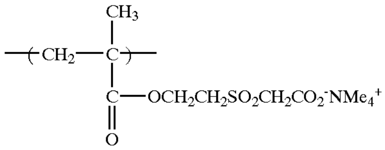

-continued
P-39
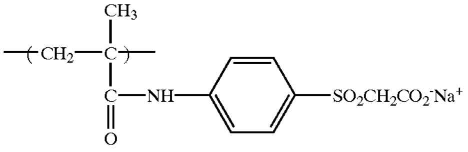
P-40
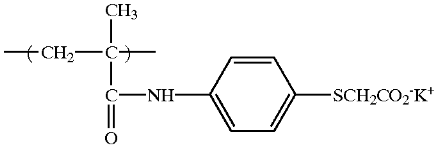
P-41
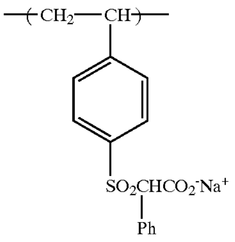
P-42
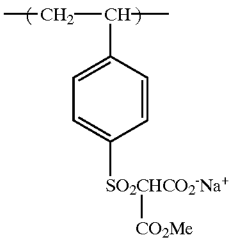
P-43
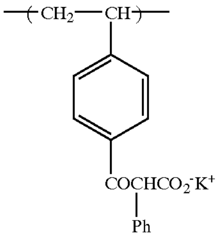
P-44
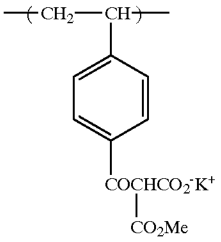
P-45
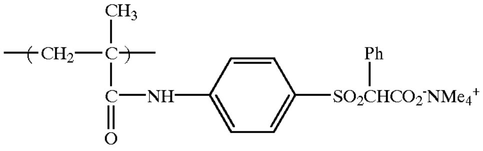
-continued
P-46
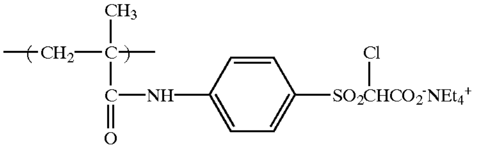
P-47
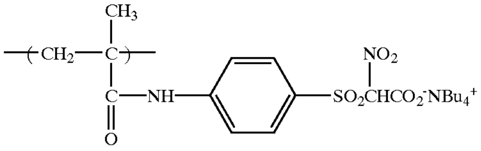
P-48
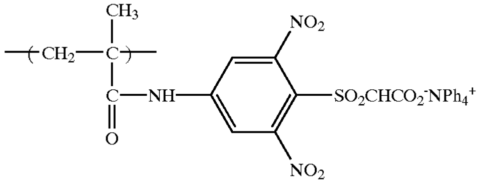
P-49
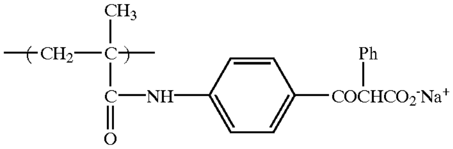
P-50
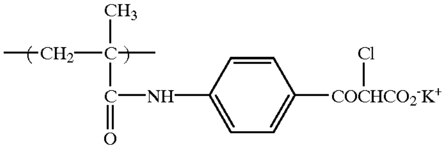
P-51
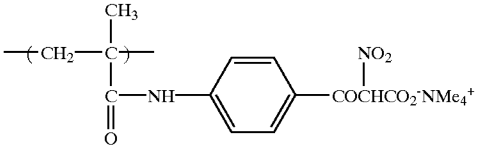
P-52
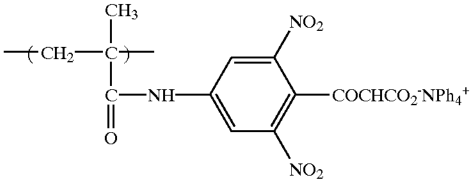
P-53
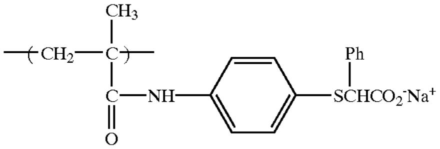
P-54
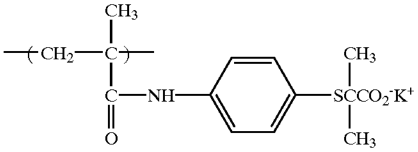

-continued
P-55
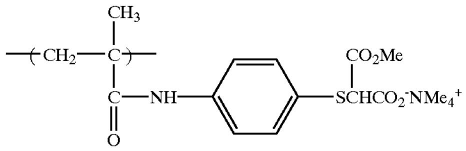
P-56
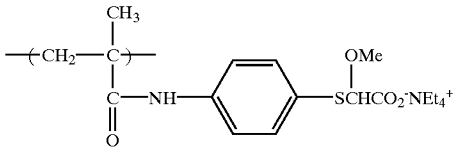
P-57
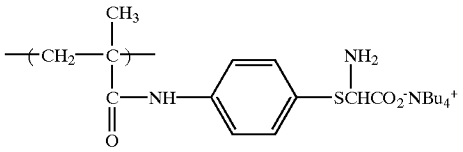
P-58
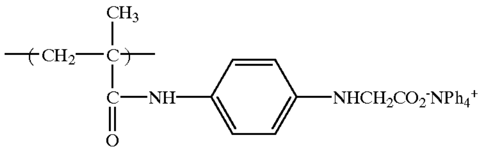
P-59
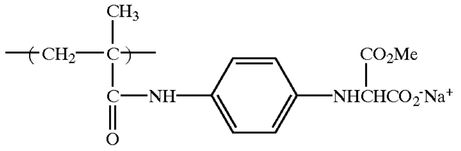
P-60
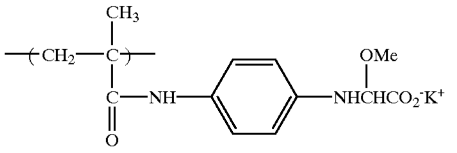
P-61
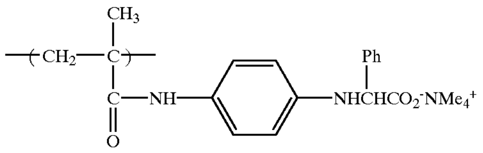
P-62
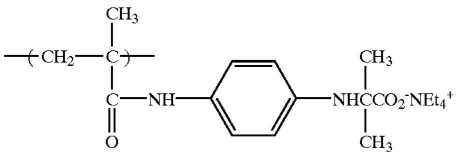
P-63
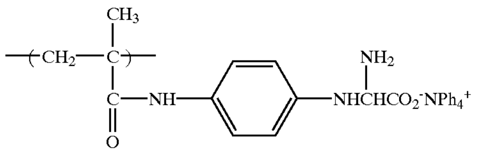
-continued
P-64
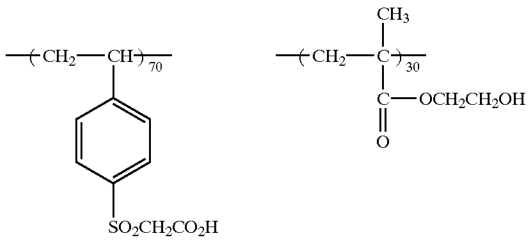
P-65
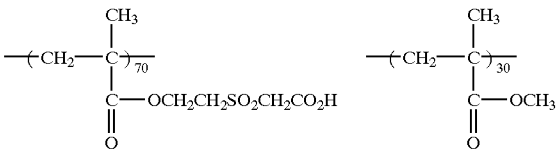
P-66
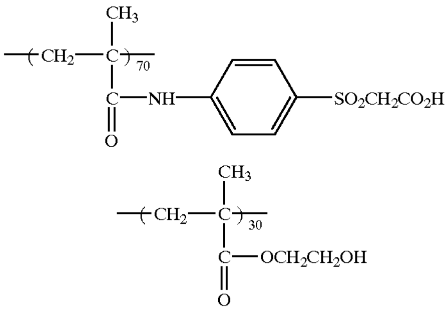
P-67
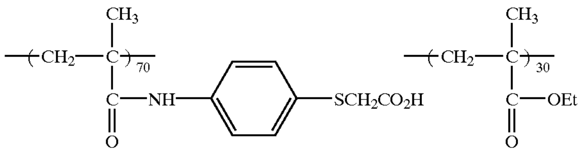
P-68
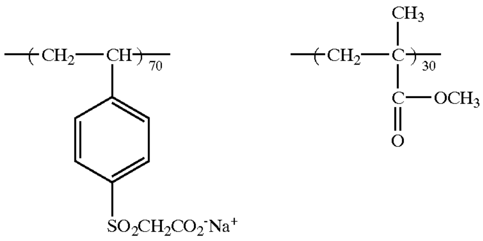
P-69
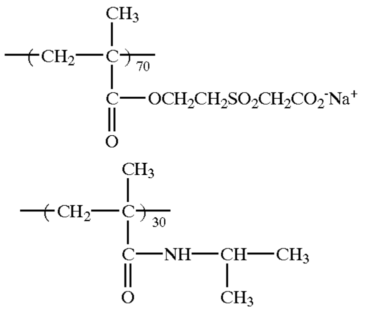
The constituent components other than the negative polar conversion polymer compound, which can be contained in the layer containing a negative polar conversion polymer compound, are described below.

Light-Heat Converting Agent

Light-heat converting agents described later may be suitably used as the light-heat converting agent added to the layer containing a negative polar conversion polymer compound for use in the present invention.

Surface Active Agent

Surface active agents described later may be suitably used as the surface active agent added to the layer containing a negative polar conversion polymer compound for use in the present invention.

Other Constituent Components

As the constituent components other than those described above, which can be added to the layer containing a negative polar conversion polymer compound for use in the present invention, the same components as the other constituent components which can be added to the layer containing a positive polar conversion polymer compound may be suitably used.

Layer Containing Compound Capable of Cross-Linking with Alkali Aqueous Solution-Soluble Resin The "layer containing a compound capable of cross-linking with an aqueous alkali solution-soluble resin" for use in the lithographic printing original plate of the present invention means a layer containing at least the above-described aqueous alkali solution-soluble resin and a compound capable of crosslinking (with the alkali aqueous soluble resin) described below.

Compound Capable of Cross-Linking (with Alkali Aqueous Solution-Soluble Resin)

The compound capable of cross-linking (with the aqueous alkali solution) (hereinafter sometimes simply referred to as a "cross-linking compound or cross-linking agent") for use in the present invention is a compound capable of reacting with the polymer compound to form a cross-linking between polymer compounds. Accordingly, the cross-linking compound must have two or more functional groups capable of reacting with the polymer compounds. Any of such compounds can be suitably used in the present invention but in particular, compounds having two or more functional groups capable of reacting with an aqueous alkali solution-soluble resin are preferred.

Examples of the cross-linking agent which can be preferably used in the present invention include the followings:

(i) aromatic compounds substituted by an alkoxymethyl group or a hydroxymethyl group, (ii) compounds having an N-hydroxymethyl group, an N-alkoxymethyl group or an N-acyloxymethyl group, and (iii) epoxy compounds.

These are described in detail below.

(i) Examples of the aromatic compound substituted by an alkoxymethyl group or a hydroxymethyl group include aromatic compounds and heterocyclic compounds polysubstituted by a hydroxymethyl group, an acetoxymethyl group or an alkoxymethyl group, but exclude resinous compounds obtained by the polycondensation of a phenol and an aldehyde under basic conditions, which are known as resol resin. The resol resin has excellent cross-linking property, however, its thermal stability is not sufficiently high and particularly when the resin is contained in a photosensitive material and stored for a long period of time at high temperatures, uniform development is disadvantageously hard to attain.

Among the aromatic and heterocyclic compounds polysubstituted by an alkoxymethyl group or a hydroxymethyl group, compounds having a hydroxymethyl group or an alkoxymethyl group at the site adjacent to a hydroxy group are preferred. When the compound has an alkoxymethyl group, the alkoxymethyl group preferably has 18 or less carbon atoms. More preferred examples of the compound include those represented by the following formulae (14) to (17):

(14)

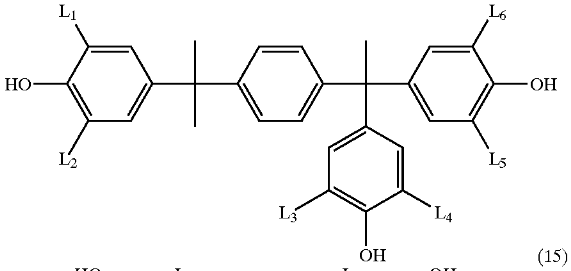

(15)

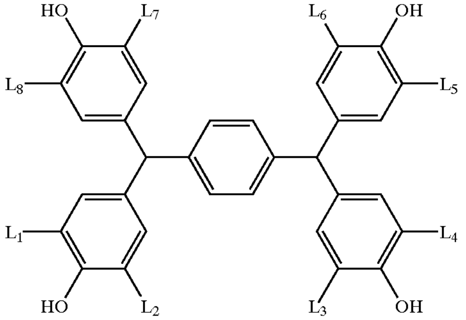

(16)

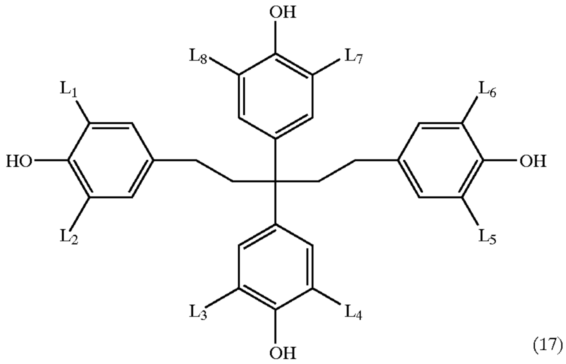

(17)

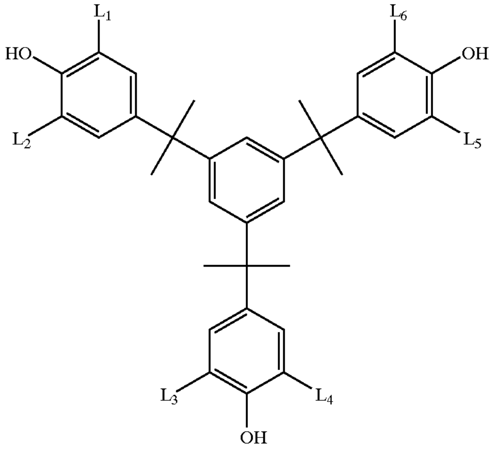

wherein $L_1$ to $L_5$ each independently represents a hydroxymethyl group or an alkoxymethyl group, substituted by an alkoxy group having 18 or less carbon atoms, such as methoxymethyl and ethoxymethyl. These compounds are preferred because they have high cross-linking efficiency and can improve the press life. The above-described cross-linking compounds may be used either individually or in combination of two or more thereof.

(ii) Examples of the compound having an N-hydroxymethyl group, an N-alkoxymethyl group or an N-acyloxymethyl group include monomer and oligomer-melamine-formaldehyde condensates and urea-formaldehyde condensates disclosed in EP-A-0133216 (the term "EP-A" as used herein means an "unexamined European patent publication") and West German Patents 3,634,671 and 3,711,264, an alkoxy-substituted compounds disclosed in EP-A-0212482.

Furthermore, preferred examples thereof include melamine-formaldehyde derivatives having at least two groups of free N-hydroxymethyl groups, free N-alkoxymethyl groups or free N-acyloxymethyl groups. Among these, N-alkoxymethyl derivatives are more preferred.

(iii) The epoxy compound includes monomer-, dimer-, oligomer- or polymer-type epoxy compounds having one or more epoxy groups. Examples thereof include reaction products of bisphenol A and epichlorohydrin, and reaction products of low molecular weight phenol-formaldehyde resin and epichlorohydrin. In addition, epoxy resins described and used in U.S. Pat. No. 4,026,705 and British Patent 1,539,192 may be used.

The cross-linking agents (i) to (iii) which can be used in the present invention each is used in an amount of from 5 to 80 wt %, preferably from 10 to 75 wt %, more preferably from 20 to 70 wt %, based on the total solid content of recording layer. If the amount of cross-linking agent added is less than 5 wt %, the recording layer obtained has bad durability, whereas if it exceeds 80 wt %, the storage stability decreases.

In the present invention, (iv) a phenol derivative represented by the following formula (18) is also preferably used as the cross-linking agent.

(18)

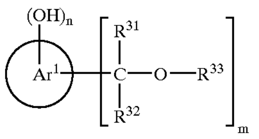

In formula (18), $Ar^1$ represents an aromatic hydrocarbon ring having a substituent. In view of easy availability of the raw materials, the aromatic hydrocarbon ring is preferably a benzene ring, a naphthalene ring or an anthracene ring. The substituent is preferably a halogen atom, a hydrocarbon group having 12 or less carbon atoms, an alkoxy group having 12 or less carbon atoms, an alkylthio group having 12 or less carbon atoms, a cyano group, a nitro group or a trifluoromethyl group. In particular, from the reason that the sensitivity is high, $Ar^1$ is preferably a benzene or naphthalene ring having no substituent, or a benzene or naphthalene ring having a halogen atom, a hydrocarbon group having 6 or less carbon atoms, an alkoxy group having 6 or less carbon atoms, an alkylthio group having 6 or less carbon atoms or a nitro group as the substituent.

$R^{31}$ and $R^{32}$, which may be the same or different, each represents hydrogen atom or a hydrocarbon group having 12 or less carbon atoms. In particular, from the reason that the synthesis is easy, $R^{31}$ and $R^{32}$ each is preferably hydrogen atom or a methyl group. $R^{33}$ represents hydrogen atom or a hydrocarbon group having 12 or less carbon atoms. In particular, from the reason that the sensitivity is high, $R^{33}$ is preferably a hydrocarbon group having 7 or less carbon atoms, such as methyl group, ethyl group, propyl group, cyclohexyl group or a benzyl group. m represents an integer of from 2 to 4. n represents an integer of from 1 to 3.

Specific examples of the phenol derivative represented by formula (18) which can be suitably used in the present invention (cross-Linking Agents [KZ-1] to [KZ-8] are set forth below, however, the present invention is by no means limited thereto.

[KZ-1]

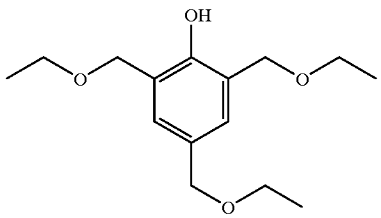

[KZ-2]

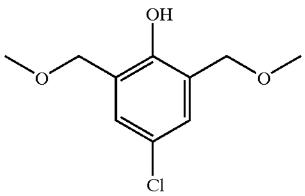

[KZ-3]

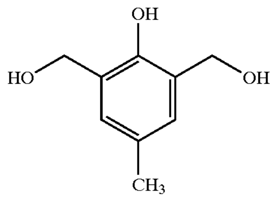

[KZ-4]

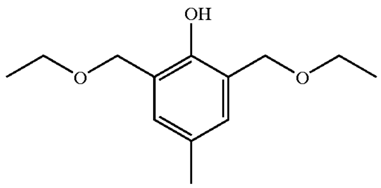

[KZ-5]

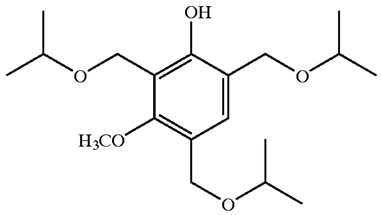

[KZ-6]

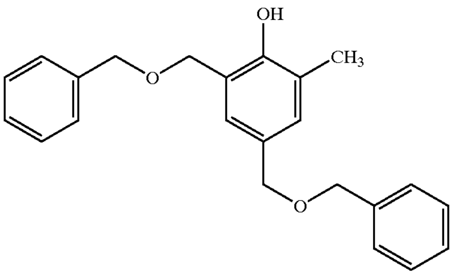

-continued

[KZ-7]

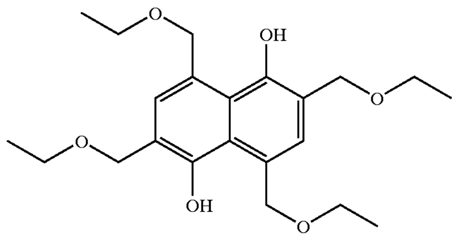

[KZ-8]

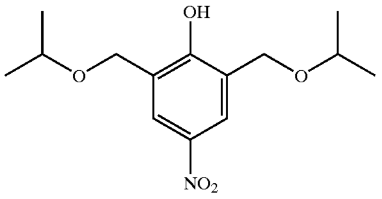

These phenol derivatives can be synthesized by a conventionally known method. For example, [KZ-1] may be synthesized through a route shown below as "Reaction Formula 1", where phenol, formaldehyde and a secondary amine such as dimethylamine or morpholine, are reacted, the tri(dialkylaminomethyl)phenol obtained is reacted with acetic acid anhydride and then with ethanol in the presence of a weak alkali substance such as potassium carbonate.

[Reaction Formula 1]

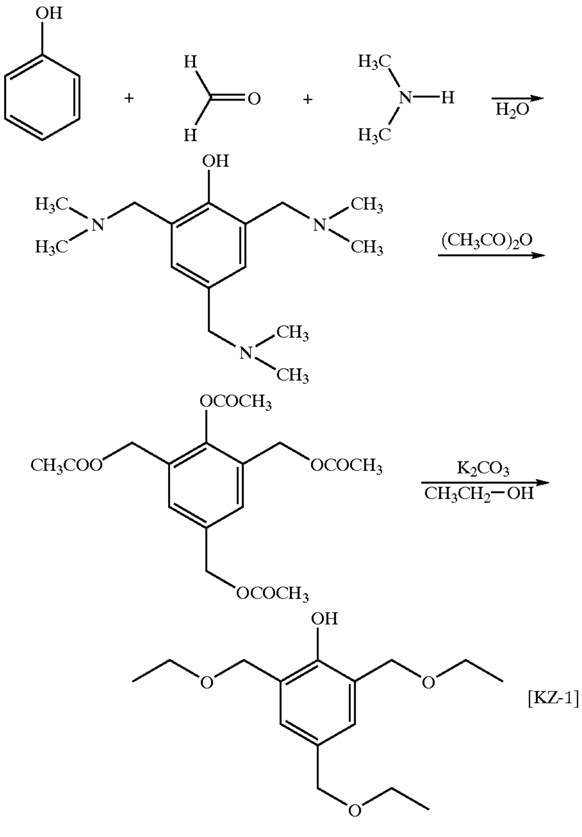

[KZ-1]

The phenol derivatives may also be synthesized by a different method. For example, [KZ-1] can be synthesized through a route shown below as "Reaction Formula 2", where phenol and formaldehyde or p-formaldehyde are reacted in the presence of an alkali such as KOH, the 2,4,5-trihydroxymethylphenol obtained is subsequently reacted with ethanol in the presence of an acid such as sulfuric acid.

[Reaction Formula 2]

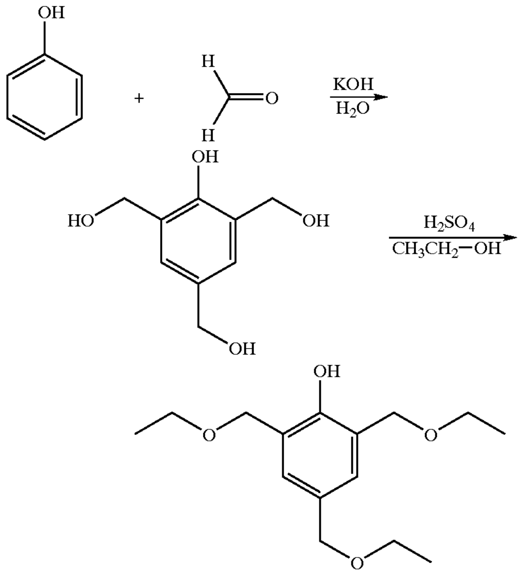

[KZ-1]

The phenol derivative may be used either individually or in combination of two or more thereof. At the time of synthesizing these phenol derivatives, phenol derivatives may be condensed with each other to generate impurities such as dimer and trimer as by-products, but the phenol derivative containing these impurities may be used as it is. Even in this case, the content of impurities is preferably 30% or less, more preferably 20% or less.

In the present invention, the phenol derivative is added to the recording layer in an amount of from 5 to 70 wt %, preferably from 10 to 50 wt %, based on the solid content of the recording layer. If the amount of phenol derivative added as a cross-linking agent is less than 5 wt %, the layer strength subjected to image recording deteriorates in the image area, whereas if it exceeds 70 wt %, the storage stability disadvantageously decreases.

The constituent components other than the aqueous alkali solution-soluble resin and the cross-linking compound, which can be contained in the layer containing an aqueous alkali solution-soluble resin and a cross-linking compound, are described below.

Light-Heat Converting Agent

Light-heat converting agents described later may be suitably used as the light-heat converting agent added to the layer containing an aqueous alkali solution-soluble resin and a cross-linking compound for use in the present invention.

Acid-Generating Agent

Acid-generating agents described later may be suitably used as the acid-generating agent added to the layer containing an aqueous alkali solution-soluble resin and a cross-linking compound for use in the present invention.

Sensitizing Dye

As the sensitizing dye which can be added to the layer containing an aqueous alkali solution-soluble resin and a cross-linking compound for use in the present invention, the same sensitizing dyes as those which can be added to the layer containing a positive polar conversion polymer compound may be suitably used.

Surface Active Agent

Surface active agents described later may be suitably used as the surface active agent added to the layer containing an aqueous alkali solution-soluble resin and a cross-linking compound for use in the present invention.

Other Constituent Components

As the constituent components other than those described above, which can be added to the layer containing an aqueous alkali solution-soluble resin and a cross-linking compound for use in the present invention, the same components as the other constituent components which can be added to the layer containing a positive polar conversion polymer compound may be suitably used.

The recording layer of the lithographic printing original plate of the present invention may be usually produced by dissolving the above-described components in a solvent and coating the resulting solution on an appropriate support having coated thereon a polymer complex layer. Examples of the solvent used here include tetrahydrofuran, ethylene dichloride, cyclohexanone, methyl ethyl ketone, acetone, methanol, propanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, dimethoxyethane, N,N-dimethylformamide, N,N-dimethylacetamide, toluene, ethyl acetate, ethyl lactate, methyl lactate, dimethyl sulfoxide, water, sulfolane and γ-butyrolactone.

These solvents may be used either individually or in combination. In the case of preparing a coating solution, the concentration of the recording layer constituent components (all solids content including additives) in the solvent is preferably from 1 to 50 wt %.

The coating solution may be coated by various known methods such as bar coater coating, rotation coating, spray coating, curtain coating, dip coating, air knife coating, blade coating and roll coating.

In the lithographic printing original plate of the present invention, the recording layer may contain a surface active agent so as to improve the coatability, such as a fluorine-based surface active agent described, for example, in JP-A-62-170950. The amount of surface active agent added is preferably from 0.01 to 1 wt %, more preferably from 0.05 to 0.5 wt %.

The coated amount (solid content) of recording layer obtained after the coating and drying varies depending on the use, however, in the case of a general lithographic printing original plate, it is preferably from 0.5 to 5.0 $g/m^2$, more preferably from 0.5 to 1.5 $g/m^2$.

The light-heat converting agent, the acid-generating agent and the surface active agent contained in the polymer complex layer and the recording layer for use in the present invention are described in detail.

Light-Heat Converting Agent

The light-heat converting agent capable of absorbing a laser ray and converting it into heat, which can be contained in the polymer complex layer and the recording layer of the lithographic printing original plate of the present invention, is described below.

The light-heat converting agent for use in the present invention is preferably a dye or pigment capable of effectively absorbing light at the wavelength of from 760 to 1,200 nm, more preferably a dye or pigment having an absorption maximum at the wavelength of from 760 to 1,200 nm.

As the dye, commercially available dyes and known dyes described in publications (for example, *Senryo Binran* (*Handbook of Dyes*), compiled by Yuki Gosei Kagaku Kyokai (1970)) may be used. Specific examples thereof include azo dyes, metal complex salt azo dyes, pyrazolone azo dyes, anthraquinone dyes, phthalocyanine dyes, carbonium dyes, quinoneimine dyes, methine dyes, cyanine dyes and metal thiolate complex dyes.

Preferred examples of the dye include cyanine dyes, methine dyes, naphthoquinone dyes and squarylium dyes.

Furthermore, near infrared absorbing sensitizers may be suitably used and pyrylium compounds such as substituted arylbenzo(thio)pyrylium salts, trimethine thiapyrylium salts, pyrylium-based compounds, cyanine dyes and pentamethine thiopyrylium salts may also be preferably used.

Other preferred examples of the dye include near infrared absorbing dyes described as formulae (I) and (II) in U.S. Pat. No. 4,756,993.

Among these dyes, preferred are cyanine dyes, squarylium dyes, pyrylium dyes and nickel thiolate complexes.

As the pigment for use in the present invention, commercially available pigments and pigments described in *Color Index* (*C.I.*) *Binran* (*C.T. Handbook*), *Saishin Ganryo Binran* (*Handbook of Tatest Pigments*), compiled by Nippon Ganryo Gijutsu Kyokai (1977), *Saishin Ganryo Oyo Gijutsu* (*Up-To-Date Pigment Application Technology*), CMC (1986), and *Insatsu Ink Gijutsu* (*Printing Ink Technology*), CMC (1984) may be used.

The kind of pigment includes black pigment, yellow pigment, orange pigment, brown pigment, red pigment, ultraviolet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments and carbon black. Among these pigments, preferred is carbon black.

These pigments may be surface treated or may not be surface treated before use. For the surface treatment, a method of coating resin or wax on the surface, a method of attaching a surface active agent and a method of bonding a reactive substance (for example, silane coupling agent, an epoxy compound and polyisocyanate) to the pigment surface may be used. These surface treatment methods are described in *Kinzoku Sekken no Seishitsu to Oyo* (*Properties and Application of Metal Soap*), Saiwai Shobo, *Insatsu Ink Gijutsu* (*Printing Ink Technology*), CMC (1984), and *Saishin Ganryo Oyo Gijutsu* (*Up-To-Date Pigment Application Technology*), CMC (1986).

The pigment preferably has a particle size of from 0.01 to 10 μm, more preferably from 0.05 to 1 μm, still more preferably from 0.1 to 1 μm. If the particle size of pigment is less than 0.01 μm, the dispersion is not stable in the coating solution for polymer complex layer or recording layer, whereas if it exceeds 10 μm, a homogeneous polymer complex layer or recording layer may not be formed by the coating.

For dispersing the pigment, a known dispersion technique for use in the production of ink or toner may be used. Examples of the disperser include ultrasonic disperser, sand mill, attritor, pearl mill, super-mill, ball mill, impeller, disperser, KD mill, colloid mill, dynatron, three roll mill and pressure kneader. These are described in detail in *Saishin Ganryo Oyo Gijutsu* (*Up-To-Date Pigment Application Technology*), CMC (1986).

The dye or pigment may be added to the polymer complex layer and the recording layer of the lithographic printing original plate of the present invention in an amount of from 0.01 to 50 wt %, preferably from 0.1 to 10 wt %, in the case of a dye, more preferably from 0.5 to 10 wt % and in the case of a pigment, more preferably from 1.0 to 10 wt %, based on all solids content. If the amount of pigment or dye added is less than 0.01 wt %, the sensitivity decreases, whereas if it exceeds 50 wt %, scumming is readily generated in the non-image area at the printing.

Acid-Generating Agent

In the case where the lithographic printing original plate of the present invention is used as a lithographic printing original plate for forming an image by laser exposure, it is preferred to add a compound capable of generating an acid by light or heat (hereinafter referred to as "acid-generating agent") to the polymer complex layer and the recording layer of the lithographic printing original plate. However, the polar conversion polymer compound described above sometimes generates an acid by itself due to heat and may exert a function as an acid-generating agent. In such a case, an image can be formed without using other acid-generating agent in particular, thus, the acid-generating agent is not essential.

The acid-generating agent for use in the present invention may be selected from the following known compounds.

Examples of the acid-generating agent include onium salts such as diazonium salt, ammonium salt, phosphonium salt, iodonium salt, selenonium salt and arsonium salt, organic halogen compounds, organic metals/organic halides, acid-generating agents having o-nitrobenzyl type protective group, compounds capable of generating a sulfonic acid by the photolysis represented by iminosulfonate, disulfone compounds, o-naphthoquinonediazide-4-sulfonic acid halides, and o-naphthoquinonediazide compounds.

Other examples of the acid-generating agent which can be used include cyclohexyl citrate, sulfonic acid alkyl esters such as cyclohexyl p-acetoaminobenzenesulfonate and cyclohexyl p-bromobenzenesulfonate, and alkylsulfonic acid esters represented by the following structural formula described in JP-A-10-282672 previously filed by the present inventors:

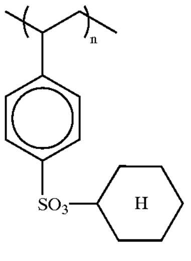
,
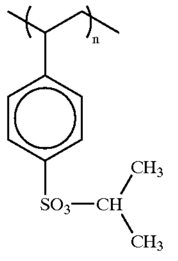

Among the above-described compounds capable of decomposing upon irradiation of light, heat or radioactive ray and thereby generating an acid, particularly effective compounds are described below.

(1) Oxazole derivative represented by the following formula (PAG1) and S-triazine derivative represented by formula (PAG2), substituted by a trihalomethyl group:

(PAG1)

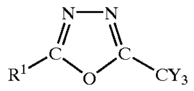

(PAG2)

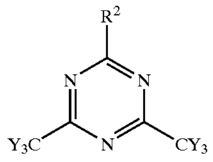

wherein $R^1$ represents a substituted or unsubstituted aryl or alkenyl group, $R^2$ represents a substituted or unsubstituted aryl, alkenyl or alkyl group or $-CY_3$, and Y represents a chlorine atom or a bromine atom.

Specific examples of the compound are set forth below, however, the present invention is by no means limited thereto.

(PAG1-1)

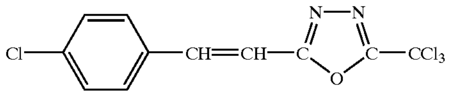

(PAG1-2)

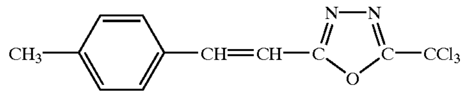

(PAG2-1)

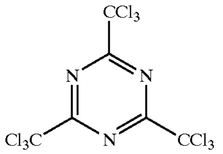

(PAG2-2)

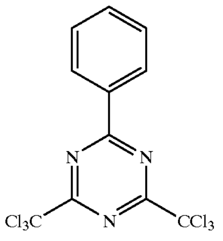

(PAG2-3)

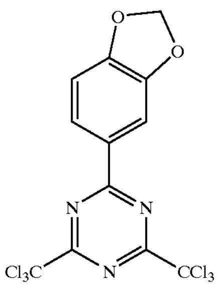

-continued (PAG2-4)

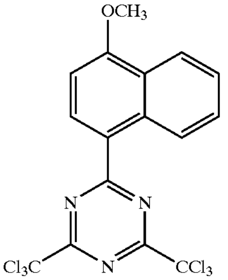

(PAG2-5)

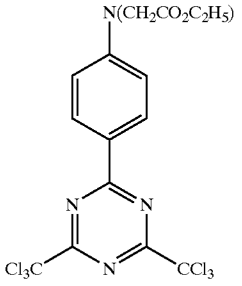

(2) Iodonium salt represented by the following formula (PAG3), sulfonium salt represented by formula (PAG4) and diazonium salt:

(PAG3)

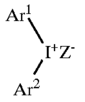

(PAG4)

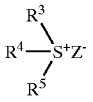

In formula (PAG3), $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

In formula (PAG4), $R^3$, $R^4$ and $R^5$ each independently represents a substituted or unsubstituted alkyl or aryl group, preferably an aryl group having from 6 to 14 carbon atoms, an alkyl group having from 1 to 8 carbon atoms or a substituted derivative thereof. Preferred examples of the substituent for the aryl group include an alkoxy group having from 1 to 8 carbon atoms, an alkyl group having from 1 to 8 carbon atoms, a nitro group, a carboxyl group, a hydroxy group and a halogen atom, and for the alkyl group include an alkoxy group having from 1 to 8 carbon atoms, a carboxyl group and an alkoxycarbonyl group.

$Z^-$ represents a counter anion. Examples thereof include perfluoroalkane sulfonate anion such as $BF_4^-$, $AsF_6^-$, $PF_6^-$, $SbF_6^-$, $Si_2F_2^-$, $ClO_4^-$ and $CF_3SO_3^-$; bonded polynuclear aromatic sulfonate anion such as pentafluorobenzene sulfonate anion and naphthalene-1-sulfonate anion; anthraquinone sulfonate anion; and sulfonic acid group-containing dyes, however, the present invention is by no means limited thereto.

Two of $R^3$, $R^4$ and $R^5$ or $Ar^1$ and $Ar^2$ may be combined through respective single bonds or a substituent.

Specific examples include the following compounds, however, the present invention is by no means limited thereto.

(PAG3-1)

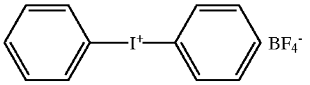

(PAG3-2)

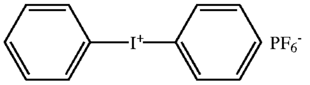

(PAG4-1)

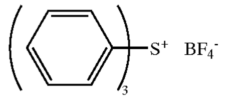

(PAG4-2)

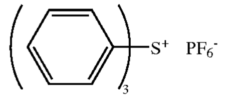

(PAG4-3)

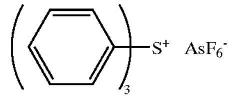

These onium salts represented by formulae (PAG3) and (PAG4) are known and can be synthesized by the methods described, for example, in J. W. Knapczyk et al., *J. Am. Chem. Soc.*, 91, 145 (1969), A. L. Maycok et al., *J. Org. Chem.*, 35, 2532 (1970), B. Goethas et al., *Bull. Soc. Chem. Belg.*, 73, 546 (1964), H. M. Leicester, *J. Am. chem. Soc.*, 51, 3587 (1929), J. V. Crivello et al., *J. Polym. Chem.*, Ed. 18, 2677 (1980), U.S. Pat. Nos. 2,807,648 and 4,247,473, and JP-A-53-101331.

(3) Disulfone derivatives represented by the following formula (PAG5) and iminosulfonate derivatives represented by formula (PAG6):

(PAG5)

$Ar^3—SO_2SO_2—Ar^4$ (PAG6)

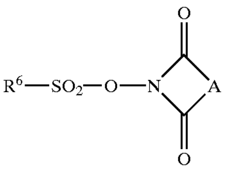

wherein $Ar^3$ and $Ar^4$ each independently represents a substituted or unsubstituted aryl group, $R^6$ represents a substituted or unsubstituted alkyl or aryl group, and A represents a substituted or unsubstituted alkylene, alkenylene or arylene group.

Specific examples include the following compounds, however, the present invention is by no means limited thereto.

(PAG5-1)

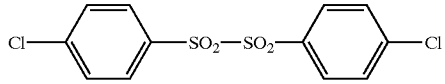

-continued (PAG5-2)

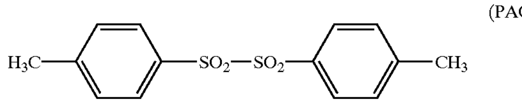

(PAG6-1)

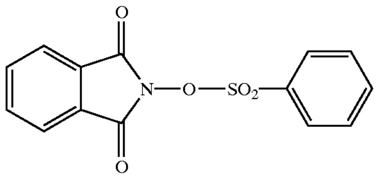

(PAG6-2)

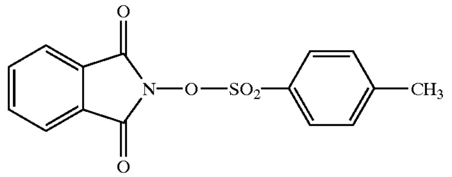

The content of acid-generating agent is usually from 0.01 to 50 wt %, preferably from 0.1 to 40 wt %, more preferably from 0.5 to 30 wt %, based on all solids content in the image-forming layer of the lithographic printing original plate of the present invention.

In the case where the acid-generating agent is contained in the polymer complex layer, the acid-generating layer is contained in the coating solution for polymer complex layer, which contains a polymer electrolyte precursor, the coating solution is coated on a support which is described later, and the coated layer is entirely exposed or heated to bring out the action of acid-generating layer and thereby form the polymer complex layer.

Therefore, after the formation of polymer complex layer, the acid-generating agent is deactivated even before the lithographic printing original plate of the present invention is subjected to image recording. Thus, the acid-generating agent plays a different role from the acid-generating agent contained in the recording layer.

Sensitizing Dye

In the case where the acid-generating agent contained in the ink-receptive layer containing a positive polar conversion polymer compound does not have sensitivity in the range of from ultraviolet region to visible region, various sensitizing dyes for acid-generating agent may be used for activating the acid-generating agent to the light of from ultraviolet region to visible region.

Examples of the sensitizing dye which can be effectively used to this purpose include pyrane-based dyes, cyanine dyes, squarylium-based dyes, merocyanine-based dyes, pyrylium dyes, Michler's ketone, thioxanthone, ketocoumarin dyes and 9-phenylacridine. In addition, polynuclear aromatic compounds such as bisbenzilidene ketone dye and 9,10-diphenylanthracene.

As other components, for example, a dye having large absorption in the visible light region may be used as the coloring agent for an image.

Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Kagaku Kogyo K.K.), Victoria Pure Blue, Crystal Violet (C.I. 42555), Methyl Violet (C.I. 42535), Ethyl Violet, Rhodamine B (C.I. 45170B), Malachite Green (C.I. 42000) and Methylene Blue (C.I. 52015). Dyes described in JP-A-62-293247 may also be used.

The amount of dye added is from 0.01 to 10 wt % based on all solids content in the ink-receptive layer of the lithographic printing original plate of the present invention.

Surface Active Agent

The polymer complex layer of the lithographic printing plate of the present invention may contain a nonionic surface active agent described in JP-A-62-251740 and JP-A-3-208514 or an amphoteric surface active agent described in JP-A-59-121044 and JP-A-4-13149 so as to broaden the stability to the printing conditions.

Specific examples of the nonionic surface active agent include sorbitan tristearate, sorbitan monopalmitate, sorbitan trioleate, stearic acid monoglyceride and polyoxyethylene nonylphenyl ether.

Specific examples of the amphoteric surface active agent include alkyldi(aminoethyl)glycine, alkylpolyaminoethyl glycine hydrochloride, 2-alkyl-N-carboxyethyl-N-hydroxyethylimidazolinium betaine and N-tetradecyl-N,N-betaine type (for example, AMORGEN K, trade name, produced by Daiichi Kogyo K.K.).

The ratio of nonionic surface active agent or amphoteric surface active agent occupying the polymer complex layer is preferably from 0.05 to 15 wt %, more preferably from 0.1 to 5 wt %, based on all solids content.

Support

The support (substrate) for use in the lithographic printing original plate of the present invention, where the polymer complex layer and the recording layer are coated, is a plate material having good dimensional stability and any known material heretofore used as a support of printing plates can be suitably used. Examples of the support include paper, paper laminated with plastic (for example, polyethylene, polypropylene or polystyrene), metal plates such as aluminum (including aluminum alloy), zinc, iron and copper, plastic film such as cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate and polyvinyl acetal, and paper or plastic film having laminated or deposited thereon the above-described metal. Among these, an aluminum plate is preferred. The aluminum plate includes pure aluminum plate and aluminum alloy plate. As the aluminum alloy, various alloys may be used and for example, alloys of aluminum with a metal such as silicon, copper, manganese, magnesium chromium, zinc, lead, bismuth or nickel may be used. The alloy composition is allowed to contain a negligible amount of impurities in addition to some iron and titanium.

The support is subjected to a surface treatment, if desired. For example, in the manufacture of a lithographic printing original plate, the support surface is subjected to a hydrophilization treatment in advance of the coating of polymer complex layer and recording layer.

In the case of a support having a metal surface, particularly aluminum surface, the support is preferably subjected to a surface treatment such as graining, soaking in an aqueous solution of sodium silicate, potassium fluorozirconate or phosphate, or anodization. An aluminum plate subjected to graining and then to soaking in an aqueous sodium silicate solution described in U.S. Pat. No. 2,714,066, and an aluminum plate subjected to anodization and then to soaking in an aqueous alkali metal silicate solution described in U.S. Pat. No. 3,181,461 may be suitably used. The anodization is performed by passing a current using the aluminum plate as an anode in an electrolytic solution comprising, for example, an aqueous or non-aqueous solution of an inorganic acid such as phosphoric acid, chromic acid, sulfuric acid or boric acid, or an organic acid such as oxalic acid or sulfamic acid. These aqueous or non-aqueous solutions may be used individually or in combination of two or more thereof.

The silicate electrodeposition described in U.S. Pat. No. 3,658,662 is also an effective surface treatment.

These hydrophilization treatments are performed not only to render the support surface hydrophilic but also to prevent harmful reaction with the polymer complex layer coated thereon or to improve the adhesion to the layer.

In advance of the surface roughening by graining of the aluminum plate, the surface may be subjected to a pretreatment, if desired, so as to remove the rolling oil on the surface or reveal the clean aluminum surface. For the removal of rolling oil and the like, a solvent such as trichlene or a surface active agent is usually used. For revealing the clean surface, a method of using an alkali etching agent such as sodium hydroxide and potassium hydroxide is widely used.

As the graining method, any of mechanical, chemical and electrochemical methods may be effectively used. The mechanical method includes ball polishing, blast polishing and brush polishing of rubbing a water dispersion slurry of abrasive such as pumice by a nylon brush. As the chemical method, a method of soaking the plate in a saturated aqueous solution of mineral acid aluminum salt described in JP-A-54-31187 is suitable. As the electrochemical method, a.c. electrolysis in an acidic electrolytic solution such as hydrochloric acid or nitric acid is preferred. Among these surface roughening methods, a surface roughening treatment using a combination of mechanical surface roughening and electrochemical surface roughening described in JP-A-55-137993 is preferred because the polymer complex layer or the ink-receptive image can firmly adhere to the support.

The graining by the above-described methods is preferably performed so that the center line surface roughness (Ra) on the aluminum plate surface can be from 0.3 to 1.0 $\mu$m. The grained aluminum plate as above is, if desired, washed with water and subjected to chemical etching.

The etching solution is usually selected from aqueous solutions of base or acid capable of dissolving aluminum. In this case, the coating formed on the etched surface must be different from the aluminum derived from the etching solution component. Preferred examples of the etching agent include, as a basic substance, sodium hydroxide, potassium hydroxide, trisodium phosphate, disodium phosphate, tripotassium phosphate and dipotassium phosphate; and as an acidic substance, sulfuric acid, persulfuric acid, phosphoric acid, hydrochloric acid and salts thereof. However, metals with lower ionization tendency than aluminum, such as salts of zinc, chromium, cobalt, nickel or copper, are not preferred because an unnecessary film is formed on the etching surface.

The etching agent is most preferably used such that the aluminum or alloy used dissolves at a rate of from 0.3 to 40 $g/m^2$ per the soaking time of 1 minute at the concentration and the temperature used, but may be used in excess or lower than that.

Etching is performed by soaking the aluminum plate in the above-described etching solution or coating the etching solution on the aluminum plate, and the etching treatment is preferably performed to have an etching amount of from 0.5 to 1.0 $g/m^2$.

As the etching agent, an aqueous solution of base is preferably used because of its high etching rate. In this case, smut is generated, therefore, the plate is usually subjected to a desmutting treatment. Examples of the acid for use in the desmutting treatment include nitric acid, sulfuric acid, phosphoric acid, chromic acid, hydrofluoric acid and borofluoric acid.

The etched aluminum plate is, if desired, subjected to water washing and anodization. The anodization may be performed by a method conventionally used in this field. To speak specifically, by passing a d.c. or a.c. current to the aluminum in an aqueous or non-aqueous solution of sulfuric acid, phosphoric acid, chromic acid, oxalic acid, sulfamic acid, benzenesulfonic acid or a combination of two or more thereof, an anodic oxide film can be formed on the aluminum support surface.

The anodization treatment conditions vary depending on the electrolytic solution used and cannot be indiscriminately specified, however, suitable conditions are gene-rally such that the electrolytic solution concentration is from 1 to 80 wt %, the liquid temperature is from 5 to 70° C., the current density is from 0.5 to 60 $A/dm^2$, the voltage is from 1 to 100 V, and the electrolysis time is from 30 seconds to 50 minutes.

Among the anodization treatments, the method of performing anodization at a high current density in sulfuric acid described in British Patent 1,412,768 and the method of anodization using phosphoric acid as the electrolytic bath described in U.S. Pat. No. 3,511,661 are preferred.

The surface roughened and further anodized aluminum plate may be hydrophylized, if desired. Preferred examples of the hydrophilization method include a treatment with an alkali metal silicate such as an aqueous sodium silicate solution disclosed in U.S. Pat. Nos. 2,714,066 and 3,181,461, and a treatment with potassium fluorozirconate disclosed in JP-B-36-22063 (the term "JP-B" as used herein means an "Japanese examined patent publication") or with polyvinylphosphonic acid disclosed in U.S. Pat. No. 4,153,461.

Other Layers

On the back surface of support, a backcoat is provided, if desired. As the backcoat, a coating layer comprising an organic polymer compound described in JP-A-5-45885 or a metal oxide obtained by the hydrolysis or polycondensation of an organic or inorganic metal compound described in JP-A-6-35174 may be preferably used.

In particular, a coating layer comprising a metal oxide obtained from an alkoxy compound of silicon, such as $Si(OCH_3)_4$, $Si(OC_2H_5)_4$, $Si(OC_3H_7)_4$ and $Si(OC_4H_9)_4$, is preferred because the compound is inexpensive and easily available and the coating layer has excellent hydrophilicity.

Plate-Making Process

The method for manufacturing a lithographic printing plate from the lithographic printing original plate of the present invention is described below. The image recording of this lithographic printing original plate is performed directly by the imagewise heat-sensitive recording using a thermal recording head or the like or by the imagewise exposure to light.

Examples of the light source for an active ray used in the imagewise exposure include a mercury lamp, a metal halide lamp, xenon lamp, a chemical lamp and a carbon arc lamp. Examples of the radioactive ray include an electron beam, an X ray, an ion beam and a far infrared ray. Also, g ray, i ray, Deep-UV ray and high-density energy beam (laser beam) may be used. For the laser beam, a helium-neon laser, an argon laser, a krypton laser, a helium-cadmium laser, a KrF eximer laser, a solid laser and a semiconductor laser may be used.

In the present invention, a solid laser and a semiconductor laser, which irradiates an infrared ray at the wavelength of from 760 to 1,200 nm, are preferred.

After the above-described image recording by light, even when the development processing may or may not be performed, the lithographic printing original plate of the present invention is preferably heat treated so as to improve the sensitivity at the recording. The heat treatment is preferably performed at from 80 to 160° C. for from 10 seconds to 5 minutes. By applying this heat treatment, the energy necessary for the recording can be reduced at the exposure using the above-described light source.

The lithographic printing original plate of the present invention subjected to the above-described image recording is then developed with a developer and if desired, subjected to gumming or burning, and the resulting plate may be mounted in a printing press and subjected to printing. In the case where the lithographic printing original plate of the present invention comprises a recording layer containing a polar conversion polymer compound, the plate may be mounted in a printing press immediately after the image recording (without passing through the development process) and subjected to printing. In this case, the heated area or exposed area swells with fountain solution and the swelled area is removed at the initial stage of printing, thereby forming a lithographic printing plate. In other words, in the plate-making process using the lithographIc printing original plate of the present invention, when a recording layer in a preferred embodiment is used, a lithographic printing plate can be manufactured without particularly passing development or other treatments.

In the case where the recording layer of the lithographic printing original plate of the present invention is a layer containing an alkali-soluble resin or an alkali-soluble resin and a cross-linking compound, the plate must be subjected to wet development. As the developer or the replenisher thereof used in this processing, conventionally known aqueous alkali solution or pure water may be used. Examples of the alkali agent include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. In addition, organic alkali agents such as monomethylamine, dimethylamine, trimethylamine, monoethylamine, diethylamine, triethylamine, monoisoproylamine, diisopropylamine, triisopropylamine, n-butylamine, monoethanolamine, diethanolamine, triethanolamine, monoisopropanolamine, diisopropanolamine, ethyleneimine, ethylenediamine and pyridine, may also be used.

These alkali agents may be used either individually or in combination of two or more thereof.

Among these alkali agents for use in the developer, an aqueous solution of silicate such as sodium silicate and potassium silicate is particularly preferred. This is because the developability can be controlled by the ratio of silicon oxide $SiO_2$ as a component of the silicate to a metal oxide $M_2O$. Alkali metal silicates described, for example, in JP-A-54-62004 and JP-B-57-7427 may be effectively used.

In the case of developing the plate using an automatic developing machine, it is known that when an aqueous solution (replenisher) having an alkali intensity higher than that of developer is added, a large number of PS plates can be treated without exchanging the developer in the developing tank for a long time. Also in the present invention, this replenishing system is preferably used. The developer or replenisher may contain, if desired, various surface active agents and organic solvents so as to accelerate or prevent the development, disperse the development scum or enhance the ink-receptivity in the image area of the printing plate. Preferred surface active agents include anionic, cationic, nonionic and amphoteric surface active agents.

The developer or replenisher may further contain, if desired, a reducing agent such as sodium salt or potassium salt of an inorganic acid (e.g., hydroquinone, resorcin, sulfurous acid, hydrosulfurous acid), and additionally an organic carboxylic acid, a defoaming agent and a hard water softener.

The printing plate developed using the above-described developer or replenisher is after-treated with washing water, a rinsing solution containing a surface active agent or the like, or a desensitizing solution containing gum arabi or a starch derivative. In the case where the lithographic printing original plate having a polymer complex layer and a recording layer of the present invention is subjected to the image formation and used as a printing plate, the after treatment may be performed by combining those treatments.

In recent years, an automatic developing machine for printing plates is widely used for rationalizing and standardizing the plate-making work in the plate-making and printing art. This automatic developing machine generally comprises a development part and an after-treatment part and comprises a printing plate conveying unit, respective processing solution tanks and a spray unit, where while horizontally conveying an exposed printing plate, each processing solution pumped up is sprayed on the plate through a spray nozzle to develop the plate. Furthermore, a method of processing the printing plate while dipping and conveying it though processing solution tanks filled with respective processing solutions by means of guide rolls provided in the solution is also known. In this automatic development, the processing may be performed while supplying the replenisher to each processing solution according to the amount processed or the operation time.

Also, a so-called disposable processing system where the plate is processed with a substantially unused processing solution, may also be applied.

The lithographic printing original plate having a polymer complex layer and a recording layer of the present invention is imagewise exposed, developed, water washed and/or rinsed and/or gummed, and when an unnecessary image area (for example, film edge mark of the original film) is present on the lithographic printing plate obtained, the unnecessary image area is eliminated. This elimination is preferably performed by a method of coating an eliminating solution on the unnecessary image area, allowing the plate to stand for a predetermined time and then washing it with water. However, a method of irradiating an active ray guided by an optical fiber on the unnecessary image area and then developing it may also be used.

The thus-obtained lithographic printing plate is, if desired, coated with a desensitizing gum and then subjected to printing process. For obtaining a lithographic printing plate having a longer press life, the plate is subjected to a burning treatment.

In the case of applying a burning treatment, the lithographic printing plate is preferably treated with a surface controlling solution described in JP-B-61-2518, JP-B-55-28062, JP-A-62-31859 and JP-A-61-159655 before the burning treatment.

For this treatment, a method of coating the surface controlling solution on the lithographic printing plate using a sponge or developing pad impregnated with the solution, a method of dipping the printing plate in a vat filled with the surface controlling solution and thereby coating the solution, or a method of coating the solution using an automatic coater may be used. After the coating, the amount of surface controlling solution coated is preferably rendered uniform using a squeegee or a squeegee roller. By doing so, more advantageous results can be obtained.

In general, the amount of surface controlling solution coated is suitably from 0.03 to 0.8 g/$m^2$ (dry weight).

After the coating of surface controlling agent, the lithographic printing plate is dried, if desired, and then heated to a high temperature by a burning processor (for example, a burning processor "BP-1300", available from Fuji Photo Film Co., Ltd.). At this time, the heating temperature and the heating time preferably from 180 to 300° C. and from 1 to 20 minutes, respectively, though it may vary depending on the kind of components constituting the image.

After the burning treatment, the lithographic printing plate may be appropriately subjected to, if desired, conventional treatments such as water washing and gumming. However, in the case of using a surface controlling solution containing a water-soluble polymer compound or the like, a so-called desensitization treatment such as gumming may be omitted.

The lithographic printing plate obtained through these treatments is mounted on an off-set printer or the like and used for printing a large number of sheets.

EXAMPLES

The present invention is described in greater detail below by referring to the Examples, however, the present invention should not be construed as being limited thereto.

Preparation of Aluminum Plate [1] Having Polymer Complex Layer

A 0.30 mm-thick aluminum plate (constructive material 1050) was decreased by washing the plate with trichloroethylene, subjected to graining of the surface thereof using a nylon blush and a water suspension of 400-mesh pumicestone, and then washed with water. This plate was etched by dipping it in a 25 wt % aqueous sodium hydroxide solution at 45° C. for 9 seconds, washed with water, dipped in 2° nitric acid for 20 seconds, and again washed with water. At this time, the etching amount on the grained surface was about 3 g/$m^2$. Thereafter, this plate was d.c. anodized at a current density of 15 A/$dm^2$ in 7% sulfuric acid as the electrolytic solution to form an anodic oxide film of 3 g/$m^2$, and then washed with water and dried. The aluminum plate obtained was dipped in a 2/5 wt % aqueous solution of No. 3 sodium silicate (i.e., sodium tetra-silicate) (70° C.) for 14 seconds and then washed with water and dried.

On the thus-treated aluminum plate, Solution [1] prepared to have the following composition was applied by rotation coating at a rotation number of 150 rpm and then dried at 80° C. for 3 minutes. At this time, the amount of solid contents coated was 1.2 g/$m^2$. The aluminum plate obtained was measured on the infrared ray absorption spectrum, then, absorption assignable to sulfonic acid ester was observed at from 1,400 to 1,300 $cm^{-1}$.

| Solution [1] | |
|---|---|
| Polymer Electrolyte (1) | 1.288 g |
| Infrared Absorbent (1) | 0.236 g |
| Acetonitrile | 48 g |

The aluminum plate obtained as above was heated at 170° C. for 3 minutes, then, the absorption assignable to sulfonic acid ester at from 1,400 to 1,300 $cm^{-1}$ disappeared and absorption assignable to sulfonic acid appeared at from 1,100 to 950 $cm^{-1}$. The heat-treated aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

From these results, it is considered that the sulfonic acid ester group in Polymer Electrolyte (1) was decomposed by the heat treatment and became sulfonic acid group and this sulfonic acid group formed an ion pair with the ammonium group present in Polymer Electrolyte (1), whereby Polymer Electrolytes (1) were ion bridged. Thus, Aluminum Plate [1] having a polymer complex layer was prepared.

The contact angle with water on the surface of polymer complex layer of Aluminum Plate [1] having a polymer complex layer was measured and found to be 68° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [2] Having Polymer Complex Layer

On an aluminum plate treated in the same manner as in the preparation of Aluminum Plate [1] having a polymer complex layer, Solution [2] prepared to have the following composition was applied by rotation coating at a rotation number of 150 rpm and then dried at 80° C. for 3 minutes. At this time, the amount of solid contents coated was 0.8 g/$m^2$. The aluminum plate obtained was measured on the infrared ray absorption spectrum, then, absorption assignable to sulfonic acid ester was observed at from 1,400 to 1,300 $cm^{-1}$.

| Solution [2] | |
|---|---|
| Polymer Electrolyte (2) | 2.78 g |
| Acetonitrile | 48 g |

The aluminum plate obtained as above was heated at 130° C. for 3 minutes, then, the absorption assignable to sulfonic acid ester at from 1,400 to 1,300 $cm^{-1}$ disappeared and absorption assignable to sulfonic acid appeared at from 1,100 to 950 $cm^{-1}$. The heat-treated aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent. Thus, Aluminum Plate [2] having a polymer complex layer was prepared.

The contact angle with water on the surface of polymer complex layer of Aluminum Plate [2] having a polymer complex layer was measured and found to be 62° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [3] Having Polymer Complex Layer

On an aluminum plate treated in the same manner as in the preparation of Aluminum Plate [1] having a polymer complex layer, Solution [3] prepared to have the following composition was applied by rotation coating at a rotation number of 150 rpm and then dried at 80° C. for 3 minutes. At this time, the amount of solid contents coated was 1.0 $g/m^2$. The aluminum plate obtained was measured on the infrared ray absorption spectrum, then, absorption assignable to carboxylic acid ester was observed at from 1,800 to 1,700 $cm^{-1}$ and from 1,300 to 1,200 $cm^{-1}$.

| Solution [3] | |
|---|---|
| Polymer Electrolyte (3) | 2.01 g |
| Polymer Electrolyte Precursor (1) | 1.55 g |
| Infrared Absorbent (2) | 0.236 g |
| Acid-generating agent: Diphenyliodonium anthraquinone sulfonate | 0.10 g |
| Acetonitrile | 30 g |
| Distilled water | 18 g |

The aluminum plate obtained as above was entirely exposed by a high-pressure mercury lamp and then heated at 120° C. for 3 minutes, then, the absorption assignable to carboxylic acid ester at from 1,800 to 1,700 $cm^{-1}$ and from 1,300 to 1,200 $cm^{-1}$ disappeared and absorption assignable to carboxylic acid appeared at from 1,800 to 1,700 $cm^{-1}$. The heat-treated aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

From these results, it is considered that the carboxylic acid ester group in Polymer Electrolyte Precursor (1) was thermally decomposed by the heat treatment using the acid generated from the acid-generating agent as a catalyst and became carboxylic acid group and this carboxylic acid group formed an ion pair with the ammonium group present in Polymer Electrolyte (3), whereby polymer electrolytes were ion bridged. Thus, Aluminum Plate [3] having a polymer complex layer was prepared.

The contact angle with water on the surface of polymer complex layer of Aluminum Plate [3] having a polymer complex layer was measured and found to be 65° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [4] Having Polymer Complex Layer

On an aluminum plate treated in the same manner as in the preparation of Aluminum Plate [1] having a polymer complex layer, Solution [4] prepared to have the following composition was applied by rotation coating at a rotation number of 150 rpm and then dried at 120° C. for 3 minutes.

| Solution [4] | |
|---|---|
| Polymer Electrolyte Precursor (2) | 0.128 g |
| Polymer Electrolyte Precursor (3) | 0.276 g |
| Infrared Absorbent IR-125 (produced by Wako Junyaku K.K.) | 0.236 g |
| Fluorine-based surface active agent: Megafac F-177, produced by Dai-Nippon Ink & Chemicals, Inc. | 0.06 g |
| Acetonitrile | 48 g |

The aluminum plate obtained as above was measured on the infrared ray absorption spectrum, then, absorption assignable to sulfonic acid salt was observed at from 1,100 to 950 $cm^{-1}$. The dried aluminum plate was dipped in tetrahydrofuran, ethylene dichloride, cyclohexanone, methyl ethyl ketone, acetone methanol, ethanol, ethylene glycol monomethyl ether, ethylene glycol monoethyl ether, 2-methoxyethyl acetate, diethylene glycol dimethyl ether, 2-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

From these results, it is considered that the sulfonic acid ester group in Polymer Electrolyte Precursor (3) and the pyridine group in Polymer Electrolyte Precursor (2) undertook a nucleophilic displacement reaction by the heat treatment to form pyridinium sulfonate and thereby polymer electrolytes were ion bridged. Thus, Aluminum Plate [4] having a polymer complex layer was prepared.

An appropriate amount of negative PS developing ink produced by Fuji Photo Film Co., Ltd. was placed on the surface of polymer complex layer of Aluminum Plate [4] having a polymer complex layer and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [5] Having Polymer Complex Layer

On an aluminum plate treated in the same manner as in the preparation of Aluminum Plate [1] having a polymer complex layer, Solution [5] prepared to have the following composition was applied by means of Rod Bar #10 and then dried at 120° C. for 3 minutes.

| Solution [5] | |
|---|---|
| Polymer Electrolyte Precursor (4) | 1.218 g |
| Polymer Electrolyte Precursor (5) | 0.810 g |
| Infrared Absorbent (1) | 0.236 g |
| Fluorine-based surface active agent: Megafac F-177, produced by Dai-Nippon Ink & Chemicals, Inc. | 0.06 g |
| Acetonitrile | 48 g |

The aluminum plate obtained as above was measured on the infrared ray absorption spectrum, then, absorption assignable to sulfonic acid salt was observed at from 1,100 to 950 $cm^{-1}$. The dried aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

From these results, it is considered that the sulfonic acid ester group in Polymer Electrolyte Precursor (4) and the amino group in Polymer Electrolyte Precursor (5) undertook a nucleophilic displacement reaction by the heat treatment to form ammonium sulfonate and thereby polymer electrolytes were ion bridged. Thus, Aluminum Plate [5] having a polymer complex layer was prepared.

An appropriate amount of negative PS developing ink produced by Fuji Photo Film Co., Ltd. was placed on the surface of polymer complex layer of Aluminum Plate [5] having a polymer complex layer and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [6] Having Polymer Complex Layer

On an aluminum plate treated in the same manner as in the preparation of Aluminum Plate [1] having a polymer complex layer, Solution [6] prepared to have the following composition and shook in a paint shaker for 1 hour was applied by means of Rod Bar #10 and then dried at 80° C. for 3 minutes. At this time, the amount of solid contents coated was 1.2 $g/m^2$. The thus-obtained aluminum plate was measured on the infrared absorption spectrum, then, absorption assignable to sulfonic acid ester was observed at from 1,400 to 1,300 $cm^{-1}$.

| Solution [6] | |
|---|---|
| Polymer Electrolyte (1) | 3.56 g |
| Infrared Absorbent (2) | 0.236 g |
| Silica gel particle Silysia #445 (produced by Fuji Silysia Chemical Co., Ltd.) | 0.5 g |
| Glass beads | 5.0 g |
| Acetonitrile | 48 g |

The aluminum plate obtained as above was heated at 170° C. for 3 minutes, then, absorption assignable to sulfonic acid ester at from 1,400 to 1,300 $cm^{-1}$ disappeared and absorption assignable to sulfonic acid appeared at from 1,100 to 950 $cm^{-1}$. The heat-treated aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

From these results, it is considered that the sulfonic acid ester group in Polymer Electrolyte (1) was decomposed by the heat treatment and became sulfonic acid group and this sulfonic acid group formed an ion pair with the ammonium group present in Polymer Electrolyte (1), whereby Polymer Electrolytes (1) were ion bridged. Thus, Aluminum Plate [6] having a polymer complex layer was prepared.

The contact angle with water on the surface of polymer complex layer of Aluminum Plate [6] having a polymer complex layer was measured and found to be 72° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [7] Having Polymer Complex Layer

On an aluminum plate treated in the same manner as in the preparation of Aluminum Plate [1] having a polymer complex layer, Solution [7] prepared to have the following composition was applied by rotation coating at a rotation number of 150 rpm and then dried at 80° C. for 3 minutes. At this time, the amount of solid contents coated was 0.4 $g/m^2$. The thus-obtained aluminum plate was measured on the infrared absorption spectrum, then, absorption assignable to sulfonic acid ester was observed at from 1,400 to 1,300 $cm^{-1}$.

| Solution [7] | |
|---|---|
| Polymer Electrolyte Precursor (6) | 0.533 g |
| Polymer Electrolyte (4) | 0.755 g |
| Infrared Absorbent (1) | 0.236 g |
| Acetonitrile | 48 g |

The aluminum plate obtained as above was heated at 130° C. for 3 minutes, then, absorption assignable to sulfonic acid ester at from 1,400 to 1,300 $cm^{-1}$ disappeared and absorption assignable to sulfonic acid appeared at from 1,100 to 950 $cm^{-1}$. The heat-treated aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

Thus, Aluminum Plate [7] having a polymer complex layer was prepared. The contact angle with water on the surface of polymer complex layer of Aluminum Plate [7] having a polymer complex layer was measured and found to be 67° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [8] Having Polymer Complex Layer

A 0.30 mm-thick aluminum plate (constructive material 1050) was decreased by washing the plate with trichloroethylene, subjected to graining of the surface thereof using a nylon blush and a water suspension of 400-mesh Purmicestone, and then thoroughly washed with water. This plate was etched by dipping it in a 25 wt % aqueous sodium hydroxide solution at 45° C. for 9 seconds, washed with water, dipped in 2% nitric acid for 20 seconds, and again washed with water. At this time, the etching amount on the grained surface was about 3 $g/m^2$. Thereafter, this plate was d.c. anodized at a current density of 15 $A/dm^2$ in 7% sulfuric acid as the electrolytic solution to form an anodic oxide film of 3 $g/m^2$, and then washed with water and dried.

On the thus-treated aluminum plate, Solution [8] prepared to have the following composition was applied by rotation coating at a rotation number of 150 rpm and then dried at 80° C. for 3 minutes. At this time, the amount of solid contents coated was 1.2 $g/m^2$. The aluminum plate obtained was measured on the infrared ray absorption spectrum, then, absorption assignable to sulfonic acid ester was observed at from 1,400 to 1,300 $cm^{-1}$.

| Solution [8] | |
|---|---|
| Polymer Electrolyte (1) | 1.288 g |
| Infrared Absorbent (1) | 0.236 g |
| Acetonitrile | 48 g |

The aluminum plate obtained as above was heated at 170° C. for 3 minutes, then, the absorption assignable to sulfonic acid ester at from 1,400 to 1,300 $cm^{-1}$ disappeared and absorption assignable to sulfonic acid appeared at from 1,100 to 950 $cm^{-1}$. The heat-treated aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

From these results, it is considered that the sulfonic acid ester group in Polymer Electrolyte (1) was decomposed by the heat treatment and became sulfonic acid group and this sulfonic acid group formed an ion pair with the ammonium group present in Polymer Electrolyte (1), whereby Polymer Electrolytes (1) were ion bridged. Thus, Aluminum Plate [8] having a polymer complex layer was prepared.

The contact angle with water on the surface of polymer complex layer of Aluminum Plate [8] having a polymer complex layer was measured and found to be 68° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [9] Having Polymer Complex Layer

On an aluminum plate treated in the same manner as in the preparation of Aluminum Plate [8] having a polymer complex layer, Solution [9] prepared to have the following composition was applied by rotation coating at a rotation number of 150 rpm and then dried at 80° C. for 3 minutes. At this time, the amount of solid contents coated was 0.8 g/$m^2$. The aluminum plate obtained was measured on the infrared ray absorption spectrum, then, absorption assignable to sulfonic acid ester was observed at from 1,400 to 1,300 $cm^{-1}$.

| Solution [9] | |
|---|---|
| Polymer Electrolyte (2) | 2.78 g |
| Acetonitrile | 48 g |

The aluminum plate obtained as above was heated at 130° C. for 3 minutes, then, the absorption assignable to sulfonic acid ester at from 1,400 to 1,300 $cm^{-1}$ disappeared and absorption assignable to sulfonic acid appeared at from 1,100 to 950 $cm^{-1}$. The heat-treated aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent. Thus, Aluminum Plate [9] having a polymer complex layer was prepared.

The contact angle with water on the surface of polymer complex layer of Aluminum Plate [9] having a polymer complex layer was measured and found to be 62° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [10] Having Polymer Complex Layer

On an aluminum plate treated in the same manner as in the preparation of Aluminum Plate [8] having a polymer complex layer, Solution [10] prepared to have the following composition was applied by rotation coating at a rotation number of 150 rpm and then dried at 80° C. for 3 minutes. At this time, the amount of solid contents coated was 1.0 g/$m^2$. The aluminum plate obtained was measured on the infrared ray absorption spectrum, then, absorption assignable to carboxylic acid ester was observed at from 1,800 to 1,700 $cm^{-1}$ and from 1,300 to 1,200 $cm^{-1}$.

| Solution [10] | |
|---|---|
| Polymer Electrolyte (3) | 2.01 g |
| Polymer Electrolyte Precursor (1) | 1.55 g |
| Infrared Absorbent (2) | 0.236 g |
| Acid-generating agent: Diphenyliodonium anthraquinone sulfonate | 0.10 g |
| Acetonitrile | 30 g |
| Distilled water | 18 g |

The aluminum plate obtained as above was entirely exposed by a high-pressure mercury lamp and then heated at 120° C. for 3 minutes, then, the absorption assignable to carboxylic acid ester at from 1,800 to 1,700 $cm^{-1}$ and from 1,300 to 1,200 $cm^{-1}$ disappeared and absorption assignable to carboxylic acid appeared at from 1,800 to 1,700 $cm^{-1}$. The heat-treated aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

From these results, it is considered that the carboxylic acid ester group in Polymer Electrolyte Precursor (1) was thermally decomposed by the heat treatment using the acid generated from the acid-generating agent as a catalyst and became carboxylic acid group and this carboxylic acid group formed an ion pair with the ammonium group present in Polymer Electrolyte (3), whereby polymer electrolytes were ion bridged. Thus, Aluminum Plate [10] having a polymer complex layer was prepared.

The contact angle with water on the surface of polymer complex layer of Aluminum Plate [10] having a polymer complex layer was measured and found to be 65° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [11] Having Polymer Complex Layer

On an aluminum plate treated in the same manner as in the preparation of Aluminum Plate [8] having a polymer complex layer, Solution [11] prepared to have the following composition was applied by rotation coating at a rotation number of 150 rpm and then dried at 120° C. for 3 minutes.

| Solution [11] | |
|---|---|
| Polymer Electrolyte Precursor (2) | 0.128 g |
| Polymer Electrolyte Precursor (3) | 0.276 g |
| Infrared Absorbent IR-125 (produced by Wako Junyaku K.K.) | 0.236 g |
| Fluorine-based surface active agent: Megafac F-177, produced by Dai-Nippon Ink & Chemicals, Inc. | 0.06 g |
| Acetonitrile | 48 g |

The aluminum plate obtained as above was measured on the infrared ray absorption spectrum, then, absorption assignable to sulfonic acid salt was observed at from 1,100 to 950 $cm^{-1}$. The dried aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

From these results, it is considered that the sulfonic acid ester group in Polymer Electrolyte Precursor (3) and the pyridine group in Polymer Electrolyte Precursor (2) undertook a nucleophilic displacement reaction by the heat treatment to form pyridinium sulfonate and thereby polymer electrolytes were ion bridged. Thus, Aluminum Plate [11] having a polymer complex layer was prepared.

An appropriate amount of negative PS developing ink produced by Fuji Photo Film Co., Ltd. was placed on the surface of polymer complex layer of Aluminum Plate [11] having a polymer complex layer and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [12] Having Polymer Complex Layer

On an aluminum plate treated in the same manner as in the preparation of Aluminum Plate [8] having a polymer complex layer, Solution [12] prepared to have the following composition was applied by means of Rod Bar #10 and then dried at 120° C. for 3 minutes.

| Solution [12] | |
|---|---|
| Polymer Electrolyte Precursor (4) | 1.218 g |
| Polymer Electrolyte Precursor (5) | 0.810 g |
| Infrared Absorbent (1) | 0.236 g |
| Fluorine-based surface active agent: Megafac F-177, produced by Dai-Nippon Ink & Chemicals, Inc. | 0.06 g |
| Acetonitrile | 48 g |

The aluminum plate obtained as above was measured on the infrared ray absorption spectrum, then, absorption assignable to sulfonic acid salt was observed at from 1,100 to 950 $cm^{-1}$. The dried aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or IN hydrochloric acid, for 1 minute and again measured on the infrared ray absorption spectrum. Then, the infrared ray absorption spectrum was not changed by the dipping in any solvent.

From these results, it is considered that the sulfonic acid ester group in Polymer Electrolyte Precursor (4) and the amino group in Polymer Electrolyte Precursor (5) undertook a nucleophilic displacement reaction by the heat treatment to form ammonium sulfonate and thereby polymer electrolytes were ion bridged. Thus, Aluminum Plate [12] having a polymer complex layer was prepared.

An appropriate amount of negative PS developing ink produced by Fuji Photo Film Co., Ltd. was placed on the surface of polymer complex layer of Aluminum Plate [12] having a polymer complex layer and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [13] Having Polymer Complex Layer

On an aluminum plate treated in the same manner as in the preparation of Aluminum Plate [8] having a polymer complex layer, Solution [13] prepared to have the following composition and shook in a paint shaker for 1 hour was applied by means of Rod Bar #10 and then dried at 80° C. for 3 minutes. At this time, the amount of solid contents coated was 1.2 $g/m^2$. The thus-obtained aluminum plate was measured on the infrared absorption spectrum, then, absorption assignable to sulfonic acid ester was observed at from 1,400 to 1,300 $cm^{-1}$.

| Solution [13] | |
|---|---|
| Polymer Electrolyte (1) | 3.56 g |
| Infrared Absorbent (2) | 0.236 g |
| Silica gel particle Silysia #445 (produced by Fuji Silysia Chemical Co., Ltd.) | 0.5 g |
| Glass beads | 5.0 g |
| Acetonitrile | 48 g |

The aluminum plate obtained as above was heated at 170° C. for 3 minutes, then, absorption assignable to sulfonic acid ester at from 1,400 to 1,300 $cm^{-1}$ disappeared and absorption assignable to sulfonic acid appeared at from 1,100 to 950 $cm^{-1}$. The heat-treated aluminum plate was dipped in tetrahydrofuran, ethylene dichloride, cyclo hexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Film Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent.

From these results, it is considered that the sulfonic acid ester group in Polymer Electrolyte (1) was decomposed by the heat treatment and became sulfonic acid group and this sulfonic acid group formed an ion pair with the ammonium group present in Polymer Electrolyte (1), whereby Polymer Electrolytes (1) were ion bridged. Thus, Aluminum Plate [13] having a polymer complex layer was prepared.

The contact angle with water on the surface of polymer complex layer of Aluminum Plate [13] having a polymer complex layer was measured and found to be 72° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Aluminum Plate [14] Having Polymer Complex Layer

On an aluminum plate treated in the same manner as in the preparation of Aluminum Plate [8] having a polymer complex layer, Solution [14] prepared to have the following composition was applied by rotation coating at a rotation number of 150 rpm and then dried at 80° C. for 3 minutes. At this time, the amount of solid contents coated was 0.4 g/m$^2$. The thus-obtained aluminum plate was measured on the infrared absorption spectrum, then, absorption assignable to sulfonic acid ester was observed at from 1,400 to 1,300 cm$^{-1}$.

| Solution [14] | |
|---|---|
| Polymer Electrolyte Precursor (6) | 0.533 g |
| Polymer Electrolyte (4) | 0.755 g |
| Infrared Absorbent (1) | 0.236 g |
| Accetonitrile | 48 g |

The aluminum plate obtained as above was heated at 130° C. for 3 minutes, then, absorption assignable to sulfonic acid ester at from 1,400 to 1,300 cm$^{-1}$ disappeared and absorption assignable to sulfonic acid appeared at from 1,100 to 950 cm$^{-1}$. The heat-treated aluminum plate was dipped in tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propylacetate, N,N-dimethylformamide, N,N-dimethylacetamide, toluene, ethyl acetate, ethyl lactate, methyl lactate, dimethyl sulfoxide, distilled water, developer DP-4 produced by Fuji Photo Fil Co., Ltd./distilled water (1/6) diluted solution, or 1N hydrochloric acid, for 1 minute and again measured on the infrared ray absorption spectrum. Then, the infrared ray absorption spectrum was not changed by the dipping in any solvent. Thus, Aluminum Plate [14] having a polymer complex layer was prepared.

The contact angle with water on the surface of polymer complex layer of Aluminum Plate [14] having a polymer complex layer was measured and found to be 67° at 23° C. Also, an appropriate amount of negative PS developing ink produced by Fuji Photo Film Co., Ltd. was placed on the surface of polymer complex layer of the same aluminum plate and rubbed with a sponge. Then, the surface was inked when weakly rubbed but the polymer complex layer came off like the stripping of a film and was not inked when strongly rubbed. The aluminum plate failed in inking was measured on the infrared ray absorption spectrum, as a result, absorption originated in the polymer complex layer was not observed.

Preparation of Lithographic Printing Original Plate (1)

On Aluminum Plate [1] having a polymer complex layer prepared as above, Solution [A] prepared to have the following composition was applied by rotation coating at a rotation number of 150 rpm and dried at 80° C. for 3 minutes. The dry coated weight was 1.0 g/m$^2$. Thus, Lithographic Printing Original Plate (1) was obtained.

| Solution [A] | |
|---|---|
| Positive Polar Conversion Polymer Compound (1) | 2.36 g |
| Methyl ethyl ketone | 30 g |

Preparation of Lithographic Printing Original Plate (2)

On Aluminum Plate [2] having a polymer complex layer prepared as above, Solution [B] prepared to have the following composition was applied by rotation coating at a rotation number of 150 rpm and dried at 80° C. for 3 minutes. The dry coated weight was 1.0 g/m$^2$. Thus, Lithographic Printing Original Plate (2) was obtained.

| Solution [B] | |
|---|---|
| Positive Polar Conversion Polymer Compound (2) | 3.65 g |
| Infrared Absorbent (2) | 0.236 g |
| Acid-generating agent | 0.10 g |
| Diphenyliodonium anthraquinone sulfonate | |
| Methyl ethyl ketone | 30 g |
| 1-Methoxy-2-Propanol | 18 g |

Preparation of Lithographic Printing Original Plate (3)

On Aluminum Plate [3] having a polymer complex layer prepared as above, Solution [C] prepared to have the following composition was applied by rotation coating at a rotation number of 150 rpm and dried at 80° C. for 3 minutes. The dry coated weight was 1.0 g/m$^2$. Thus, Lithographic Printing Original Plate (3) was obtained.

| Solution [C] | |
|---|---|
| Positive Polar Conversion Polymer Compound (3) | 3.65 g |
| Methyl ethyl ketone | 48 g |

Preparation of Lithographic Printing Original Plate (4)

On Aluminum Plate [4] having a polymer complex layer prepared as above, Solution [D] prepared to have the following composition was applied by rotation coating at a rotation number of 150 rpm and dried at 80° C. for 3 minutes. The dry coated weight was 1.0 g/$m^2$. Thus, Lithographic Printing Original Plate (4) was obtained.

| Solution [D] | |
|---|---|
| Positive Polar Conversion Polymer Compound (4) | 3.65 g |
| Acid-generating agent | 0.10 g |
| Diphenyliodonium anthraquinone sulfonate | |
| Methyl ethyl ketone | 30 g |
| 1-Methoxy-2-Propanol | 18 g |

Preparation of Lithographic Printing Original Plate (5)

On Aluminum Plate [5] having a polymer complex layer prepared as above, Solution [E] prepared to have the following composition was applied by rotation coating at a rotation number of 150 rpm and dried at 80° C. for 3 minutes. The dry coated weight was 1.2 g/$m^2$. Thus, Lithographic Printing Original Plate (5) was obtained.

| Solution [E] | |
|---|---|
| Positive Polar Conversion Polymer Compound (5) | 3.65 g |
| Dye obtained by converting the counter ion of Victoria Pure Blue BOH into 1-naphthalene-sulfonic acid | 0.05 g |
| Acetonitrile | 48 g |

Preparation of Lithographic Printing Original Plate (6)

On Aluminum Plate [6] having a polymer complex layer prepared as above, Solution [F] prepared to have the following composition was applied by means of Rod Bar #10 and dried at 80° C. for 3 minutes. The dry coated weight was 1.2 c/$m^2$. Thus, Lithographic Printing Original Plate (6) was obtained.

| Solution [F] | |
|---|---|
| Positive Polar Conversion Polymer Compound (6) | 3.65 g |
| Dye obtained by converting the counter ion of Victoria Pure Blue BOH into 1-naphthalene-sulfonic acid | 0.05 g |
| Methyl ethyl ketone | 30 g |
| 1-Methoxy-2-propanol | 18 g |

Preparation of Lithographic Printing Original Plate (7)

On Aluminum Plate [7] having a polymer complex layer prepared as above, Solution [G] prepared to have the following composition was applied by means of Rod Bar #10 and dried at 80° C. for 3 minutes. The dry coated weight was 0.9 g/$^2$. Thus, Lithographic Printing Original Plate (7) was obtained.

| Solution [G] | |
|---|---|
| Positive Polar Conversion Polymer Compound (1) | 2.78 g |
| Dye obtained by converting the counter ion of Victoria Pure Blue BOH into 1-naphthalene-sulfonic acid | 0.05 g |
| Fluorine-based surface active agent: Megafac F-177, produced by Dai-Nippon Ink & Chemicals, Inc. | 0.05 g |
| Methyl ethyl ketone | 30 g |
| 1-Methoxy-2-propanol | 18 g |

Preparation of Lithographic Printing Original Plate (8)

On Aluminum Plate [8] having a polymer complex layer prepared as above, Solution [H] prepared to have the following composition was applied by rotation coating at a rotation number of 150 rpm and dried at 80° C. for 3 minutes. The dry coated weight was 1.2 g/$m^2$. Thus, Lithographic Printing Original Plate (8) was obtained.

| Solution [H] | |
|---|---|
| Positive Polar Conversion Polymer Compound (5) | 3.65 g |
| Dye obtained by converting the counter ion of Victoria Pure Blue BOH into 1-naphthalene-sulfonic acid | 0.05 g |
| Acetonitrile | 48 g |

Preparation of Lithographic Printing Original Plate (9)

On Aluminum Plate [1] having a polymer complex layer prepared as above, Solution [I] prepared to have the following composition was applied by rotation coating at a rotation number of 150 rpm and dried at 80° C. for 3 minutes. The dry coated weight was 1.2 g/$m^2$. Thus, Lithographic Printing Original Plate (9) was obtained.

| Solution [I] | |
|---|---|
| Positive Polar Conversion Polymer Compound (1) | 3.65 g |
| Infrared Absorbent (1) | 0.10 g |
| Dye obtained by converting the counter ion of Victoria Pure Blue BOH into 1-naphthalene-sulfonic acid | 0.05 g |
| Acetonitrile | 48 g |

Preparation of Lithographic Printing Original Plate (10)

On Aluminum Plate [10] having a polymer complex layer prepared as above, Solution [J] prepared to have the following composition was applied to have a coated amount of 1.0 g/$m^2$. Thus, Lithographic Printing Original Plate (10) was obtained.

| Solution [J] | |
|---|---|
| m,p-Cresol novolak (m/p ratio: 6/4, weight average molecular weight: 3,500, containing 0.5 wt % of unreacted cresol) * aqueous alkali solution-soluble polymer compound | 1.0 g |
| Dye obtained by converting the counter ion of Victoria Pure Blue BOH into 1-naphthalene-sulfonic acid | 0.02 g |
| Fluorine-based surface active agent: Megafac F-177, produced by Dai-Nippon Ink & Chemicals, Inc. | 0.05 g |
| γ-Butyrolactone | 3 g |
| Methyl ethyl ketone | 8 g |
| 1-Methoxy-2-propanol | 7 g |

Preparation of Lithographic Printing Original Plate (11)

On Aluminum Plate [9] having a polymer complex layer prepared as above, Solution [K] prepared to have the following composition was applied to have a coated amount of 1.8 g/$m^2$. Thus, Lithographic Printing Original Plate (11) was obtained.

| Solution [K] | |
|---|---|
| Alkali Aqueous Solution-Soluble Polymer Compound (1) | 11.0 g |
| Infrared Absorbent (2) | 0.1 g |
| Dye obtained by converting the counter ion of Victoria Pure Blue BOH into 1-naphthalene-sulfonic acid | 0.02 g |
| Fluorine-based surface active agent: Megafac F-177, produced by Dai-Nippon Ink & Chemicals, Inc. | 0.05 g |
| γ-Butyrolactone | 8 g |
| Methyl ethyl ketone | 8 g |
| 1-Methoxy-2-propanol | 4 g |

Preparation of Lithographic Printing Original Plate (12)

On Aluminum Plate [11] having a polymer complex layer prepared as above, Solution (L) prepared to have the following composition was applied to have a coated amount of 1.0 g/$m^2$. Thus, Lithographic Printing Original Plate (12) was obtained.

| Solution [L] | |
|---|---|
| m,p-Cresol novolak (m/p ratio: 6/4, weight average molecular weight: 3,500, containing 0.5 wt % of unreacted cresol) * aqueous alkali solution-soluble polymer compound | 1.0 g |
| Infrared Absorbent IR-125 (produced by Wako Junyaku K.K.) | 0.2 g |
| Dye obtained by converting the counter ion of Victoria Pure Blue BOH into 1-naphthalene-sulfonic acid | 0.02 g |
| Fluorine-based surface active agent: Megafac F-177, produced by Dai-Nippon Ink & Chemicals, Inc. | 0.05 g |
| γ-Butyrolactone | 3 g |
| Methyl ethyl ketone | 8 g |
| 1-Methoxy-2-propanol | 7 g |

Preparation of Lithographic Printing Original Plate (13)

On Aluminum Plate [5] having a polymer complex layer prepared as above, Solution [M] prepared to have the following composition was applied to have a coated amount of 1.8 g/$m^2$. Thus, Lithographic Printing Original Plate (13) was obtained.

| Solution [M] | |
|---|---|
| Alkali Aqueous Solution-Soluble Polymer Compound (1) | 11.0 g |
| Infrared Absorbent (2) | 0.1 g |
| Dye obtained by converting the counter ion of Victoria Pure Blue BOH into 1-naphthalene-sulfonic acid | 0.02 g |
| Fluorine-based surface active agent: Megafac F-177, produced by Dai-Nippon Ink & Chemicals, Inc. | 0.05 g |
| γ-Butyrolactone | 8 g |
| Methyl ethyl ketone | 8 g |
| 1-Methoxy-2-propanol | 4 g |

Preparation of Lithographic Printing Original Plate (14)

On Aluminum Plate [1] having a polymer complex layer prepared as above, Solution [N] prepared to have the following composition was applied and dried at 100° C. for 2 minutes. The dry coated weight was 1.1 g/$m^2$. Thus, Lithographic Printing Original Plate (14) was obtained.

| Solution [N] | |
|---|---|
| Negative Polar Conversion Polymer Compound (1) | 1.0 g |
| Fluorine-based surface active agent: Megafac F-177, produced by Dai-Nippon Ink & Chemicals, Inc. | 0.05 g |
| Methyl ethyl ketone | 20 g |
| Methanol | 7 g |

Preparation of Lithographic Printing Original Plate (15)

On Aluminum Plate [2] having a polymer complex layer prepared as above, Solution [O] prepared to have the following composition was applied and dried at 100° C. for 2 minutes. The dry coated weight was 1.1 g/$m^2$. Thus, Lithographic Printing Original Plate (15) was obtained.

| Solution [O] | |
|---|---|
| Negative Polar Conversion Polymer Compound (2) | 1.0 g |
| Infrared Absorbent (2) | 0.15 g |
| Fluorine-based surface active aqent: Megafac F-177, produced by Dai-Nippon Ink Chemicals, Inc. | 0.05 g |
| Methyl ethyl ketone | 20 g |
| Methanol | 7 g |

Preparation of Lithographic Printing Original Plate (16)

On Aluminum Plate [3] having a polymer complex layer prepared as above, Solution [P] prepared to have the following composition was applied and dried at 100° C. for 2 minutes. The dry coated weight was 1.0 g/$m^2$. Thus, Lithographic Printing Original Plate (16) was obtained.

| Solution [P] | |
|---|---|
| Negative Polar Conversion Polymer Compound (3) | 1.0 g |
| Infrared Absorbent (2) | 0.15 g |
| Fluorine-based surface active agent: Megafac F-177, produced by Dai-Nippon Ink & Chemicals, Inc. | 0.05 g |
| Methyl ethyl ketone | 20 g |
| Methanol | 7 g |

Preparation of Lithographic Printing Original Plate (17)

On Aluminum Plate [4] having a polymer complex layer prepared as above, Solution [Q] prepared to have the following composition was applied and dried at 100° C. for 2 minutes. The dry coated weight was 1.2 g/$m^2$. Thus, Lithographic Printing Original Plate (17) was obtained.

| Solution [Q] | |
|---|---|
| Negative Polar Conversion Polymer Compound (4) | 1.0 g |
| Fluorine-based surface active agent: Megafac F-177, produced by Dai-Nippon Ink & Chemicals, Inc. | 0.05 g |
| Methyl ethyl ketone | 20 g |
| Methanol | 7 g |

Preparation of Lithographic Printing Original Plate (18)

On Aluminum Plate [7] having a polymer complex layer prepared as above, Solution [R] prepared to have the following composition was applied and dried at 100° C. for 2 minutes. The dry coated weight was 1.0 g/$m^2$. Thus, Lithographic Printing Original Plate (18) was obtained.

| Solution [R] | |
|---|---|
| Negative Polar Conversion Polymer Compound (5) | 1.0 g |
| Dye obtained by converting the counter ion of Victoria Pure Blue BOH into 1-napththalene-sulfonic acid | 0.05 g |
| Fluorine-based surface active agent: Megafac F-177, produced by Dai-Nippon Ink & Chemicals, Inc. | 0.05 g |
| Methyl ethyl ketone | 20 g |
| Methanol | 7 g |

Preparation of Lithographic Printing Original Plate (19)

On Aluminum Plate [12] having a polymer complex layer prepared as above, Solution [S] prepared to have the following composition was applied and dried at 100° C. for 1 minute. The dry coated weight was 1.2 g/$m^2$. Thus, Lithographic Printing Original Plate (19) was obtained.

| Solution [S] | |
|---|---|
| Novolak resin obtained from phenol and formaldehyde (weight average molecular weight: 10,000) aqueous alkali solution-soluble resin | 1.5 g |
| Cross-Linking Agent (1) | 0.50 g |
| Acid-Generating Agent (1) | 0.15 g |
| Fluorine-based surface active agent: Megafac F-177, produced by Dai-Nippon Ink & Chemicals, Inc. | 0.03 g |
| Methyl ethyl ketone | 15 g |
| 1-Methoxy-2-propanol | 10 g |
| Fluorine-based surface active agent: Megafac F-177, produced by Dai-Nippon Ink & Chemicals, Inc. | 0.03 g |
| Methanol | 5 g |

Preparation of Lithographic Printing Original Plate (20)

On Aluminum Plate [13] having a polymer complex layer prepared as above, Solution [T] prepared to have the following composition was applied and dried at 100° C. for 1 minute. The dry coated weight was 1.2 g/$m^2$. Thus, Lithographic Printing Original Plate (20) was obtained.

| Solution [T] | |
|---|---|
| Novolak resin obtained from phenol and formaldehyde (weight average molecular weight: 10,000) aqueous alkali solution-soluble resin | 1.5 g |
| Cross-Linking Agent (1) | 0.50 g |
| Acid-Generating Agent (1) | 0.15 g |
| Fluorine-based surface active agent: Megafac F-177, produced by Dai-Nippon Ink & Chemicals, Inc. | 0.03 g |
| Methyl ethyl ketone | 15 g |
| 1-Methoxy-2-propanol | 10 g |
| Fluorine-based surface active agent: Megafac F-177, produced by Dai-Nippon Ink & Chemicals, Inc. | 0.03 g |
| Methanol | 5 g |

Preparation of Lithographic Printing Original Plate (21)

On Aluminum Plate [14] having a polymer complex layer prepared as above, Solution [U] prepared to have the following composition was applied and dried at 100° C. for 1 minute. The dry coated weight was 1.2 g/$m^2$. Thus, Lithographic Printing Original Plate (21) was obtained.

| Solution [U] | |
|---|---|
| Novolak resin obtained from phenol and formaldehyde (weight average molecular weight: 10,000) aqueous alkali solution-soluble resin | 1.5 g |
| Cross-Linking Agent (1) | 0.50 g |
| Infrared Absorbent (2) | 0.10 g |
| Acid-Generating Agent (1) | 0.15 g |
| Fluorine-based surface active agent: Megafac F-177, produced by Dai-Nippon Ink & Chemicals, Inc. | 0.03 g |
| Methyl ethyl ketone | 15 g |

-continued

| Solution [U] | |
|---|---|
| 1-Methoxy-2-propanol | 10 g |
| Fluorine-based surface active agent: | 0.03 g |
| Megafac F-177, produced by Dai-Nippon Ink & Chemicals, Inc. | |
| Methanol | 5 g |

Preparation of Lithographic Printing Original Plate (22)

A 0.30 mm-thick aluminum plate (constructive material 1050) was decreased by washing the plate with trichloroethylene, subjected to graining of the surface thereof using a nylon blush and a water suspension of 400-mesh Purmicestone, and then thoroughly washed with water. This plate was etched by dipping it in a 25 wt % aqueous sodium hydroxide solution at 45° C. for 9 seconds, washed with water, dipped in 2% nitric acid for 20 seconds, and again washed with water. At this time, the etching amount on the grained surface was about 3 g/m$^2$. Thereafter, this plate was d.c. anodized at a current density of 15 A/dm$^2$ in 7% sulfuric acid as the electrolytic solution to form an anodic oxide film of 3 g/m$^2$, and then washed with water and dried. The aluminum plate obtained was dipped in a 2.5 wt % aqueous solution of No. 3 sodium silicate (i.e., sodium tetrasilicate) (70° C.) for 14 seconds and then washed with water and dried.

On the thus-treated aluminum plate, Solution [V] prepared to have the following composition was applied by rotation coating at a rotation number of 150 rpm and then dried at 80° C. for 3 minutes. At this time, the amount of solid contents coated was 1.2 g/m$^2$. Thus, Lithographic Printing Original Plate (22) was obtained.

| Solution [V] | |
|---|---|
| Positive Polar Conversion Polymer Compound (1) | 3.65 g |
| Infrared Absorbent (2) | 0.236 g |
| Methyl ethyl ketone | 24 g |
| Acetonitrile | 24 g |

Preparation of Lithographic Printing Original Plate (23)

A 0.30 mm-thick aluminum plate (constructive material 1050) was decreased by washing the plate with trichloroethylene, subjected to graining of the surface thereof using a nylon blush and a water suspension of 400-mesh Purmicestone, and then thoroughly washed with water. This plate was etched by dipping it in a 25 wt % aqueous sodium hydroxide solution at 45° C. for 9 seconds, washed with water, dipped in 2% nitric acid for 20 seconds, and again washed with water. At this time, the etching amount on the grained surface was about 3 g/m$^2$. Thereafter, this plate was d.c. anodized at a current density of 15 A/dm$^2$ in 7% sulfuric acid as the electrolytic solution to form an anodic oxide film of 3 g/m$^2$, and washed with water and dried.

On the thus-treated aluminum plate, Solution [W] prepared to have the following composition was applied and then dried at 100° C. for 1 minute. At this time, the amount of solid contents coated was 1.8 g/m$^2$. Thus, Lithographic Printing Original Plate (23) was obtained.

| Solution [W] | |
|---|---|
| Alkali Aqueous Solution-Soluble Polymer Compound (1) | 11.0 g |
| Infrared Absorbent (2) | 0.1 g |
| Dye obtained by converting the counter ion of Victoria Pure Blue BOH into 1-napththalene-sulfonic acid | 0.02 g |
| Fluorine-based surface active agent: | 0.05 g |
| Megafac F-177, produced by Dai-Nippon Ink & Chemicals, Inc. | |
| 7-Butyrolactone | 7 g |
| Methyl ethyl ketone | 8 g |
| 1-Methoxy-2-propanol | 4 g |

Preparation of Lithographic Printing Original Plate (24)

A 0.30 mm-thick aluminum plate (constructive material 1050) was decreased by washing the plate with trichloroethylene, subjected to graining of the surface thereof using a nylon blush and a water suspension of 400-mesh Purmistone, and then thoroughly washed with water. This plate was etched by dipping it in a 25 wt % aqueous sodium hydroxide solution at 45° C. for 9 seconds, washed with water, dipped In 2% nitric acid for 20 seconds, and again washed with water. At this time, the etching amount on the grained surface was about 3 g/m$^2$. Thereafter, this plate was d.c. anodized at a current density of 15 A/dm$^2$ in 7% sulfuric acid as the electrolytic solution to form an anodic oxide film of 3 g/m$^2$, and then washed with water and dried.

On the thus-treated aluminum plate, Solution [X] prepared to have the following composition was applied and then dried at 100° C. for 2 minutes. At this time, the amount of solid contents coated was 1.1 g/m$^2$. Thus, Lithographic Printing Original Plate (24) was obtained.

| Solution [X] | |
|---|---|
| Negative Polar Conversion Polymer Compound (1) | 1.0 g |
| Infrared Absorbent (2) | 0.1r g |
| Fluorine-based surface active agent: | 0.05 g |
| Megafac F-177, produced by Dai-Nippon Ink & Chemicals, Inc. | |
| Methyl ethyl ketone | 20 g |
| Methanol | 7 g |

Preparation of Lithographic Printing Original Plate (25)

A 0.30 mm-thick aluminum plate (constructive material 1050) was decreased by washing the plate with trichloroethylene, subjected to gaining of the surface thereof using a nylon blush and a water suspension of 400-mesh Purmistone, and then thoroughly washed with water. This plate was etched by dipping it in a 25 wt % aqueous sodium hydroxide solution at 45° C. for 9 seconds, washed with water, dipped in 2% nitric acid for 20 seconds, and again washed with water. At this time, the etching amount on the grained surface was about 3 g/m$^2$. Thereafter, this plate was d.c. anodized at a current density of 15 A/dm$^2$ in 7% sulfuric acid as the electrolytic solution to form an anodic oxide film of 3 g/m$^2$, and then washed with water and dried.

On the thus-treated aluminum plate, Solution [Y] prepared to have the following composition was applied and then dried at 100° C. for 1 minute. At this time, the amount of solid contents coated was 1.1 $g/m^2$. Thus, Lithographic Printing Original Plate (25) was obtained.

| Solution [Y] | |
|---|---|
| Novolak resin obtained from phenol and formaldehyde (weight average molecular weight: 10,000) aqueous alkali solution-soluble resin | 1.5 g |
| Cross-Linking Agent (1) | 0.50 g |
| Infrared Absorbent (2) | 0.10 g |
| Acid-Generating Agent (1) | 0.15 g |
| Fluorine-based surface active agent: Megafac F-177, produced by Dai-Nippon Ink & Chemicals, Inc. | 0.03 g |
| Methyl ethyl ketone | 15 g |
| 1-Methoxy-2-propanol | 10 g |
| Fluorine-based surface active agent: Megafac F-177, produced by Dai-Nippon Ink & Chemicals, Inc. | 0.03 g |
| Methanol | 5 g |

Preparation of Lithographic Printing Original Plate (26)

A 0.30 mm-thick aluminum plate (constructive material 1050) was decreased by washing the plate with trichloro ethylene, subjected to graining of the surface thereof using a nylon blush and a water suspension of 400-mesh Purmicestone, and then thoroughly washed with water. This plate was etched by dipping it in a 25 wt % aqueous sodium hydroxide solution at 45° C. for 9 seconds, washed with water, dipped in 2% nitric acid for 20 seconds, and again washed with water. At this time, the etching amount on the grained surface was about 3 $g/m^2$. Thereafter, this plate was d.c. anodized at a current density of 15 $A/dm^2$ in 7% sulfuric acid as the electrolytic solution to form an anodic oxide film of 3 $g/m^2$, and then washed with water and dried. The aluminum plate obtained was dipped in a 2.5 wt % aqueous solution of No. 3 sodium silicate (70° C.) for 14 seconds and then washed with water and dried.

On the thus-treated aluminum plate, Solution [15] prepared to have the following composition was applied and then dried at 100° C. for 3 minutes. At this time, the amount of solid contents coated was 0.4 $g/m^2$.

| Solution [15] | |
|---|---|
| Water-Soluble Polymer (1) | 0.404 g |
| Infrared Absorbent (1) | 0.404 g |
| Fluorine-based surface active agent: Megafac F-177, produced by Dai-Nippon Ink & Chemicals, Inc. | 0.03 g |
| 2-Propanol | 8 g |
| Distilled water | 40 g |

On the thus-obtained aluminum plate, Solution [Z] prepared to have the following composition was applied and then dried at 80° C. for 3 minutes. At this time, the amount of solid contents coated was 1.0 $g/m^2$. Thus, Lithographic Printing Original Plate (26) was obtained.

| Solution [Z] | |
|---|---|
| Positive Polar Conversion Polymer Compound (1) | 3.56 g |
| Infrared Absorbent (2) | 0.236 g |
| Methyl ethyl ketone | 24 g |
| Acetonitrile | 24 g |

The polymer electrolytes, polymer electrolyte precursors, infrared absorbent, positive polar conversion polymer compounds, aqueous alkali solution-soluble polymer compounds, negative polar conversion polymer compounds, acid-generating agent, cross-linking agent and water-soluble polymer used above in the preparation of lithographic printing original plates are shown below.

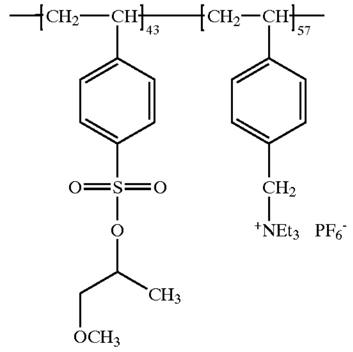

Polymer Electrolyte (1)

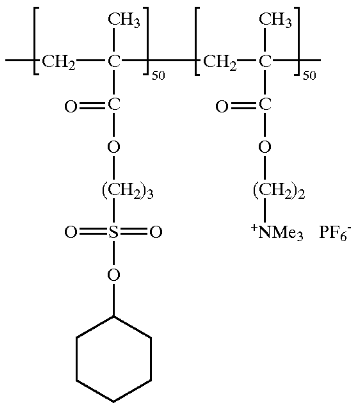

Polymer Electrolyte (2)

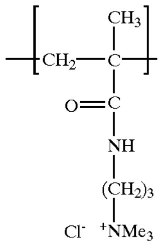

Polymer Electrolyte (3)

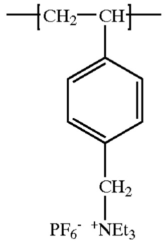

Polymer Electrolyte (4)

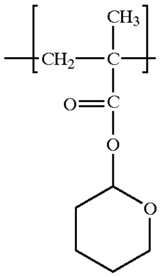

Polymer Electrolyte Precursor (1)

-continued

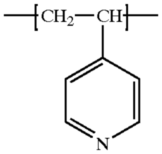

Polymer Electrolyte Precursor (2)

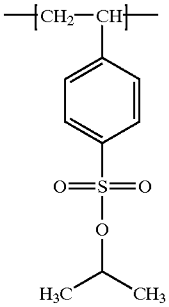

Polymer Electrolyte Precursor (3)

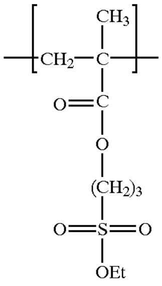

Polymer Electrolyte Precursor (4)

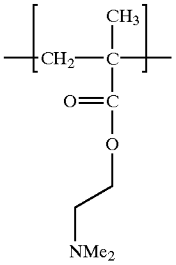

Polymer Electrolyte Precursor (5)

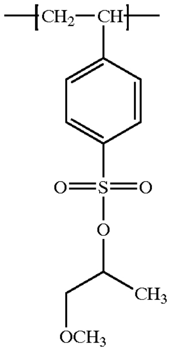

Polymer Electrolyte Precursor (6)

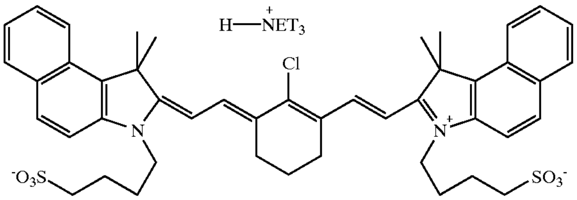

Infrared Absorbent (1)

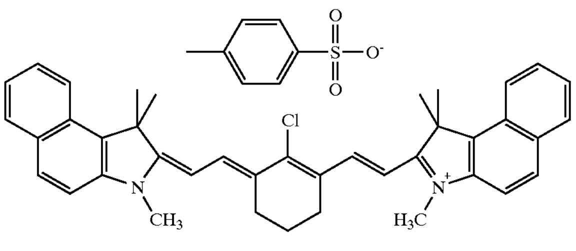

Infrared Absorbent (2)

-continued

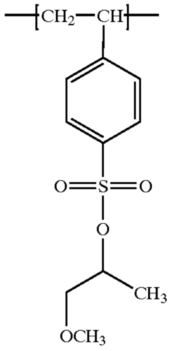

Positive Polar Conversion Polymer Compound (1)

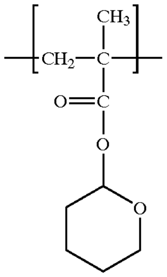

Positive Polar Conversion Polymer Compound (2)

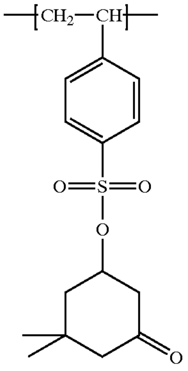

Positive Polar Conversion Polymer Compound (3)

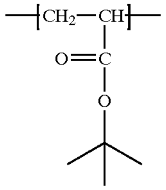

Positive Polar Conversion Polymer Compound (4)

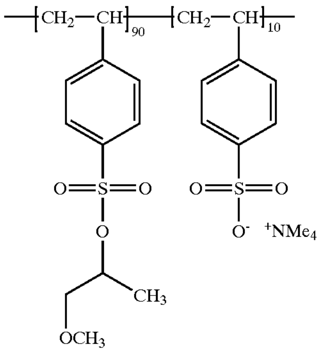

Positive Polar Conversion Polymer Compound (5)

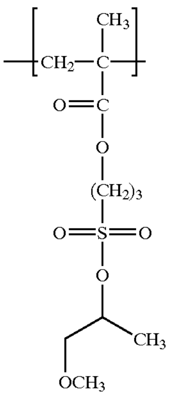

Positive Polar Conversion Polymer Compound (6)

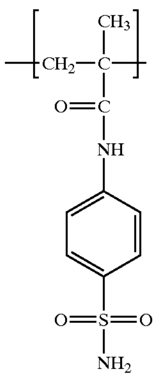

Alkali Aqueous Solution-Soluble Polymer Compound (1)

-continued

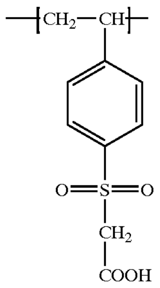

Negative Polar Conversion Polymer Compound (1)

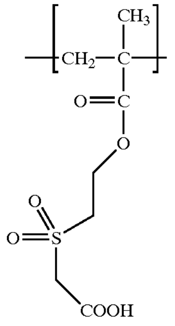

Negative Polar Conversion Polymer Compound (2)

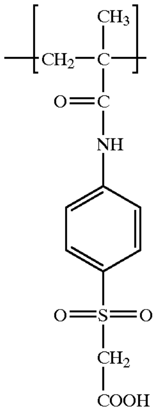

Negative Polar Conversion Polymer Compound (3)

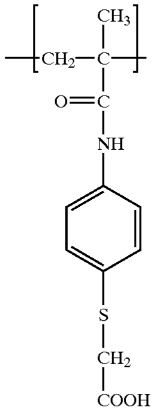

Negative Polar Conversion Polymer Compound (4)

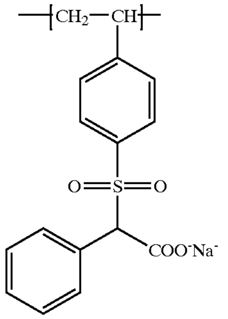

Negative Polar Conversion Polymer Compound (5)

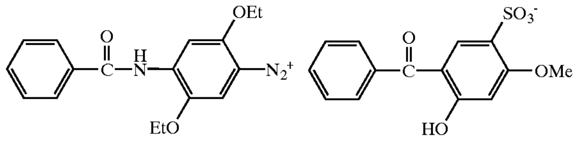

Acid-Generating Agent (1)

-continued

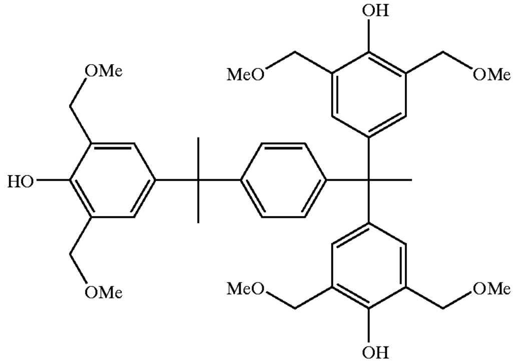

Cross-Linking Agent (1)

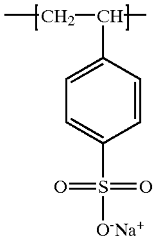

Water-Soluble Polymer (1)

Examples 1 to 9 and Comparative Examples 1 and 2

Lithographic Printing Original Plates (1) to (9), (22) and (26) obtained were exposed by a semiconductor laser capable of emitting an infrared ray at the wavelength of 840 nm or a YAG laser capable of emitting an infrared ray at the wavelength of 1,064 nm, at a main scanning rate of 2.0 m/s. After the exposure, the plates each was dipped in distilled water for 1 minute and the line width in the non-image area was observed by an optical microscope. The laser irradiation energy corresponding to the line width was determined and used as the sensitivity.

Separately, Lithographic Printing Original Plates (1) to (9), (22) and (26) were exposed in the same manner as above by a semiconductor laser capable of emitting an infrared ray at the wavelength of 840 nm or a YAG laser capable of emitting an infrared ray at the wavelength of 1,064 nm, at a main scanning rate of 2.0 m/s or 4.0 m/s and thereafter, subjected to ordinary printing in Hidel KOR-D printing machine without passing through any treatment. The evaluation was made on whether staining was generated in the non-image area of 3,000th sheet of printed matter and how many sheets of good printed matter could be obtained. The results are shown in Table 1 below.

TABLE 1

| | Lithographic Printing Original Plate | Laser for Exposure | Line Width Sensitivity (mJ/cm$^2$) | Staining in Non-Image Area 2.0 m/s | 4.0 m/s | Number of Sheets of Good Printed Matter 2.0 m/s | 4.0 m/s |
|---|---|---|---|---|---|---|---|
| Example | | | | | | | |
| 1 | (1) | semiconductor | 170 | none | none | 50000 | 50000 |
| 2 | (2) | semiconductor | 170 | none | none | 65000 | 65000 |
| 3 | (3) | semiconductor | 180 | none | none | 60000 | 60000 |
| 4 | (4) | YAG | 170 | none | none | 45000 | 45000 |
| 5 | (5) | semiconductor | 190 | none | none | 55000 | 55000 |
| 6 | (6) | semiconductor | 190 | none | none | 63000 | 63000 |
| 7 | (7) | semiconductor | 180 | none | none | 49000 | 49000 |
| 8 | (8) | semiconductor | 170 | none | none | 57000 | 57000 |
| 9 | (9) | semiconductor | 150 | none | none | 55000 | 55000 |
| Comparative Example | | | | | | | |
| 1 | (22) | semiconductor | 230 | none | stained | 45000 | 500 |
| 2 | (26) | semiconductor | 160 | none | none | 20000 | 20000 |

In any case of Lithographic Printing Original Plates (1) to (9) using a polymer complex layer, the sensitivity was high and no staining was generated in the non-image area of 3,000th sheet of printed matter whichever the scanning rate at the exposure was 2.0 m/s or 4.0 m/s.

Lithographic Printing Original Plate (22) of Comparative Example 1 was a lithographic printing original plate having only a recording layer on the aluminum support. In the case of this lithographic printing original plate, the sensitivity was slightly low and when exposed at a scanning rate of 2.0 m/s, no staining was generated in the non-image area of 3,000th sheet of printed matter and 45,000 sheets of good printed matters were obtained, however, when exposed at a scanning rate of 4.0 m/s, staining was generated in the non-image area of 500th sheet of printed matter. This resulted because in Lithographic Printing Original Plate (22), the water solubilization of recording layer proceeded from the surface of recording layer and when the scanning rate is high (4.0 m/s), the recording layer could not be entirely water solubilized and film remaining of the recording layer was caused.

Lithographic Printing Original Plate (26) of Comparative Example 2 was a lithographic printing original plate having on the aluminum support a layer containing an infrared absorbent and a water-soluble polymer and a recording layer. In the case of this lithographic printing original plate, the line width sensitivity and the staining in the non-image area of 3,000th sheet of printed matter were almost on the same level as the lithographic printing original plates of Examples 1 to 9. This resulted because the layer containing an infrared absorbent and a water-soluble polymer exerted effects of water solubilizing the recording layer from the lower part and thereby preventing heat diffusion to the aluminum support, which are a part of the effects of the polymer complex layer, and thereby the recording layer could be removed even if the recording layer was not entirely water solubilized. However, the layer containing an infrared absorbent and a water-soluble polymer was gradually dissolved by fountain solution during the printing, therefore, the image area came off and only 20,000 sheets of good printed matters could be obtained.

Examples 10 to 13 and Comparative Example 3

Lithographic Printing Original Plates (10) to (13) and (23) obtained were exposed by a semiconductor laser capable of emitting an infrared ray at the wavelength of 840 nm or a YAG laser capable of emitting an infrared ray at the wavelength of 1,064 nm. After the exposure, the plates each was developed using an automatic developing machine ("PS Processor 900VR" manufactured by Fuji Photo Film Co., Ltd.) having charged therein Developer DP-4 and Rinsing Solution FR-3 (1:7) produced by Fuji Photo Film Co., Ltd. At this time, 2 levels of developer DP-4 were used, one was diluted at 1:6 and another was diluted at 1:12. The line width in the non-image areas obtained with respective developers was measured and the laser irradiation energy corresponding to the line width was determined and used as the sensitivity. The difference in the sensitivity between the 1:6 diluted developer as a standard and a 1:12 diluted developer was recorded. The smaller the difference is, the better the development latitude is. Latitude of 20 mJ/cm$^2$ or less is on the practicable level. The results obtained are shown in Table 2 below.

TABLE 2

| | Lithographic Printing Original Plate | Sensitivity (mJ/cm$^2$) | Development latitude | Laser for Exposure |
|---|---|---|---|---|
| Example | | | | |
| 10 | (10) | 120 | 10 mJ/cm$^2$ | Semiconductor |
| 11 | (11) | 110 | 5 mJ/cm$^2$ | Semiconductor |
| 12 | (12) | 105 | 5 mJ/cm$^2$ | YAG |
| 13 | (13) | 110 | 5 mJ/cm$^2$ | Semiconductor |
| Comparative Example 3 | (23) | 140 | 30 mJ/cm$^2$ | Semiconductor |

In any case of Lithographic Printing Original Plates (10) to (13) using a polymer complex layer, the sensitivity was high and the development latitude was on the practical level.

On the other hand, in the case of Lithographic Printing Original Plate (23) of Comparative Example 3 which was a lithographic printing original plate having only a recording layer on the aluminum support, the sensitivity was slightly low and the development latitude did not reach the practical level.

Examples 14 to 18 and Comparative Example 4

Lithographic Printing Original Plates (14) to (18) and (24) obtained were exposed by a semiconductor laser capable of emitting an infrared ray at the wavelength of 840 nm or a YAG laser capable of emitting an infrared ray at the wavelength of 1,064 nm, at a main scanning rate of 2.0 m/s. After the exposure, the plates each was dipped in an aqueous solution (water: 84.7%, isopropanol: 10%, triethylamine: 5%, concentrated hydrochloric acid: 0.3%) having a pH of 8.8 and then, the line width in the image area was observed by an optical microscope. The laser irradiation energy corresponding to the line width was determined and used as the sensitivity.

Separately, Lithographic Printing Original Plates (14) to (18) and (24) were exposed in the same manner as above by a semiconductor laser capable of emitting an infrared ray at the wavelength of 840 nm or a YAG laser capable of emitting an infrared ray at the wavelength of 1,064 nm, at a main scanning rate of 2.0 m/s or 4.0 m/s and thereafter, subjected to ordinary printing in Hidel KOR-D printing machine without passing through any treatment. The conditions of fountain solution for this printing are shown below.

Fountain Solution:

pH: 8.8 (water: 84.7%, isopropanol: 10%, triethylamine: 5%, concentrated hydrochloric acid: 0.3%)

The evaluation was made on whether the image area of 10,000th sheet of printed matter was sufficiently inked and how many sheets of good printed matter could be obtained. The results are shown in Table 3 below.

TABLE 3

| | Lithographic Printing Original Plate | Laser for Exposure | Line Width Sensitivity ($mJ/cm^2$) | Inking Peroperty in Image Area 2.0 m/s | Inking Peroperty in Image Area 4.0 m/s | Number of Sheets of Good Printed Matter 2.0 m/s | Number of Sheets of Good Printed Matter 4.0 m/s |
|---|---|---|---|---|---|---|---|
| Example | | | | | | | |
| 14 | (14) | Semiconductor | 300 | good | good | 32000 | 32000 |
| 15 | (15) | Semiconductor | 280 | good | good | 40000 | 40000 |
| 16 | (16) | Semiconductor | 270 | good | good | 45000 | 45000 |
| 17 | (17) | YAG | 290 | good | good | 35000 | 35000 |
| 18 | (18) | Semiconductor | 310 | good | good | 32000 | 32000 |
| Comparative Example 4 | (24) | Semiconductor | 350 | good | bad | 30000 | 0 |

In any case of Lithographic Printing Original Plates (14) to (18) using a polymer complex layer, the sensitivity was high and the inking property of image are was good.

On the other hand, in the case of Lithographic Printing Original Plate (24) of Comparative Example 4, when exposed at a high scanning rate (4.0 m/s), the sensitivity was slightly low and the inking property in the image area was bad. Furthermore, even one sheet of good printed matter could not be obtained.

Examples 19 to 21 and Comparative Example 5

Lithographic Printing Original Plates (19) to (21) and (25) obtained were exposed by a semiconductor laser capable of emitting an infrared ray at the wavelength of 840 nm. After the exposure, the plates each was heated in an oven at 140° C. for 1 minute and then developed using an automatic developing machine ("PS Processor 900VR" manufactured by Fuji Photo Film Co., Ltd.) having charged therein Developer DP-4 and Rinsing Solution FR-3 (1:7) produced by Fuji Photo Film Co., Ltd. At this time, 2 levels of developer DP-4 were used, one was diluted at 1:6 and another was diluted at 1:12. The line width in the non-image areas obtained with respective developers was measured and the laser irradiation energy corresponding to the line width was determined and used as the sensitivity. The difference in the sensitivity between the 1:6 diluted developer as a standard and a 1:12 diluted developer was recorded. The smaller the difference is, the better the development latitude is. Latitude of 20 $mJ/cm^2$ or less is on the practicable level. The results obtained are shown in Table 4 below.

TABLE 4

| | Lithographic Printing Original Plate | Sensitivity ($mJ/cm^2$) | Development latitude |
|---|---|---|---|
| Example | | | |
| 19 | (19) | 210 | 10 $mJ/cm^2$ |
| 20 | (20) | 220 | 10 $mJ/cm^2$ |
| 21 | (21) | 200 | 5 $mJ/cm^2$ |
| Comparative Example 5 | (25) | 260 | 30 $mJ/cm^2$ |

In any case of Lithographic Printing Original Plates (19) to (21) using a polymer complex layer, the sensitivity was high and the development latitude was on the practical level.

On the other hand, in the case of Lithographic Printing Original Plate (25) of Comparative Example 3 which was a lithographic printing original plate having only a recording layer on the aluminum support, the sensitivity was slightly low and the development latitude did not reach the practical level.

The lithographic printing original plate of the present invention has a polymer complex layer on the support, therefore, the diffusion of heat to the support is prevented at the time of heat-mode image recording, as a result, high sensitivity can be attained and a printed matter free of residual color or staining can be obtained. In particular, the lithographic printing original plate can attain plate-making directly from digital data by applying image recording thereto using a solid laser or semiconductor laser which emits an infrared ray.

Furthermore, by using a polar conversion polymer compound (irrespective of positive or negative) in the recording layer, a lithographic printing original plate capable of water development or dispensable with a particular treatment after the writing of an image, such as wet development or rubbing, and having very simple practicability can be provided.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor comprising a support having sequentially formed thereon a layer containing an ionic polymer complex (Layer A) which is a polymer electrolyte complex or an ion bonded polymer metal complex and which is insoluble in water and an aqueous alkali solution, and a recording layer thermally variable in the solubility in at least one of water and an aqueous solution (Layer B), the support having a hydrophilic surface and at least one of Layer A and Layer B containing a light-heat converting agent.

2. The lithographic printing plate precursor as claimed in claim 1, wherein the layer containing the ionic polymer complex (Layer A) is coated in an amount of from 0.1 to 1.0 $g/m^2$.

3. The lithographic printing plate precursor as claimed in claim 1, wherein the layer containing the ionic polymer complex (Layer A) has an absorbancy at the wavelength of a laser for drawing an image of 0.3 or more.

4. The lithographic printing plate precursor as claimed in claim 1, wherein the recording layer (Layer B) contains a polymer compound having a hydrophobic functional group thermally variable in hydrophilicity.

5. The lithographic printing plate precursor as claimed in claim 1, wherein the ionic polymer complex is a polymer electrolyte complex.

6. The lithographic printing plate precursor as claimed in claim 1, wherein the ionic polymer complex is a pair of a polymer compound containing a functional group (A) having a cationic electric charge and a polymer compound containing a functional group (B) having an anionic electric charge, at a side chain, or a polymer compound containing both a functional group (A) having a cationic electric charge and a functional group (B) having an anionic electric charge, at a side chain.

7. The lithographic printing plate precursor as claimed in claim 6, wherein the functional group (A) is at least one functional group selected from the group consisting of an ammonium group, a sulfonium group, a phosphonium group, an iodonium group and an amino group, and the functional group (B) is at least one functional group selected from the group consisting of a carboxylic acid (salt) group, a sulfonic acid (salt) group and a phosphoric acid (salt) group.

* * * * *